(12) United States Patent
Kim et al.

(10) Patent No.: US 12,041,845 B2
(45) Date of Patent: Jul. 16, 2024

(54) ORGANIC ELECTROLUMINESCENT COMPOUND AND ORGANIC ELECTROLUMINESCENT DEVICE COMPRISING THE SAME

(71) Applicant: ROHM AND HAAS ELECTRONIC MATERIALS KOREA LTD., Chungcheongnam-do (KR)

(72) Inventors: Hyun Kim, Gyeonggi-do (KR);
Jeong-Hwan Jeon, Gyeonggi-do (KR);
Seon-Jin Hwang, Gyeonggi-do (KR);
Ga-Won Lee, Gyeonggi-do (KR);
Hong-Se Oh, Gyeonggi-do (KR)

(73) Assignee: Rohm and Haas Electronic Materials Korea Ltd. (KR)

( * ) Notice: Subject to any disclaimer, the term of this patent is extended or adjusted under 35 U.S.C. 154(b) by 823 days.

(21) Appl. No.: 17/268,342

(22) PCT Filed: Aug. 9, 2019

(86) PCT No.: PCT/KR2019/010037
§ 371 (c)(1),
(2) Date: Feb. 12, 2021

(87) PCT Pub. No.: WO2020/036375
PCT Pub. Date: Feb. 20, 2020

(65) Prior Publication Data
US 2021/0343949 A1 Nov. 4, 2021

(30) Foreign Application Priority Data
Aug. 16, 2018 (KR) .................. 10-2018-0095303

(51) Int. Cl.
*H10K 85/30* (2023.01)
*C07F 15/00* (2006.01)
*C09K 11/06* (2006.01)
*H10K 50/11* (2023.01)
*H10K 101/10* (2023.01)

(52) U.S. Cl.
CPC ....... *H10K 85/342* (2023.02); *C07F 15/0033* (2013.01); *C09K 11/06* (2013.01); *C09K 2211/1029* (2013.01); *C09K 2211/185* (2013.01); *H10K 50/11* (2023.02); *H10K 2101/10* (2023.02)

(58) Field of Classification Search
CPC .. H10K 85/342; H10K 50/11; H10K 2101/10; H10K 85/346; H10K 85/6572; C07F 15/0033; C09K 11/06; C09K 2211/1029; C09K 2211/185; C09K 2211/182
See application file for complete search history.

(56) References Cited

U.S. PATENT DOCUMENTS

| | | |
|---|---|---|
| 2003/0235712 A1 | 12/2003 | Manabu et al. |
| 2013/0299795 A1 | 11/2013 | Xia et al. |
| 2015/0357588 A1 | 12/2015 | Kwong et al. |

FOREIGN PATENT DOCUMENTS

| | | | |
|---|---|---|---|
| JP | 2005170851 A | | 6/2005 |
| JP | 2007254539 A | | 10/2007 |
| JP | 2019099511 A | * | 6/2019 |
| KR | 20110077350 A | | 7/2011 |
| KR | 20160082871 A | | 7/2016 |

* cited by examiner

*Primary Examiner* — Dawn L Garrett
(74) *Attorney, Agent, or Firm* — G. Creston Campbell

(57) ABSTRACT

The present disclosure relates to an organic electroluminescent compound comprising a ligand represented by formula 1, and an organic electroluminescent device comprising the same. The organic electroluminescent device having a luminescent efficiency higher than a conventional organic electroluminescent device can be provided by comprising the organic electroluminescent compound of the present disclosure.

10 Claims, No Drawings

ORGANIC ELECTROLUMINESCENT COMPOUND AND ORGANIC ELECTROLUMINESCENT DEVICE COMPRISING THE SAME

TECHNICAL FIELD

The present disclosure relates to an organic electroluminescent compound and an organic electroluminescent device comprising the same.

BACKGROUND ART

An electroluminescent device (EL device) is a self-light-emitting display device which has advantages in that it provides a wider viewing angle, a greater contrast ratio, and a faster response time. The first organic EL device was developed by Eastman Kodak in 1987, by using small aromatic diamine molecules and aluminum complexes as materials for forming a light-emitting layer (see Appl. Phys. Lett. 51, 913, 1987).

An organic electroluminescent device (OLED) changes electric energy into light by applying electricity to an organic electroluminescent material, and commonly comprises an anode, a cathode, and an organic layer formed between the two electrodes. The organic layer of the OLED may comprise a hole injection layer, a hole transport layer, a hole auxiliary layer, a light-emitting auxiliary layer, an electron blocking layer, a light-emitting layer, an electron buffer layer, a hole blocking layer, an electron transport layer, an electron injection layer, etc., if necessary. The materials used in the organic layer can be classified into a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc., depending on their functions. In the OLED, holes from the anode and electrons from the cathode are injected into a light-emitting layer by the application of electric voltage, and excitons having high energy are produced by the recombination of the holes and electrons. The organic light-emitting compound moves into an excited state by the energy and emits light from an energy when the organic light-emitting compound returns to the ground state from the excited state.

The most important factor determining luminescent efficiency in an OLED is light-emitting materials. The light-emitting materials are required to have the following features: high quantum efficiency, high mobility of an electron and a hole, and uniformity and stability of the formed light-emitting material layer. The light-emitting material is classified into blue, green, and red light-emitting materials according to the light-emitting color, and further includes yellow or orange light-emitting materials. Furthermore, the light-emitting material is classified into a host material and a dopant material in a functional aspect. Generally, a device having excellent EL characteristics has a structure comprising a light-emitting layer made by doping a dopant to a host.

Iridium(III) complexes have been widely known as a dopant of phosphorescent light-emitting materials, including bis(2-(2'-benzothienyl)-pyridinato-N,C-3')iridium(acetylacetonate) [(acac)Ir(btp)$_2$], tris(2-phenylpyridine)iridium [Ir(ppy)$_3$] and bis(4,6-difluorophenylpyridinato-N,C2)picolinato Iridium (Firpic) as red, green, and blue light-emitting materials, respectively.

Meanwhile, US Patent Application Publication No. 20151357588 discloses the following compound as a phosphorescent light-emitting material.

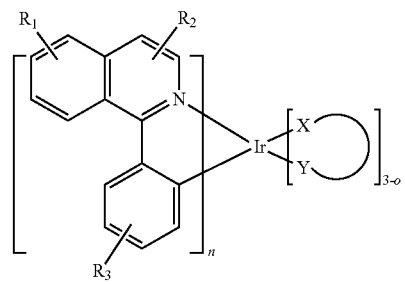

Korean Patent Application Laid-Open No. 2011-0077350 discloses the following compound as a red phosphorescent light-emitting material.

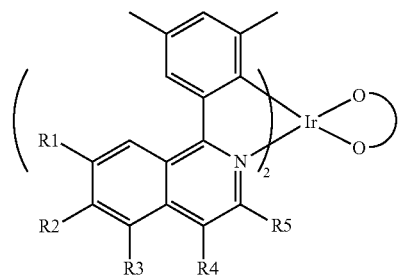

However, development of a phosphorescent light-emitting material for improving performances of an OLED is still required.

DISCLOSURE OF INVENTION

Technical Problem

The objective of the present disclosure is firstly, to provide an organic electroluminescent compound capable of producing an organic electroluminescent device having a high luminescent efficiency, and secondly, to provide an organic electroluminescent device comprising the organic electroluminescent compound.

Solution to Problem

The present inventors have found that the above objective can be achieved by the organic electroluminescent compound comprising ligand L$_1$ represented by the following formula 1, wherein the ligand L$_1$ is coordinated to a metal having an atomic number greater than 40:

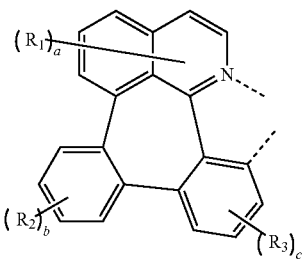

(1)

wherein $R_1$ to $R_3$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or adjacent $R_1$'s, adjacent $R_2$'s, and adjacent $R_3$'s, each independently, may be linked to each other to form a ring(s), and a represents an integer of 1 to 5, b represents an integer of 1 to 4, and c represents an integer of 1 to 3, in which, if a to c, each independently, are an integer of 2 or more, each of $R_1$, each of $R_2$, and each of $R_3$ may be the same or different.

Advantageous Effects of Invention

The organic electroluminescent compound according to the present disclosure can provide an organic electroluminescent device having a high luminescent efficiency.

MODE FOR THE INVENTION

Hereinafter, the present disclosure will be described in detail. However, the following description is intended to explain the disclosure, and is not meant in any way to restrict the scope of the disclosure.

The term "an organic electroluminescent compound" in the present disclosure means a compound that may be used in an organic electroluminescent device. If necessary, the organic electroluminescent compound may be comprised in any layers constituting an organic electroluminescent device.

The term "an organic electroluminescent material" in the present disclosure means a material that may be used in an organic electroluminescent device, and may comprise at least one compound. If necessary, the organic electroluminescent material may be comprised in any layers constituting an organic electroluminescent device. For example, the organic electroluminescent material may be a hole injection material, a hole transport material, a hole auxiliary material, a light-emitting auxiliary material, an electron blocking material, a light-emitting material (including a host material and a dopant material), an electron buffer material, a hole blocking material, an electron transport material, an electron injection material, etc.

Herein, the term "(C1-C30)alkyl" is meant to be a linear or branched alkyl having 1 to 30 carbon atoms constituting the chain, in which the number of carbon atoms is preferably 1 to 20, and more preferably 1 to 10. The above alkyl may include methyl, ethyl, n-propyl, isopropyl, n-butyl, isobutyl, sec-butyl, tert-butyl, n-pentyl, tert-pentyl, neopentyl, iso-pentyl, sec-pentyl, 3-pentyl, etc. The term "(C3-C30)cycloalkyl" is meant to be a mono- or polycyclic hydrocarbon having 3 to 30 ring backbone carbon atoms, in which the number of carbon atoms is preferably 3 to 20, and more preferably 3 to 7. The above cycloalkyl may include cyclopropyl, cyclobutyl, cyclopentyl, cyclohexyl, etc. The term "(3- to 7-membered)heterocycloalkyl" is meant to be a cycloalkyl having 3 to 7, preferably 5 to 7, ring backbone atoms, and including at least one heteroatom selected from the group consisting of B, N, O, S, Si, and P, and preferably the group consisting of O, S, and N. The above heterocycloalkyl may include tetrahydrofuran, pyrrolidine, thiolan, tetrahydropyran, etc. The term "(C6-C30)aryl(ene)" is meant to be a monocyclic or fused ring radical derived from an aromatic hydrocarbon having 6 to 30 ring backbone carbon atoms, in which the number of the ring backbone carbon atoms is preferably 6 to 25, more preferably 6 to 18. The above aryl(ene) may be partially saturated, and may comprise a Spiro structure. The above aryl may include phenyl, biphenyl, terphenyl, naphthyl, binaphthyl, phenylnaphthyl, naphthylphenyl, fluorenyl, phenylfluorenyl, benzofluorenyl, dibenzofluorenyl, phenanthrenyl, phenylphenanthrenyl, anthracenyl, indenyl, triphenylenyl, pyrenyl, tetracenyl, perylenyl, chrysenyl, naphthacenyl, fluoranthenyl, spirobifluorenyl, etc. The term "(3- to 30-membered)heteroaryl(ene)" is an aryl having 3 to 30 ring backbone atoms, and including at least one, preferably 1 to 4 heteroatoms selected from the group consisting of B, N, O, S, Si, and P. The above heteroaryl(ene) may be a monocyclic ring, or a fused ring condensed with at least one benzene ring; may be partially saturated; may be one formed by linking at least one heteroaryl or aryl group to a heteroaryl group via a single bond(s); and may comprise a Spiro structure. The above heteroaryl may include a monocyclic ring-type heteroaryl such as furyl, thiophenyl, pyrrolyl, imidazolyl, pyrazolyl, thiazolyl, thiadiazolyl, isothiazolyl, isoxazolyl, oxazolyl, oxadiazolyl, triazinyl, tetrazinyl, triazolyl, tetrazolyl, furazanyl, pyridyl, pyrazinyl, pyrimidinyl, and pyridazinyl, and a fused ring-type heteroaryl such as benzofuranyl, benzothiophenyl, isobenzofuranyl, dibenzofuranyl, dibenzothiophenyl, benzimidazolyl, benzothiazolyl, benzoisothiazolyl, benzoisoxazolyl, benzoxazolyl, isoindolyl, indolyl, benzoindolyl, indazolyl, benzothiadiazolyl, quinolyl, isoquinolyl, cinnolinyl, quinazolinyl, quinoxalinyl, naphthyridinyl, carbazolyl, benzocarbazolyl, dibenzocarbazolyl, phenoxazinyl, phenothiazinyl, phenanthridinyl, benzodioxolyl, and dihydroacridinyl. Furthermore, "halogen" includes F, Cl, Br, and I.

Herein, "substituted" in the expression "substituted or unsubstituted" means that a hydrogen atom in a certain functional group is replaced with another atom or another functional group, i.e., a substituent. The substituents of the substituted alkyl, the substituted cycloalkyl, the substituted aryl, the substituted arylene, the substituted heteroaryl, the substituted heteroarylene, the substituted alkenyl, the substituted alkynyl, the substituted alkoxy, the substituted trialkylsilyl, the substituted triarylsilyl, the substituted dialkylarylsilyl, the substituted alkyldiarylsilyl, the substituted mono- or di-alkylamino, the substituted alkylarylamino, and the substituted mono- or di-arylamino in the formulas of the present disclosure, each independently, may be at least one selected from the group consisting of deuterium; a halogen; a cyano; carboxyl; a nitro; a hydroxyl; a (C1-C30)alkyl; a halo(C1-C30)alkyl; a (C2-C30)alkenyl, a (C02-C30)alkynyl, a (C1-C30)alkoxy; a (C1-C30)alkylthio; a (C3-C30)cycloalkyl; a (C3-C30)cycloalkenyl; a (3- to 7-membered) heterocycloalkyl; a (C6-C30)aryloxy; a (C6-C30)arylthio; a (3- to 30-membered)heteroaryl unsubstituted or substituted with at least one of a (C6-C30)aryl(s), a (C1-C30)alkyl(C6-

C30)aryl(s), and a tri(C6-C30)arylsilyl(s); a (C6-C30)aryl unsubstituted or substituted with at least one of a (C1-C30) alkyl(s), a halogen, a cyano, a tri(C6-C30)arylsilyl(s), and a (3- to 30-membered)heteroaryl(s); a tri(C1-C30)alkylsilyl; a tri(C6-C30)arylsilyl; a di(C1-C30)alkyl(C6-C30)arylsilyl; a (C1-C30)alkyldi(C6-C30)arylsilyl; an amino; a mono- or di-(C1-C30)alkylamino; a mono- or di-(C6-C30)arylamino; a (C1-C30)alkyl(C6-C30)arylamino; a (C1-C30)alkylcarbonyl; a (C1-C30)alkoxycarbonyl; a (C6-C30)arylcarbonyl, a di(C6-C30)arylboronyl; a di(C1-C30)alkylboronyl; a (C1-C30)alkyl(C6-C30)arylboronyl; a (C6-C30)aryl(C1-C30)alkyl; and a (C1-C30)alkyl(C6-C30)aryl. According to one embodiment of the present disclosure, the substituent may be at least one selected from the group consisting of deuterium; a (C1-C20)alkyl; a (5- to 25-membered)heteroaryl unsubstituted or substituted with a (C6-C25)aryl(s); a (C6-C25)aryl unsubstituted or substituted with at least one of a (C1-C20)alkyl(s), a (5- to 18-membered)heteroaryl(s), and a tri(C6-C25)arylsilyl(s); a tri(C6-C25)arylsilyl; and a (C1-C20)alkyl(C6-C25)aryl; According to another embodiment of the present disclosure, the substituent may be at least one selected from the group consisting of deuterium; an unsubstituted (C1-C10)alkyl; a (5- to 18-membered)heteroaryl unsubstituted or substituted with a (C6-C12)aryl(s); a (C6-C18)aryl unsubstituted or substituted with at least one of a (C1-C10)alkyl(s), a (5- to 18-membered)heteroaryl(s), and a tri(C6-C18)arylsilyl(s); a tri(C6-C18)arylsilyl; and a (C1-C10)alkyl(C6-C18)aryl. For example, the substituent may be at least one selected from the group consisting of deuterium; methyl; a phenyl unsubstituted or substituted with at least one of a diphenyltriazinyl(s) and a triphenylsilyl(s); a naphthyl; a biphenyl; a fluorenyl substituted with a methyl(s); a naphthylphenyl; a triphenylenyl; a terphenyl; a pyrimidinyl substituted with a phenyl(s); a triazinyl substituted with a phenyl(s); a carbazolyl unsubstituted or substituted with a phenyl(s); a dibenzothiophenyl; and a triphenylsilyl.

In the present disclosure, a ring formed by linking adjacent substituents means that two or more adjacent substituents are linked to or fused with each other to form a substituted or unsubstituted, mono- or polycyclic, (3- to 30-membered) alicyclic or aromatic ring, or the combination thereof, preferably a substituted or unsubstituted, mono- or polycyclic, (5- to 25-membered) alicyclic or aromatic ring, or the combination thereof. In addition, the formed ring may contain at least one heteroatom selected from B, N, O, S, Si, and P, preferably at least one heteroatom selected from N, O, and S.

In the present disclosure, the heteroaryl, each independently, may contain at least one heteroatom selected from B, N, O, S, Si, and P. In addition, the heteroatom may be bonded to at least one selected from the group consisting of hydrogen, deuterium, a halogen, a cyano, a substituted or unsubstituted (C1-C30)alkyl, a substituted or unsubstituted (C6-C30)aryl, a substituted or unsubstituted (3- to 30-membered)heteroaryl, a substituted or unsubstituted (C3-C30) cycloalkyl, a substituted or unsubstituted (C1-C30)alkoxy, a substituted or unsubstituted tri(C1-C30)alkylsilyl, a substituted or unsubstituted di(C1-C30)alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30) arylamino, and a substituted or unsubstituted (C1-C30)alkyl (C6-C30)arylamino.

The organic electroluminescent compound of the present disclosure comprises ligand $L_1$ represented by formula 1, and the ligand $L_1$ is coordinated to a metal having an atomic number greater than 40.

The metal having an atomic number greater than 40 may be, according to one embodiment of the present disclosure, iridium (Ir), osmium (Os), copper (Cu), or platinum (Pt), and according to another embodiment of the present disclosure, Ir or Pt. For example, the metal having an atomic number greater than 40 may be Ir.

In formula 1, $R_1$ to $R_3$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or adjacent $R_1$'s, adjacent $R_2$'s, and adjacent $R_3$'s, each independently, may be linked to each other to form a ring(s). According to one embodiment of the present disclosure, $R_1$ to $R_3$, each independently, may represent hydrogen, deuterium, a substituted or unsubstituted (C1-C20)alkyl, or a substituted or unsubstituted (C6-C25)aryl. According to another embodiment of the present disclosure, $R_1$ to $R_3$, each independently, may represent hydrogen, deuterium, a (C1-C10)alkyl unsubstituted or substituted with deuterium(s), or an unsubstituted (C6-C25)aryl. Specifically, $R_1$ to $R_3$, each independently, may be selected from the group consisting of hydrogen, deuterium, methyl, n-propyl, isopropyl, n-butyl, isobutyl, sec-butyl, tert-butyl, n-pentyl, tert-pentyl, neopentyl, isopentyl, sec-pentyl, 3-pentyl, and phenyl. For example, $R_1$ to $R_3$, each independently, may be hydrogen, deuterium, methyl, isopropyl, isobutyl, tert-butyl, neopentyl, or phenyl.

In formula 1, a represents an integer of 1 to 5, b represents an integer of 1 to 4, and c represents an integer of 1 to 3, in which, if a to c, each independently, are an integer of 2 or more, each of $R_1$, each of $R_2$, and each of $R_3$ may be the same or different. According to one embodiment of the present disclosure, a to c may be an integer of 1.

According to one embodiment of the present disclosure, the organic electroluminescent compound of the present disclosure may comprise the compound represented by the following formula 2.

$$M(L_1)x(L_2)y(L_3)z \qquad (2)$$

In formula 2, M represents a metal having an atomic number greater than 40. According to one embodiment of the present disclosure, M may represent iridium (Ir), osmium (Os), copper (Cu), or platinum (Pt). According to another embodiment of the present disclosure, M may represent Ir or Pt. For example, M may represent Ir.

In formula 2, x represents 1, 2, or 3, y represents 0, 1, or 2, z represents 0, 1, or 2, and the sum of x, y, and z is the oxidation number of the M. According to one embodiment of the present disclosure, x represents 2, y represents 1, and z represents 0.

In formula 2, $L_1$ represents the ligand represented by formula 1, $L_2$ represents the ligand represented by the following formula 3, and $L_3$ represents the ligand represented by the following formula 4.

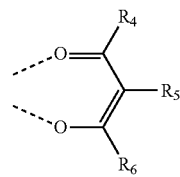

(3)

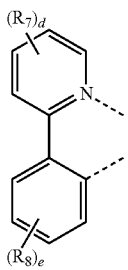

(4)

In formulas 3 and 4, $R_4$ to $R_8$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl, or may be linked to an adjacent substituent to form a ring(s). For example, $R_4$ and $R_5$, $R_5$ and $R_6$, adjacent $R_7$'s, and adjacent $R_8$'s, each independently, may be linked to each other to form a ring(s). According to one embodiment of the present disclosure, $R_4$ to $R_8$, each independently, may represent hydrogen, deuterium, a substituted or unsubstituted (C1-C20)alkyl, or a substituted or unsubstituted (C6-C30)aryl. According to another embodiment of the present disclosure, $R_4$ to $R_8$, each independently, may represent hydrogen, deuterium, a (C1-C10)alkyl unsubstituted or substituted with deuterium(s), or an unsubstituted (C6-C25) aryl. Specifically, $R_4$ to $R_8$, each independently, may be selected from the group consisting of hydrogen, deuterium, methyl, n-propyl, isopropyl, n-butyl, isobutyl, sec-butyl, tert-butyl, n-pentyl, tert-pentyl, neopentyl, isopentyl, sec-pentyl, 3-pentyl, and phenyl. For example, $R_4$ to $R_8$, each independently, may represent hydrogen, deuterium, methyl, isopropyl, sec-butyl, isobutyl, tert-butyl, sec-pentyl, 3-pentyl, neopentyl, or phenyl. $R_4$ and $R_6$ may be the same or different. According to one embodiment of the present disclosure, $R_4$ and $R_6$ may be the same.

In formula 4, d and e, each independently, represent an integer of 1 to 4, in which, if d and e, each independently, are an integer of 2 or more, each of $R_7$ and each of $R_8$ may be the same or different.

The formula 3 may be represented by any one selected from the group consisting of the following, but is not limited thereto.

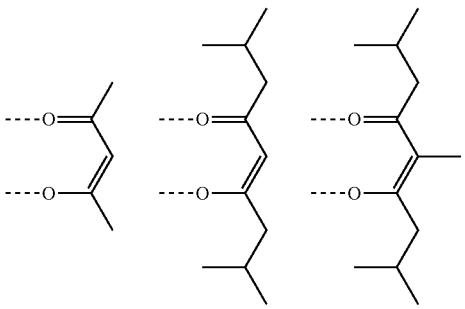

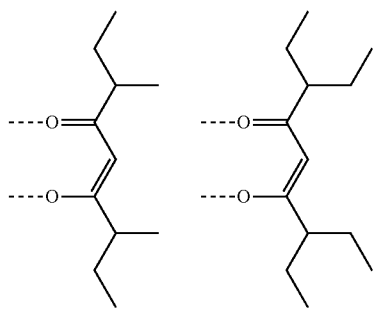

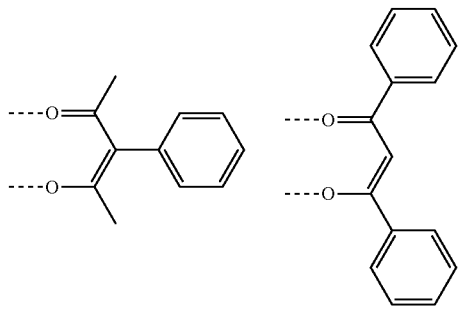

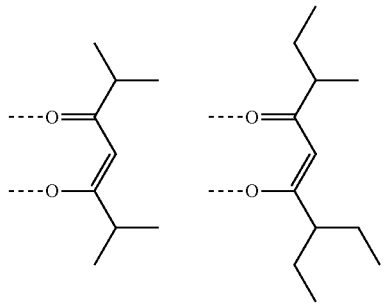

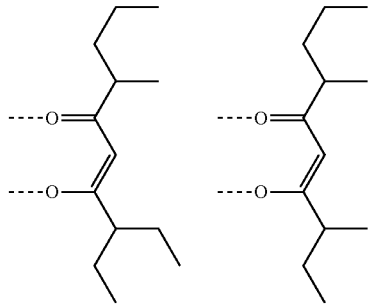

The formula 4 may be represented by any one selected from the group consisting of the following, but is not limited thereto.

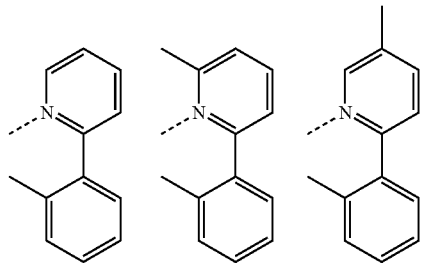

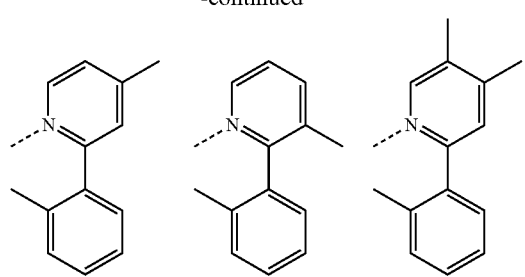
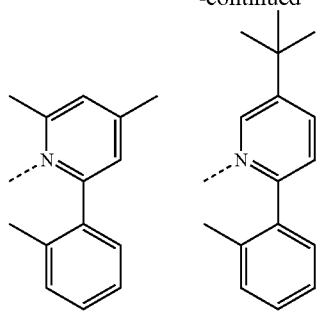
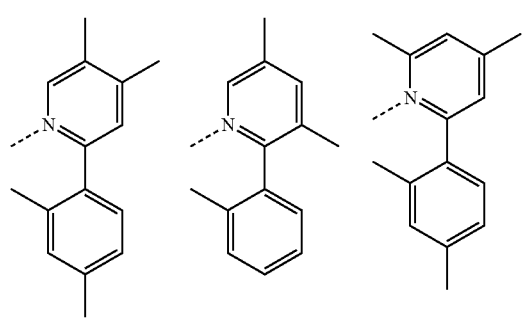
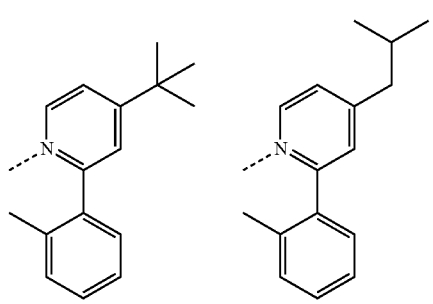
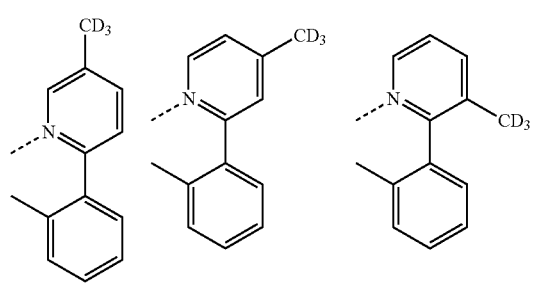
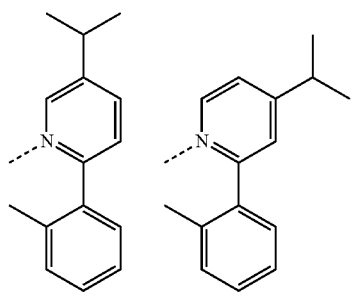
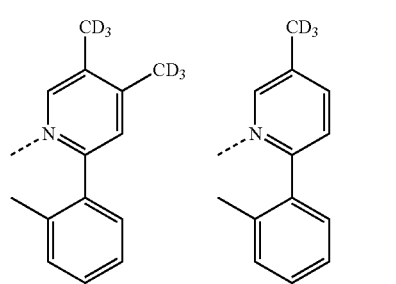
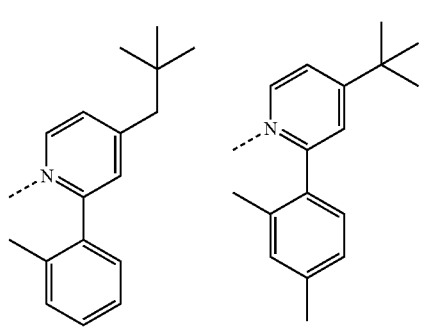
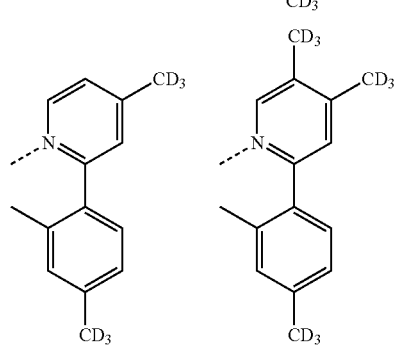

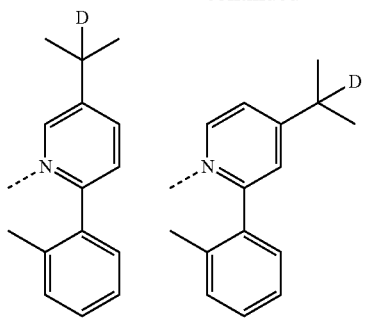

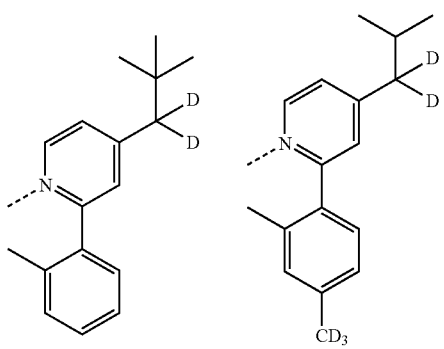

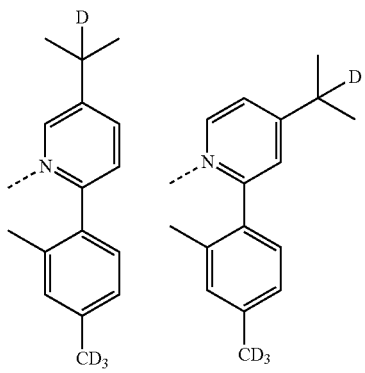

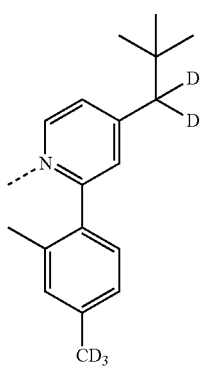

According to one embodiment of the present disclosure, the organic electroluminescent compound of the present disclosure may comprise the compound represented by the following formula 5.

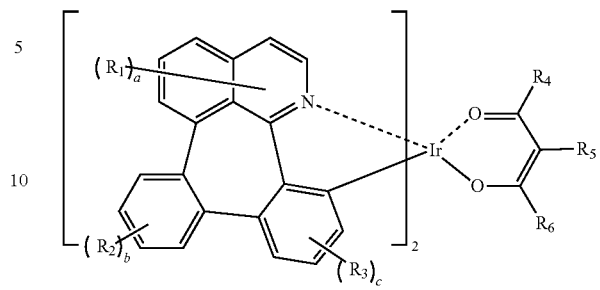

(5)

In formula 5, $R_4$ to $R_6$ are as defined in formula 3 above, and $R_1$ to $R_3$ and a to c are as defined in formula 1 above. According to one embodiment of the present disclosure, $R_1$ to $R_6$, each independently, may represent hydrogen, deuterium, a (C1-C10)alkyl unsubstituted or substituted with deuterium(s), or a substituted or unsubstituted (C6-C30)aryl. According to another embodiment of the present disclosure, $R_1$ to $R_6$, each independently, may be any one selected from the group consisting of hydrogen, deuterium, methyl, ethyl, n-propyl, isopropyl, n-butyl, isobutyl, sec-butyl, tert-butyl, n-pentyl, tert-pentyl, neopentyl, isopentyl, sec-pentyl, 3-pentyl, and phenyl.

The organic electroluminescent compound of the present disclosure includes the following compounds, but is not limited thereto.

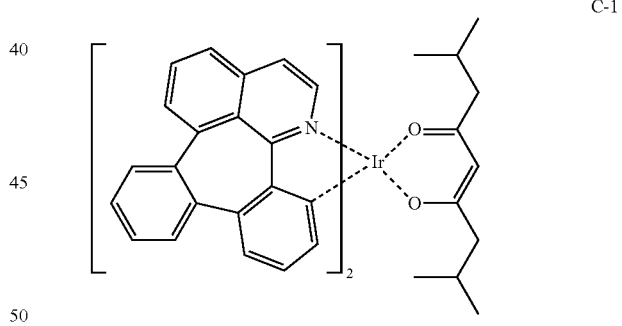

C-1

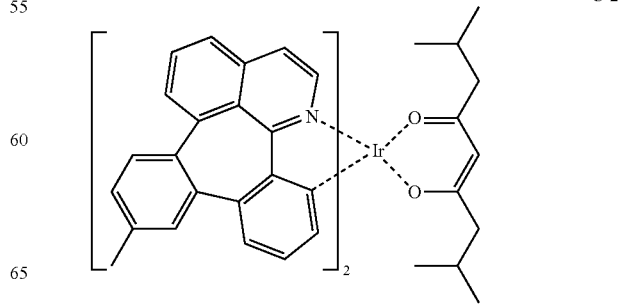

C-2

C-3
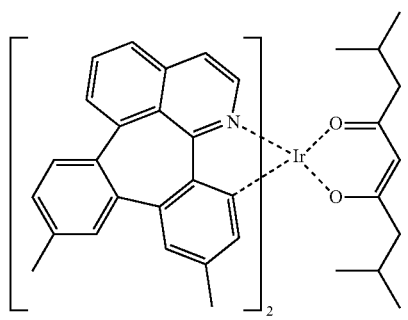
C-4
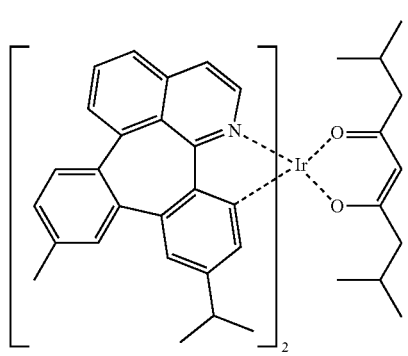
C-5
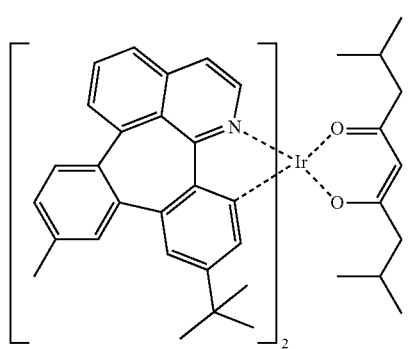
C-6
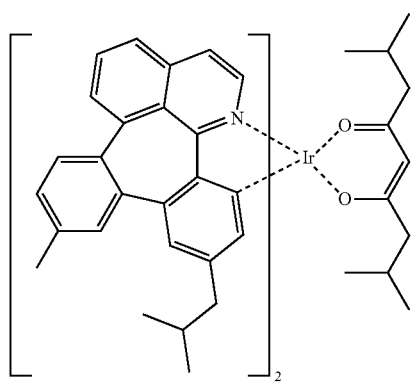
C-7
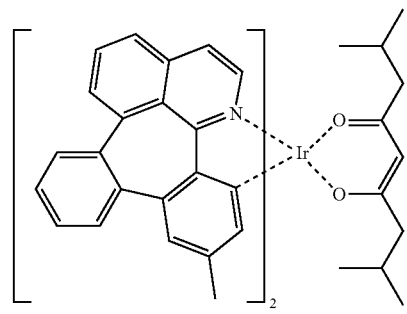
C-8
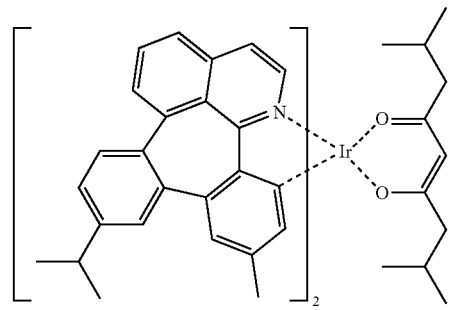
C-9
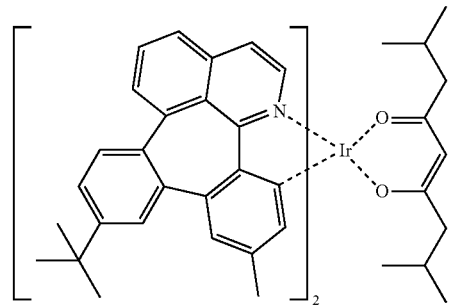
C-10
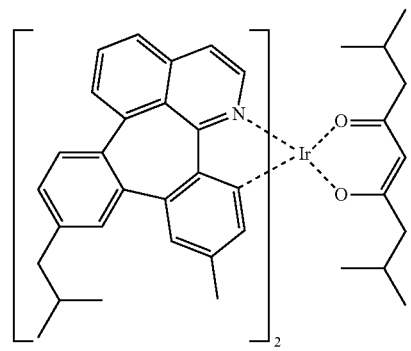
C-11
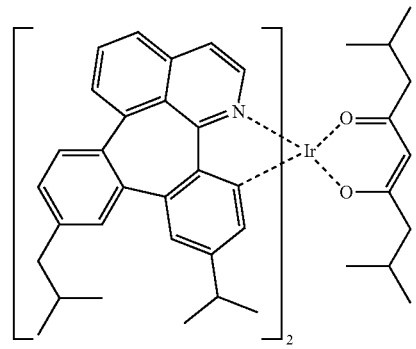

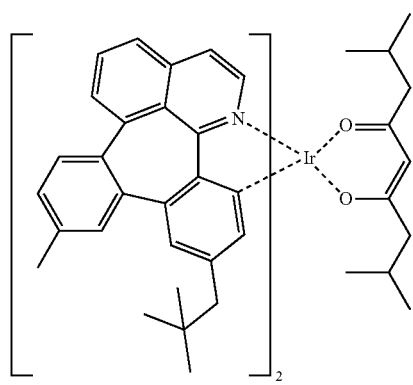
C-12
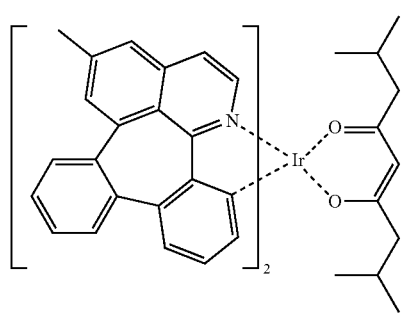
C-13
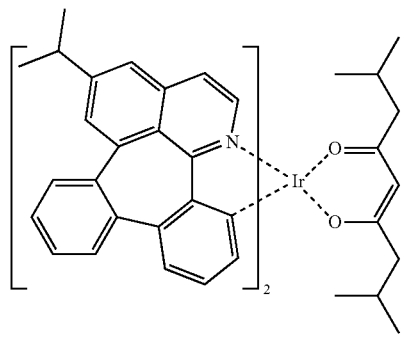
C-14
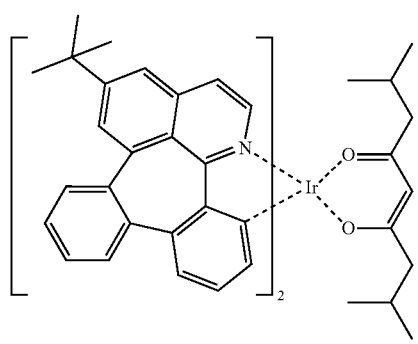
C-15
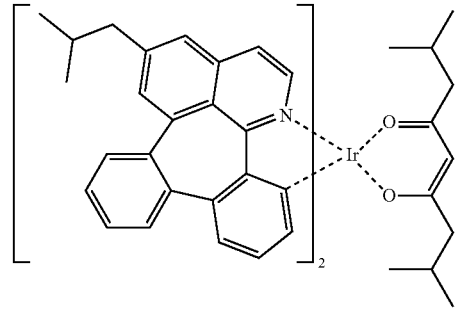
C-16
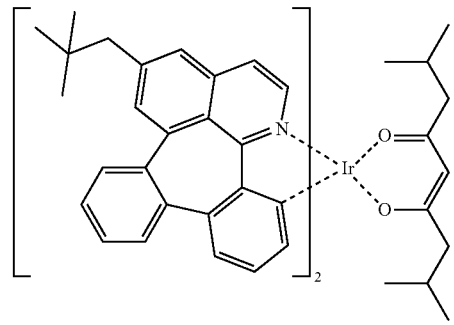
C-17
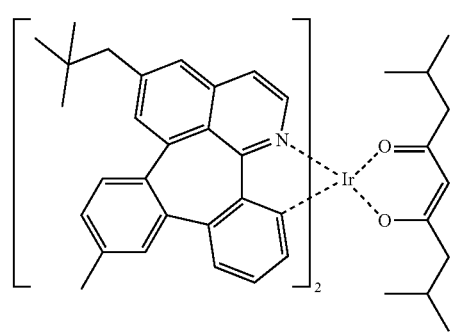
C-18
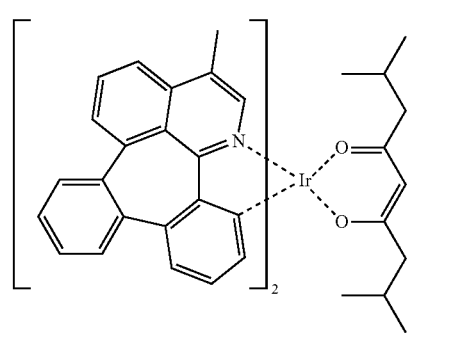
C-19
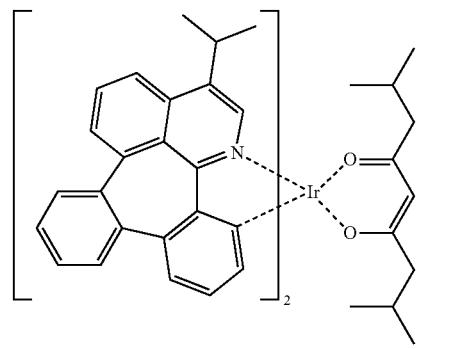
C-20

C-21
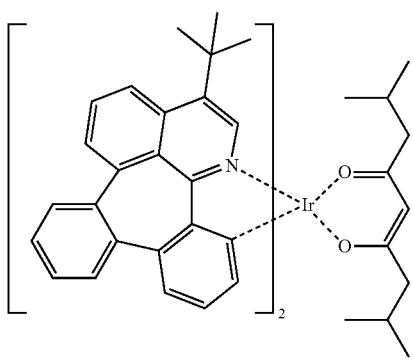
C-22
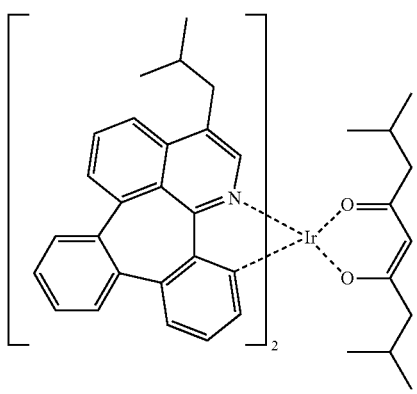
C-23
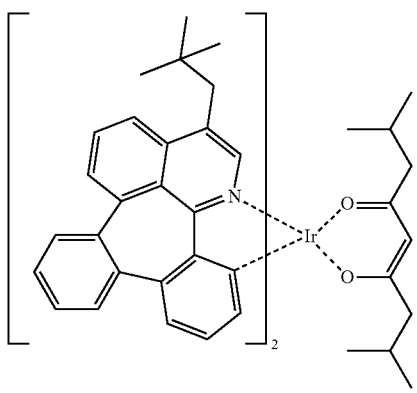
C-24
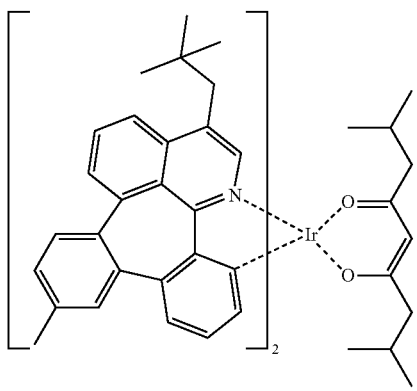
C-25
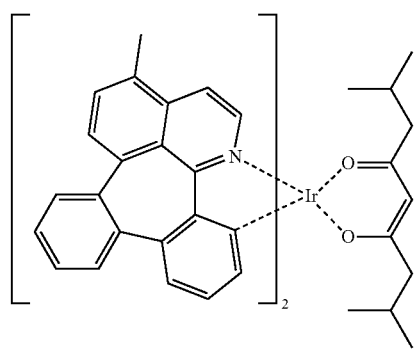
C-26
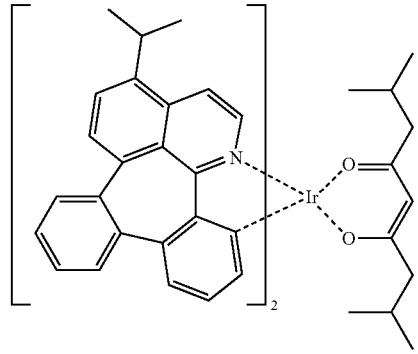
C-27
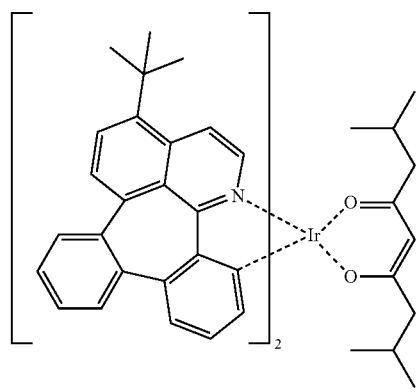
C-28
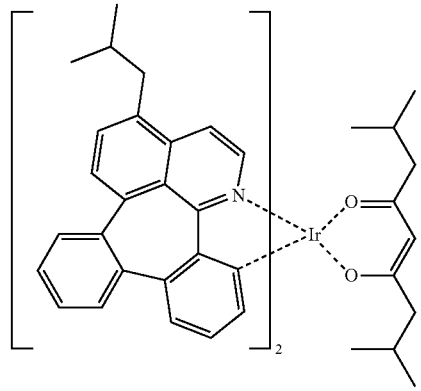

C-29
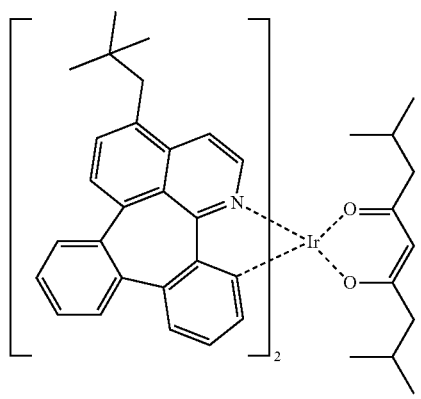
C-30
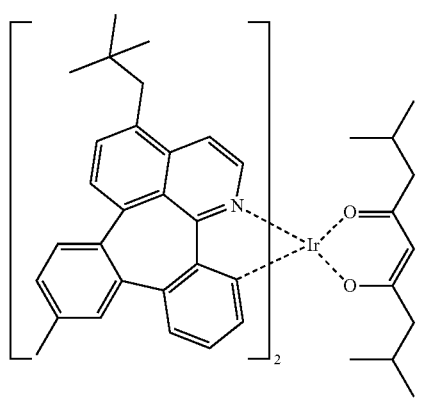
C-31
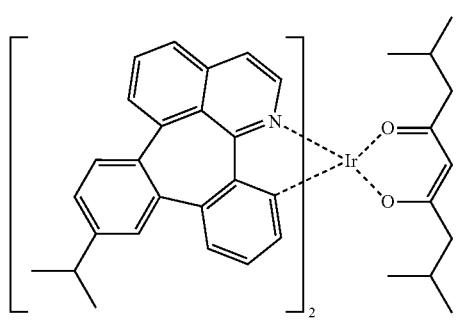
C-32
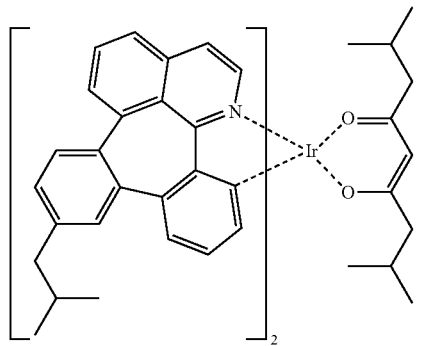
C-33
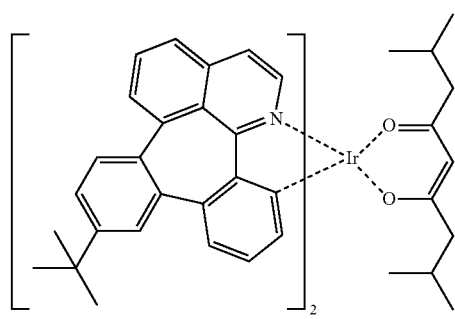
C-34
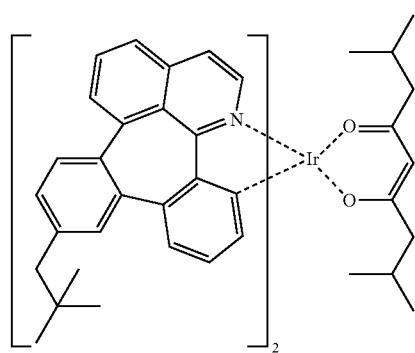
C-35
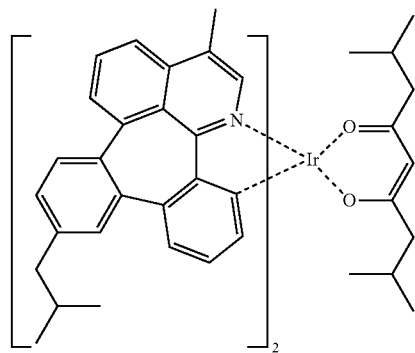
C-36
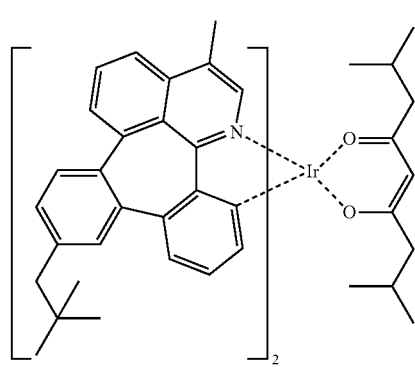

C-37
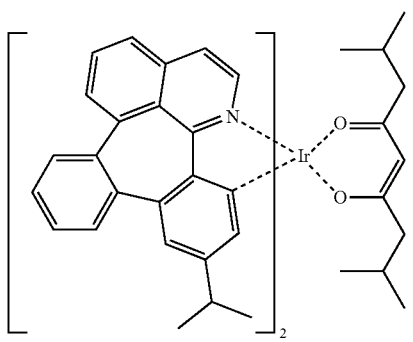
C-38
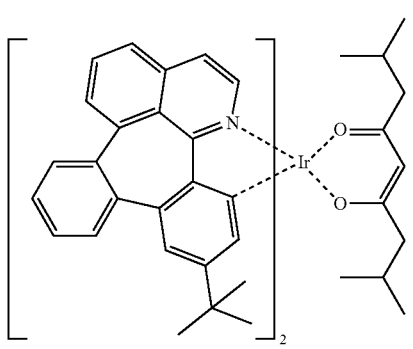
C-39
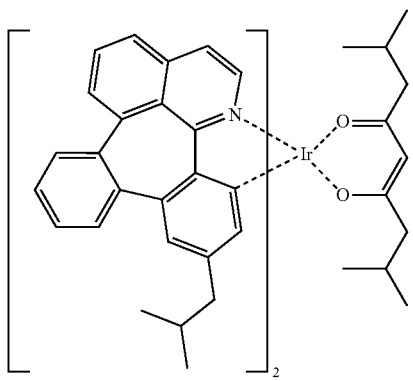
C-40
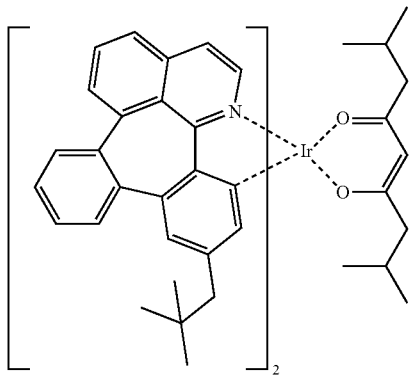
C-41
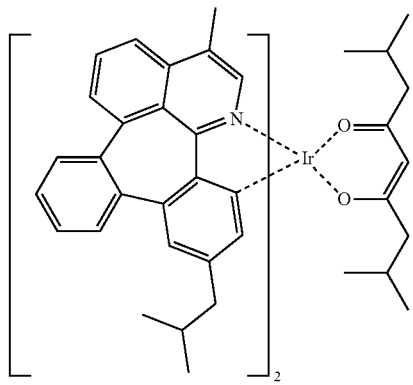
C-42
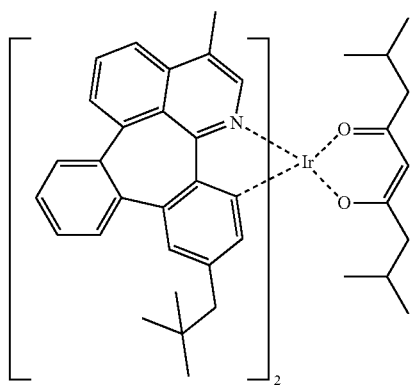
C-43
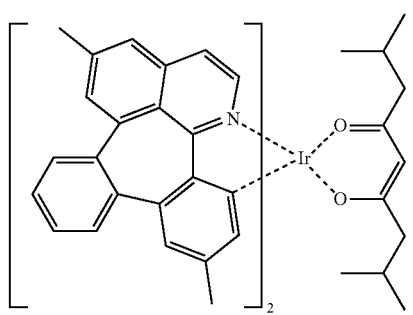
C-44
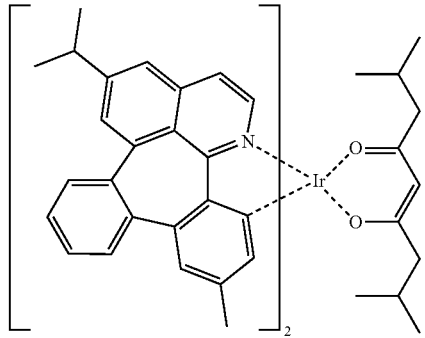

C-45
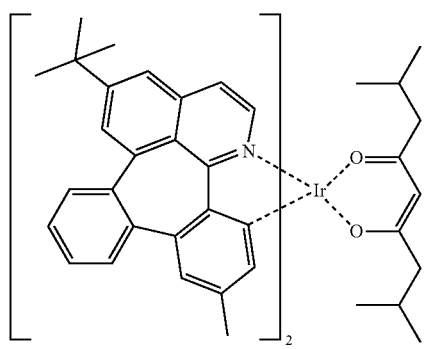
C-46
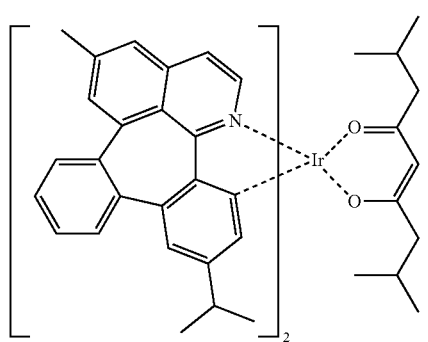
C-47
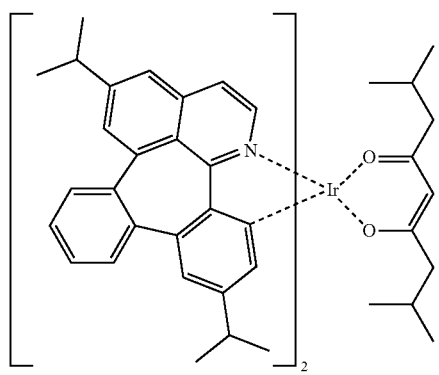
C-48
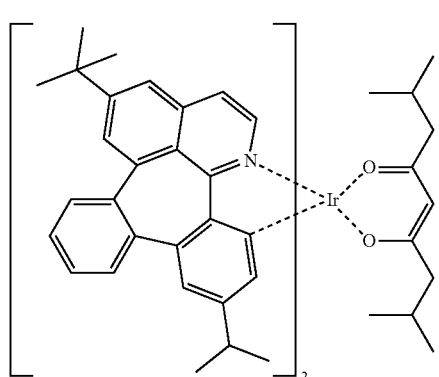
C-49
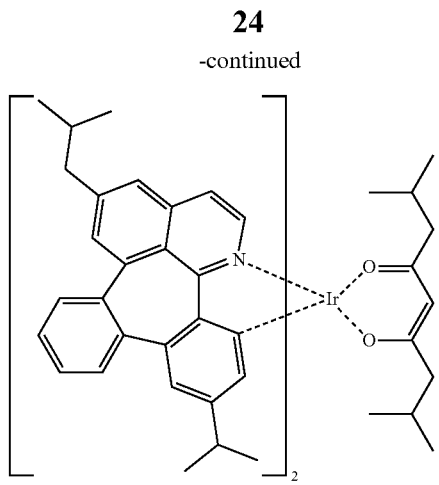
C-50
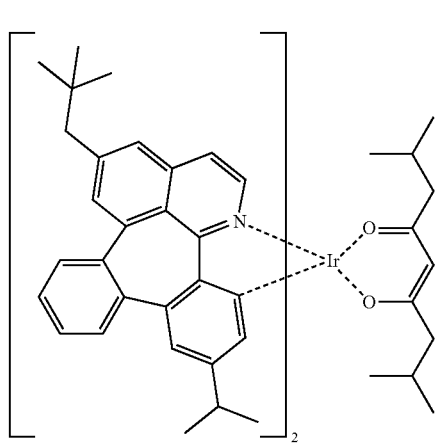
C-51
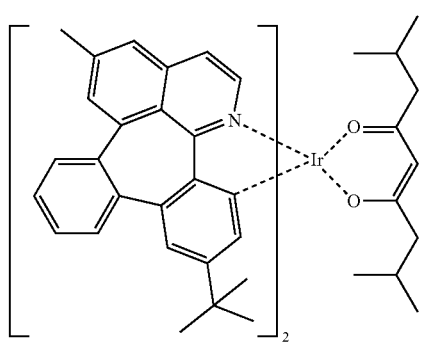
C-52
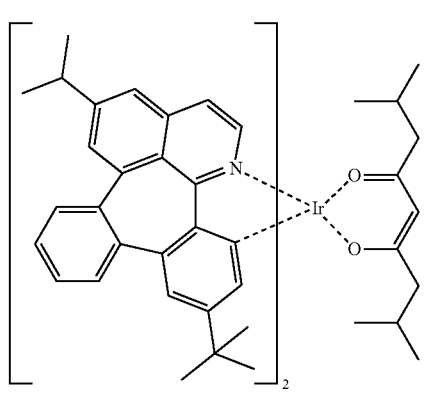

C-53
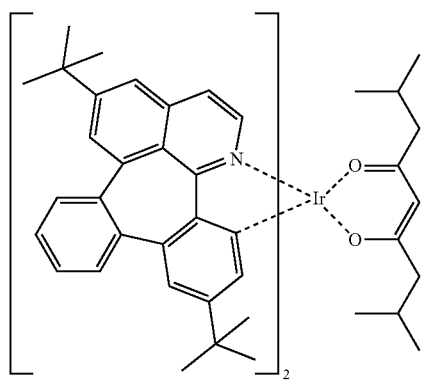
C-54
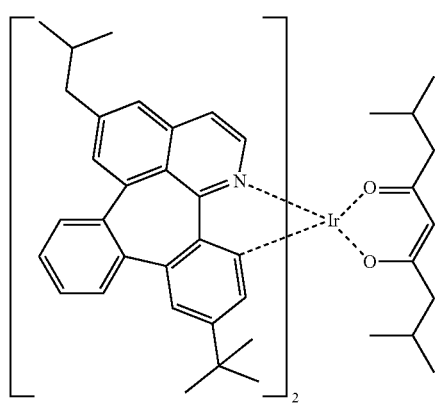
C-55
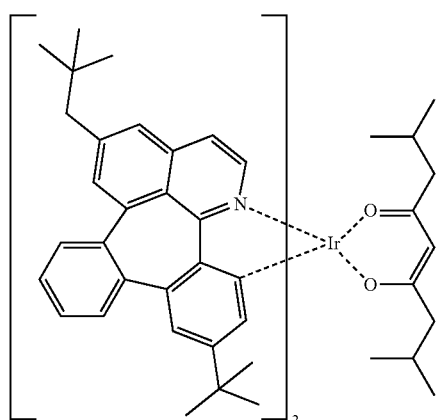
C-56
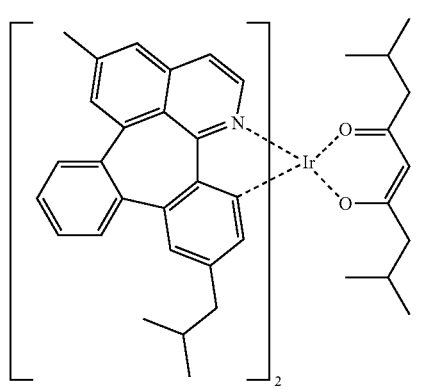
C-57
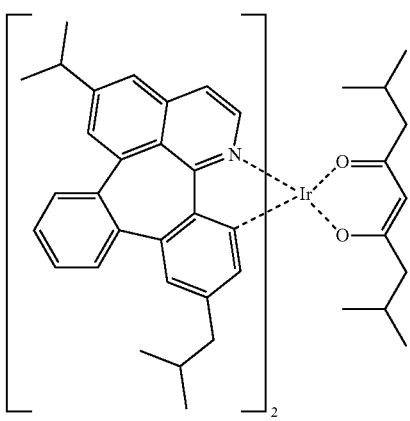
C-58
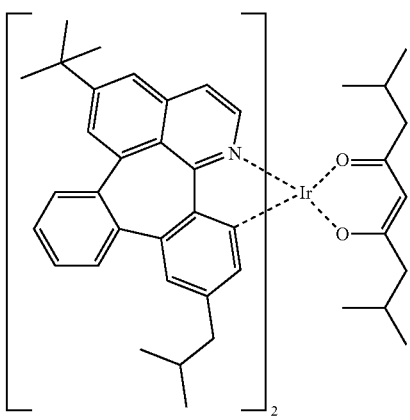
C-59
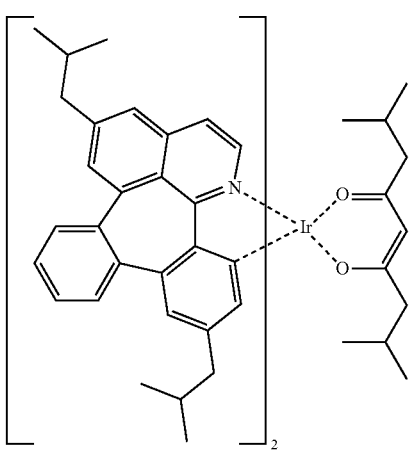

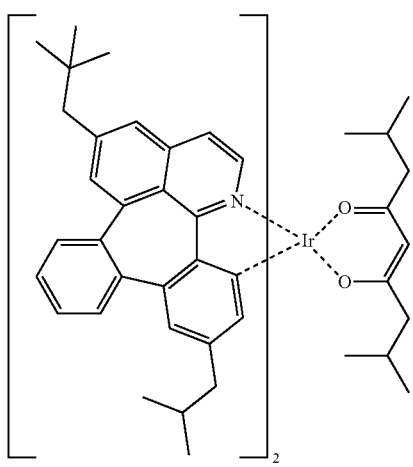
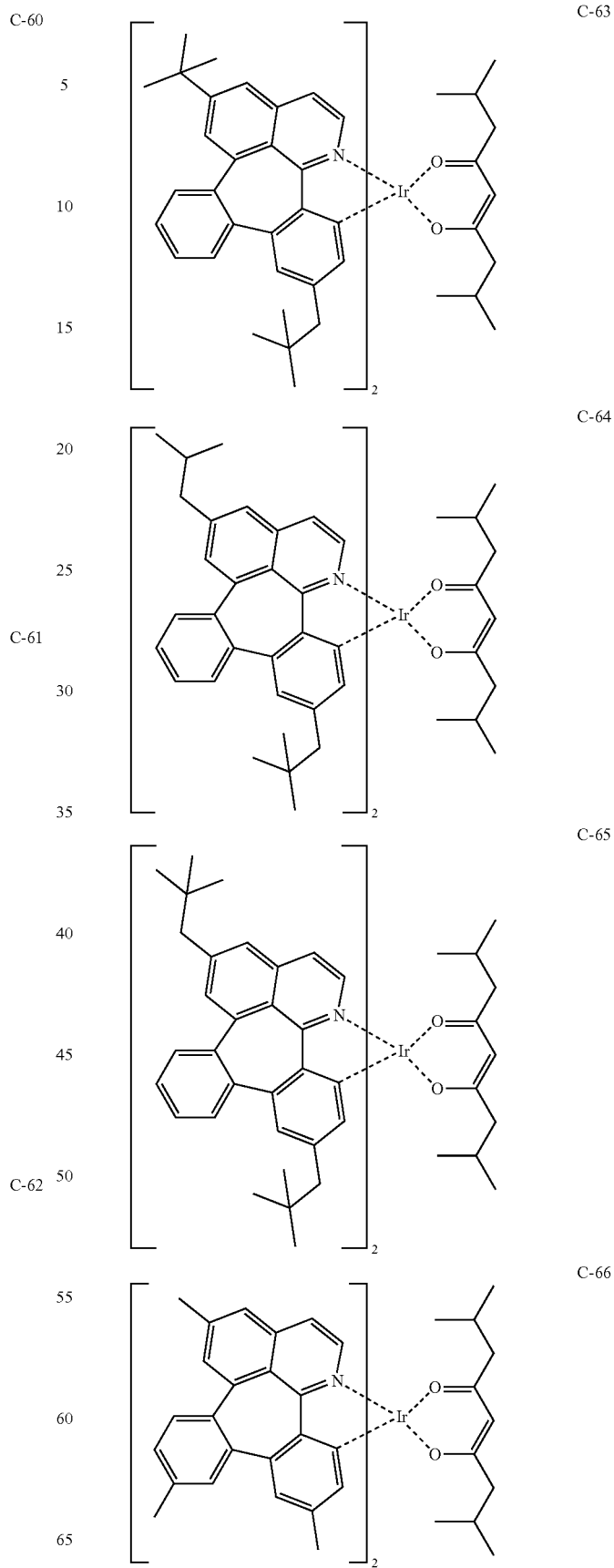

C-67 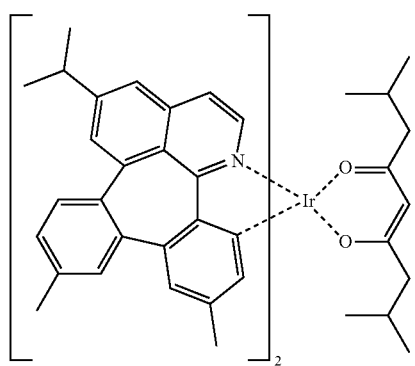
C-68 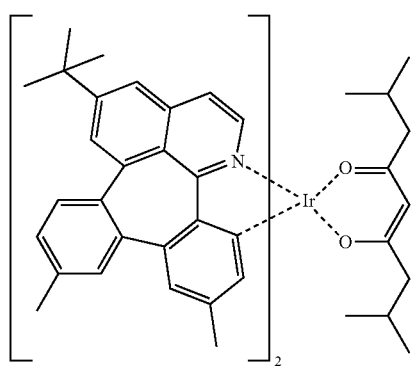
C-69 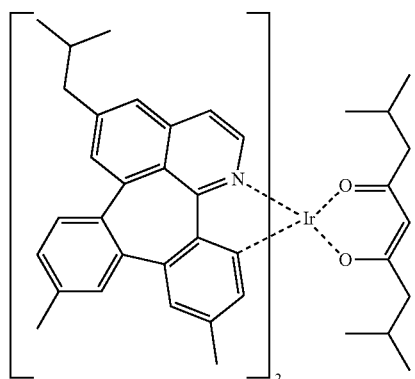
C-70 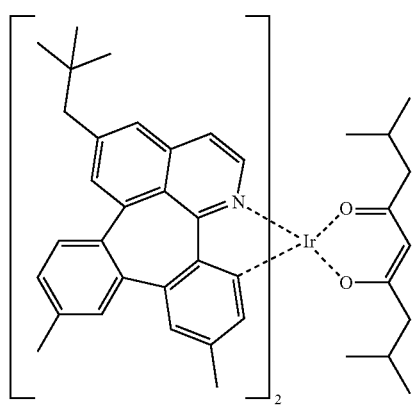
C-71 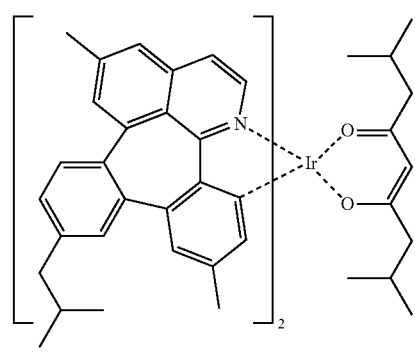
C-72 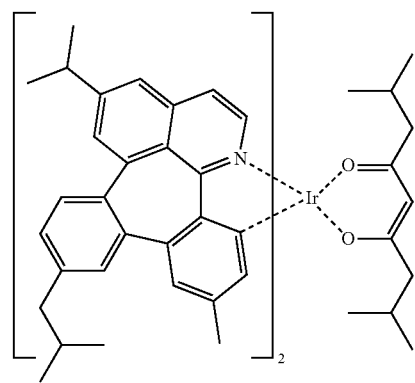
C-73 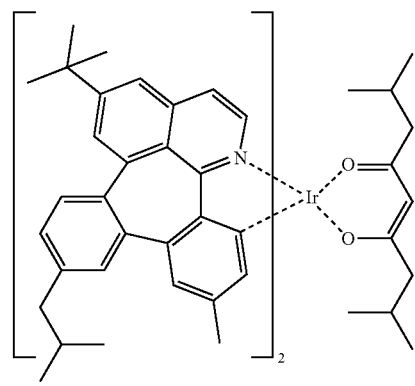
C-74 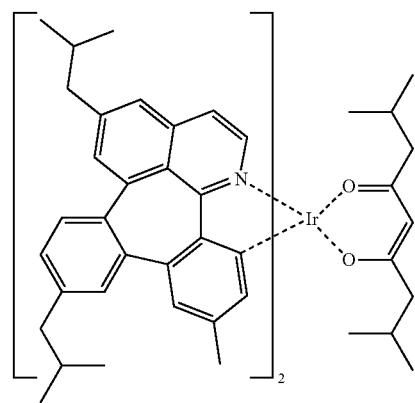

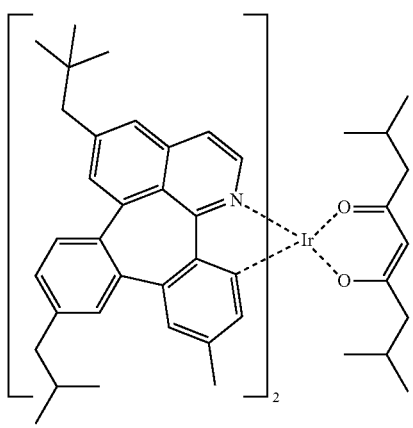
C-75
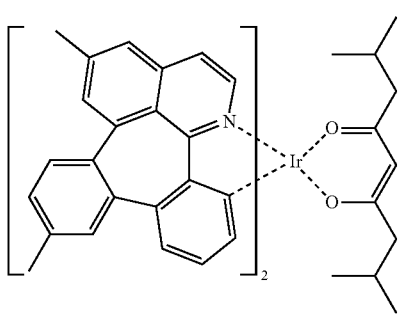
C-76
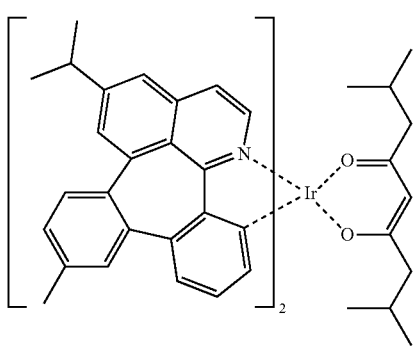
C-77
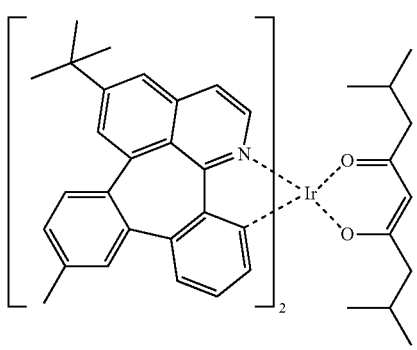
C-78
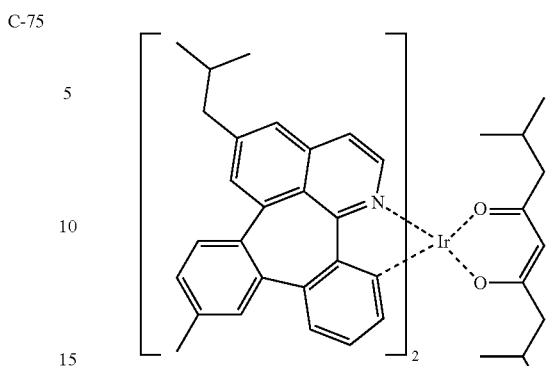
C-79
C-80
C-81
C-82

C-83
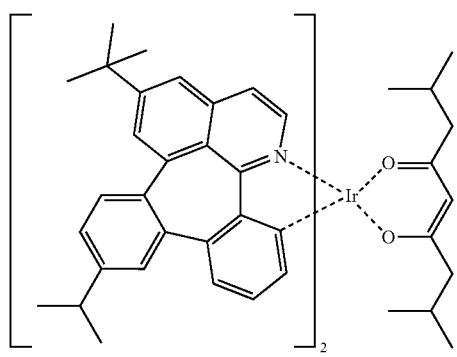
C-84
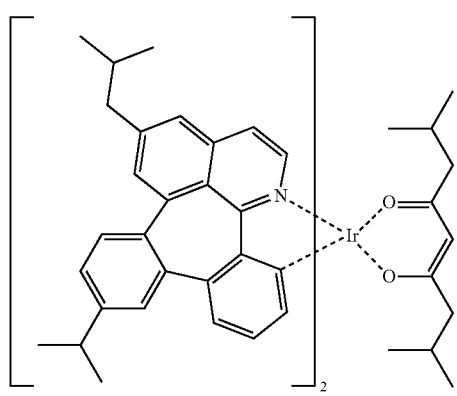
C-85
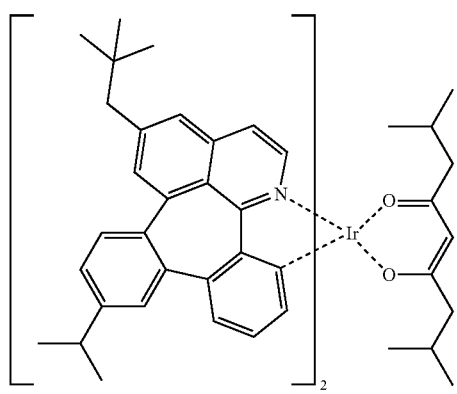
C-86
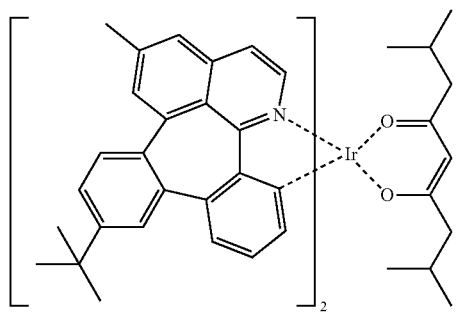
C-87
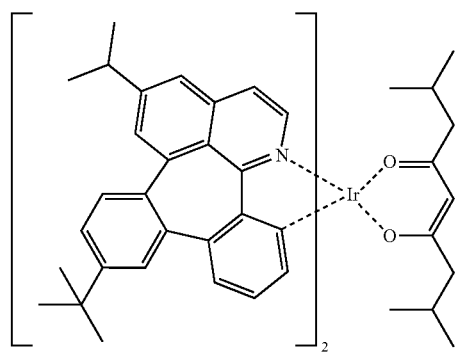
C-88
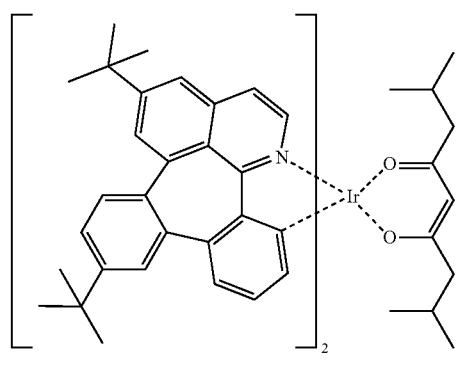
C-89
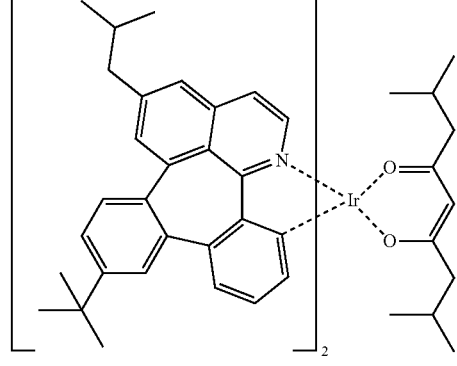
C-90
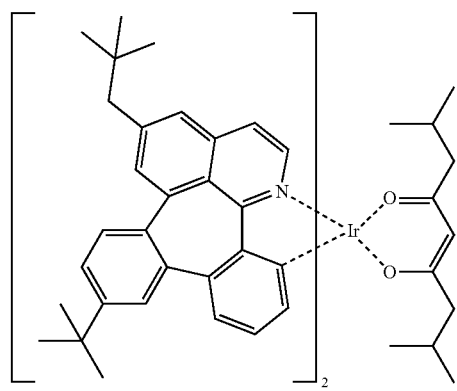

C-91
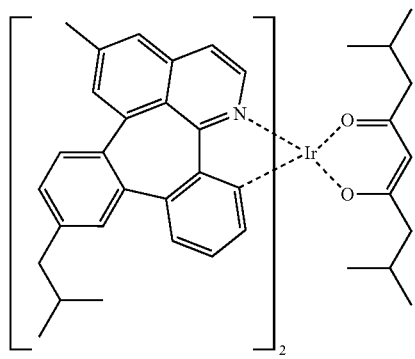
C-92
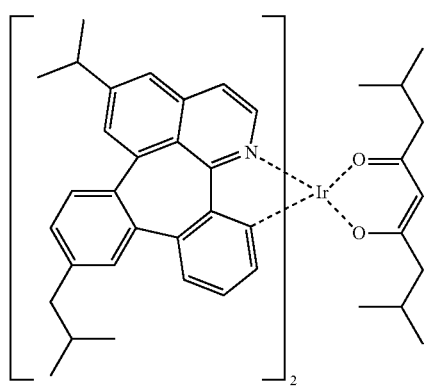
C-93
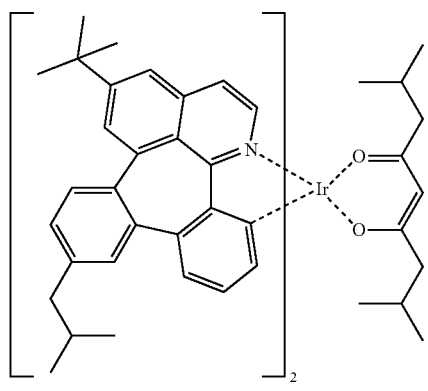
C-94
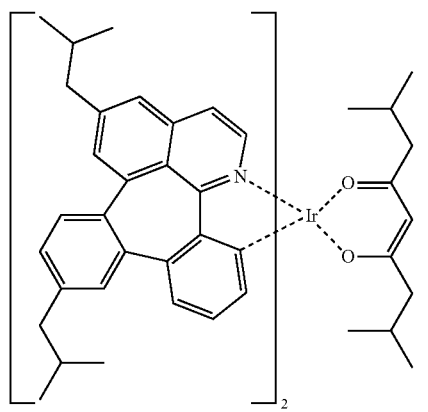
C-95
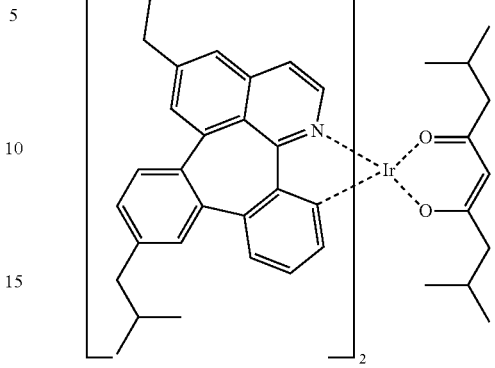
C-96
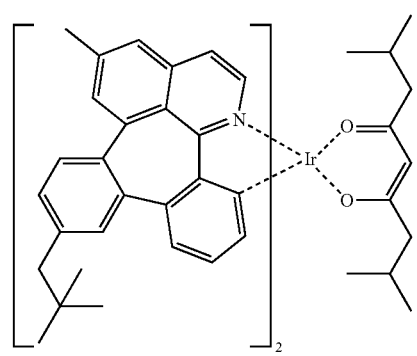
C-97
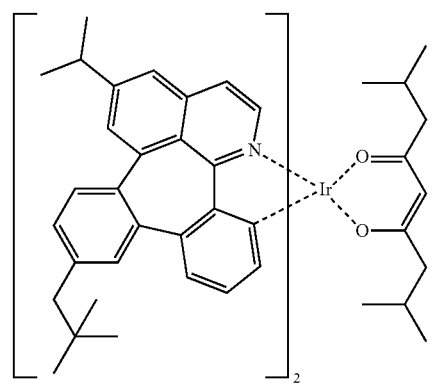
C-98
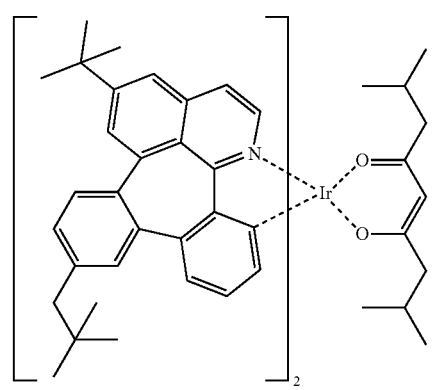

C-99
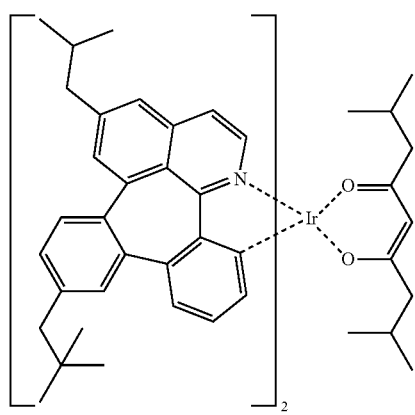
C-100
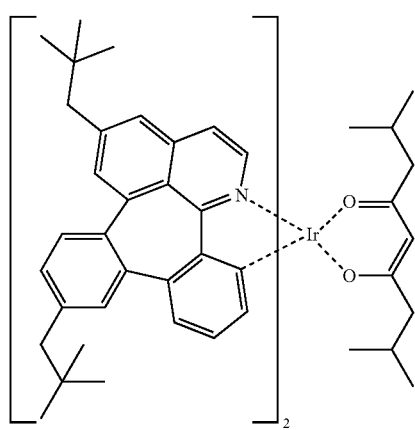
C-101
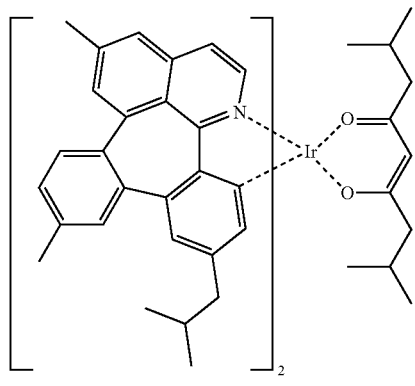
C-102
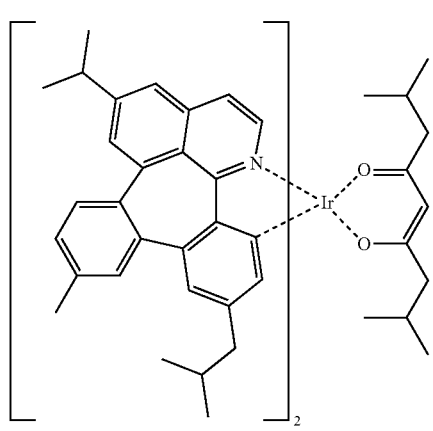
C-103
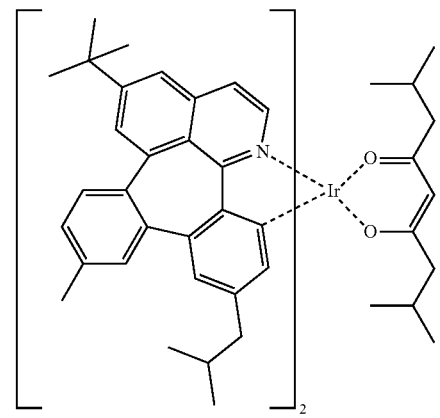
C-104
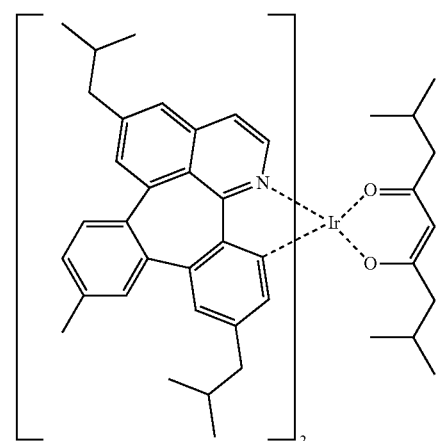
C-105
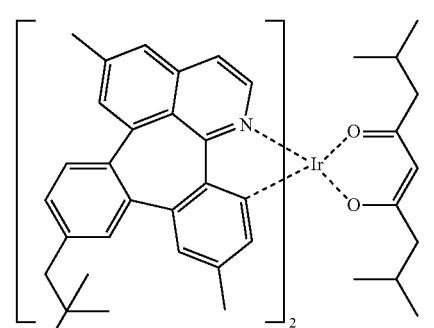
C-106
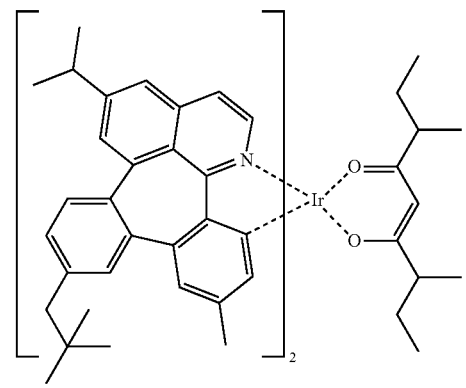

C-107
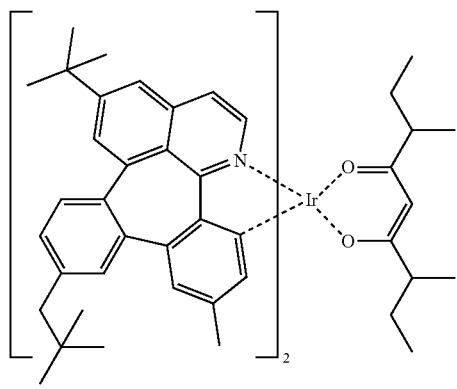
C-108
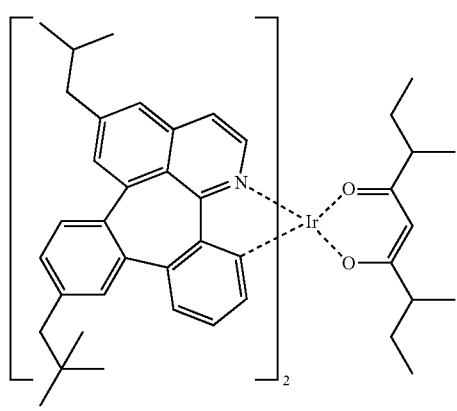
C-109
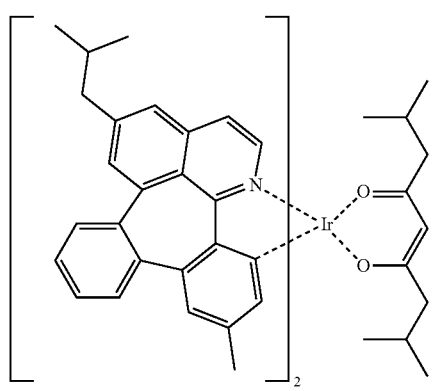
C-110
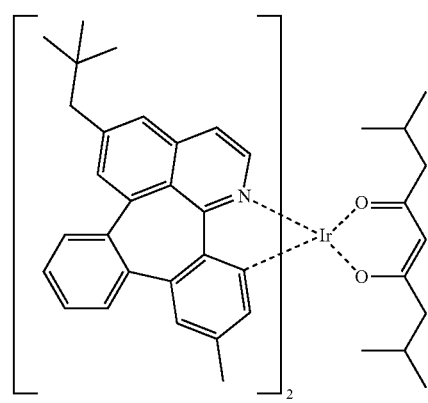
C-111
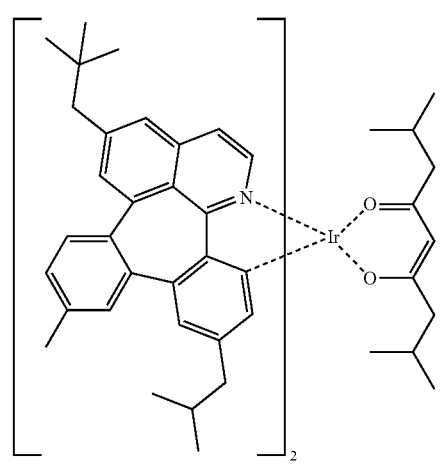
C-112
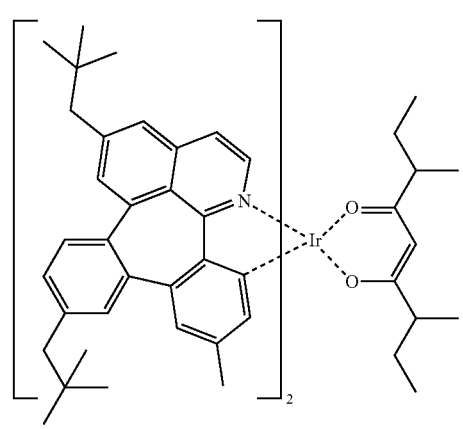
The organic electroluminescent compound of the present disclosure may be produced by a synthetic method known to one skilled in the art. For example, the organic electroluminescent compound of the present disclosure may be synthesized as shown in the following reaction scheme 1, but is not limited thereto.

[Reaction Scheme 1]
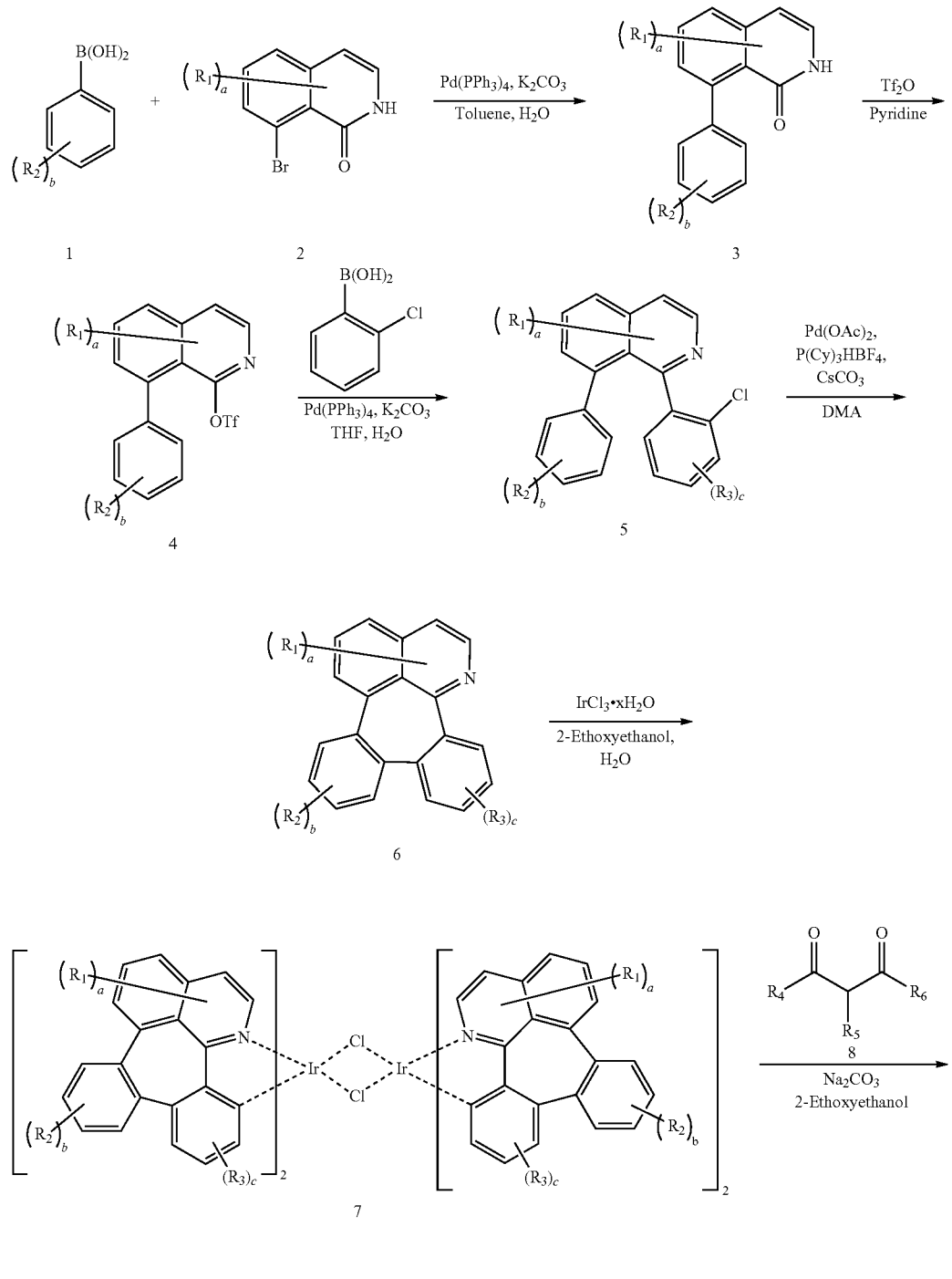
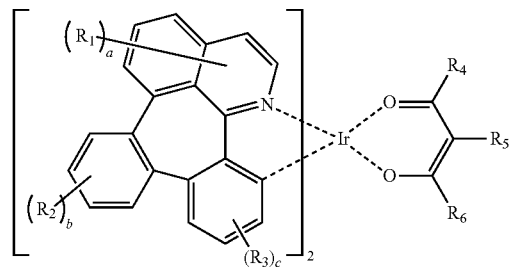

In reaction scheme 1, $R_1$ to $R_6$ and a to c are as defined in formulas 1 and 3.

A host compound, which can be used in combination with the organic electroluminescent compound of the present disclosure, includes the compound represented by any one of the following formulas 11 to 13, but is not limited thereto.

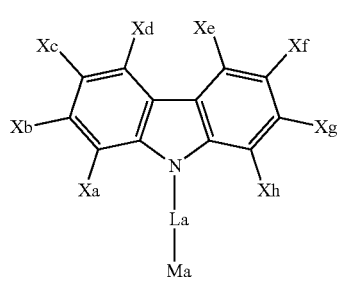

(11)

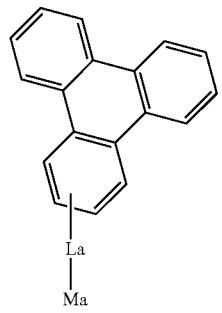

(12)

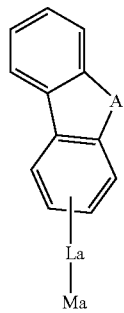

(13)

wherein

Ma represents a substituted or unsubstituted (C6-C30) aryl, or a substituted or unsubstituted (6- to 30-membered)heteroaryl;

La represents a single bond, a substituted or unsubstituted (C6-C30)arylene, or a substituted or unsubstituted (6- to 30-membered)heteroarylene;

A represents S, O, $NR_9$, or $CR_{10}R_{11}$;

Xa to Xh, each independently, represent hydrogen, deuterium, a halogen, a cyano, a substituted or unsubstituted (C1-C30)alkyl, a substituted or unsubstituted (C2-C30)alkenyl, a substituted or unsubstituted (C2-C30)alkynyl, a substituted or unsubstituted (C3-C30) cycloalkyl, a substituted or unsubstituted (C6-C60)aryl, a substituted or unsubstituted (3- to 30-membered) heteroaryl, a substituted or unsubstituted tri(C1-C30) alkylsilyl, a substituted or unsubstituted tri(C6-C30) arylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted (C1-C30)alkyl(C6-C30)arylamino, or a substituted or unsubstituted mono- or di-(C6-C30)arylamino; or may be linked to an adjacent substituent to form a ring(s); and $R_9$ to $R_{11}$ each independently, represent hydrogen, deuterium, a halogen, a cyano, a substituted or unsubstituted (C1-C30)alkyl, a substituted or unsubstituted (C6-C30) aryl, a substituted or unsubstituted (3- to 30-membered) heteroaryl, a substituted or unsubstituted (C3-C30) cycloalkyl, a substituted or unsubstituted (C1-C30) alkoxy, a substituted or unsubstituted tri(C1-C30) alkylsilyl, a substituted or unsubstituted di(C1-C30) alkyl(C6-C30)arylsilyl, a substituted or unsubstituted (C1-C30)alkyldi(C6-C30)arylsilyl, a substituted or unsubstituted tri(C6-C30)arylsilyl, a substituted or unsubstituted mono- or di-(C1-C30)alkylamino, a substituted or unsubstituted mono- or di-(C6-C30)arylamino, or a substituted or unsubstituted (C1-C30)alkyl (C6-C30)arylamino; or $R_9$ and $R_{10}$ may be linked to each other to form a ring(s).

In formulas 11 to 13, La represents, preferably a single bond; a substituted or unsubstituted (C6-C25)arylene; or a substituted or unsubstituted (6- to 25-membered)heteroarylene. More preferably, La represents a single bond; an unsubstituted (C6-C18)arylene; or a (6- to 20-membered) heteroarylene unsubstituted or substituted with a phenyl(s), a biphenyl(s), and/or a carbazolyl(s), For example, La may represent a single bond; an unsubstituted phenylene; an unsubstituted naphthylene; an unsubstituted biphenylene; a pyridinylene unsubstituted or substituted with a phenyl(s); a pyrimidinylene unsubstituted or substituted with a phenyl(s), a biphenyl(s), and/or a carbazolyl(s); a triazinylene unsubstituted or substituted with a phenyl(s), a biphenyl(s), and/or a carbazolyl(s); an unsubstituted quinolinylene; a quinazolinylene unsubstituted or substituted with a phenyl(s); an unsubstituted quinoxalinylene; an unsubstituted carbazolylene; an unsubstituted dibenzothiophenylene; an unsubstituted benzofuropyrimidinylene; an unsubstituted benzothienopyrimidinylene; an unsubstituted benzoquinazolinylene; or an unsubstituted nitrogen- and/or sulfur-containing (20-membered)hereroarylene.

In formulas 11 to 13, Ma represents, preferably a substituted or unsubstituted (C6-C25)aryl, or a substituted or unsubstituted (6- to 25-membered)heteroaryl; and more preferably a substituted or unsubstituted (C6-C18)aryl, or a substituted or unsubstituted (6- to 20-membered)heteroaryl. For example, Ma may represent a substituted or unsubstituted phenyl, a substituted or unsubstituted naphthylphenyl, an unsubstituted naphthyl, an unsubstituted biphenyl, a fluorenyl substituted with a methyl(s), an unsubstituted terphenyl, an unsubstituted triphenylenyl, a substituted pyrimidinyl, a substituted triazinyl, a substituted quinoxalinyl, a substituted quinazolinyl, a substituted or unsubstituted carbazolyl, an unsubstituted dibenzothiophenyl, a benzofuropyrimidinyl substituted with a phenyl(s), a benzothienopyrimidinyl substituted with a phenyl(s), a benzoquinazolinyl substituted with a phenyl(s), or an indolocarbazolyl substituted with a phenyl(s), in which the substituent of the substituted phenyl may be at least one selected from the group consisting of a carbazolyl unsubstituted or substituted with a phenyl(s), a pyrimidinyl substituted with a phenyl(s), a triphenylsilyl, a dibenzothiophenyl, dimethylfluorenyl, and a triphenylenyl; the substituent of the substituted pyrimidinyl may be at least one selected from the group consisting of a phenyl, a biphenyl, and a terphenyl; the substituent of the substituted triazinyl may be at least one selected from the group consisting of a phenyl unsubstituted or substituted with a triphenylsilyl(s), a biphenyl, a naphthyl, and a terphenyl; the substituent of the substituted quinoxalinyl may be at least one selected from the group consisting of a phenyl, a naphthyl, a biphenyl, and a naphthylphenyl, the substituent of the substituted quinazolinyl may be at least one selected from the group consisting of a phenyl and a biphenyl; and the substituent of the substituted carbazolyl may be at least one selected from the group consisting of a phenyl unsubstituted or substituted with a diphenyltriazinyl(s), a biphenyl, a naphthyl, and a terphenyl.

In formula 11, Xa to Xh, each independently, represent, preferably hydrogen, a substituted or unsubstituted (C6-C18)aryl, or a substituted or unsubstituted (6- to 20-membered)heteroaryl; or may be linked to an adjacent substituent to form a substituted or unsubstituted, mono- or polycyclic, (C6-C20) aromatic ring, whose carbon atom(s) may be replaced with at least one heteroatom selected from nitrogen, oxygen, and sulfur; and more preferably, hydrogen, a substituted or unsubstituted (C6-C15)aryl, or a substituted or unsubstituted (10- to 20-membered)heteroaryl unsubstituted or substituted with a (C6-C18)aryl(s); or may be linked to an adjacent substituent to form a substituted or unsubstituted benzene ring, a substituted or unsubstituted indole ring, a substituted or unsubstituted benzoindole ring, a substituted or unsubstituted indene ring, a substituted or unsubstituted benzofuran ring, or a substituted or unsubstituted benzothiophene ring. For example, Xa to Xh, each independently, may represent hydrogen, a substituted or unsubstituted phenyl, an unsubstituted biphenyl, a substituted or unsubstituted carbazolyl, an unsubstituted dibenzofuranyl, or an unsubstituted dibenzothiophenyl; or may be linked to an adjacent substituent to form an unsubstituted benzene ring, a substituted indene ring, a substituted indole ring, a substituted or unsubstituted benzothiophene ring, an unsubstituted benzofuran ring, or a substituted benzoindole ring, in which the substituent of the substituted phenyl may be at least one selected from the group consisting of a carbazolyl unsubstituted or substituted with a phenyl(s), and dibenzothiophenyl; the substituent of the substituted carbazolyl may be at least one selected from the group consisting of a phenyl, a biphenyl, a naphthyl, and a terphenyl; the substituent of the substituted indene ring may be at least one selected from the group consisting of a methyl and a phenyl; the substituent of the substituted indole ring may be at least one selected from the group consisting of a phenyl, a naphthyl, and a biphenyl; the substituent of the substituted benzothiophene ring may be a triazinyl substituted with at least one phenyl; and the substituent of the substituted benzoindole ring may be at least one selected from the group consisting of a phenyl and a naphthyl.

In formula 13, A represents preferably S or $CR_{12}R_{13}$, in which $R_{12}$ and $R_{13}$, each independently, represent, preferably hydrogen, a substituted or unsubstituted (C1-C30)alkyl, or a substituted or unsubstituted (C6-C25)aryl; or may be linked to each other to form a substituted or unsubstituted, mono- or polycyclic, (C3-C25) alicyclic or aromatic ring, or the combination thereof; and more preferably an unsubstituted (C6-C18)aryl, or may be linked to each other to form an unsubstituted, mono- or polycyclic, (C3-C18) alicyclic or aromatic ring, or the combination thereof. For example, $R_{12}$ and $R_{13}$, each independently, represent a phenyl, or may be linked to each other to form a fluorene ring, a spiro structure.

The compound represented by any one of formulas 11 to 13 includes the following compounds, but is not limited thereto.

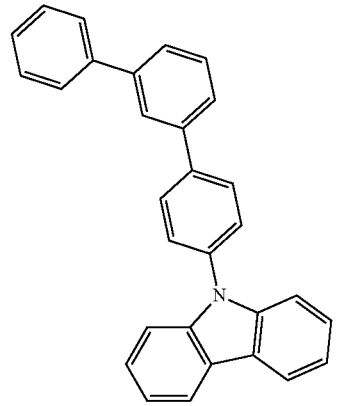

B-1

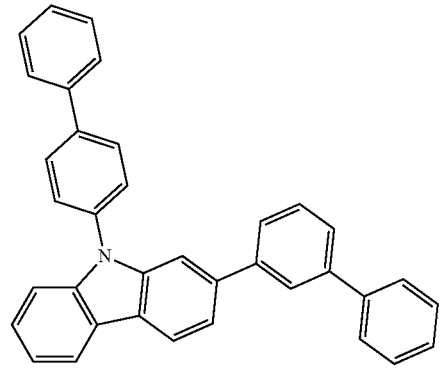

B-2

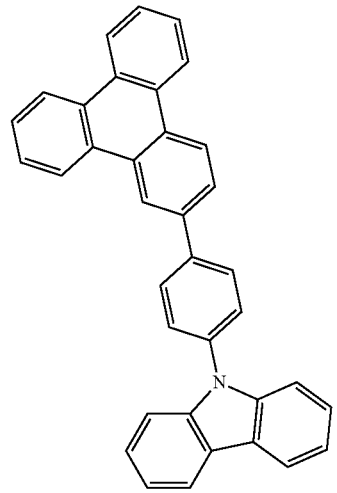

B-3

B-4
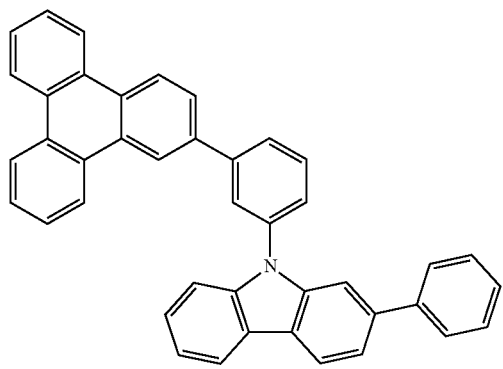
B-5
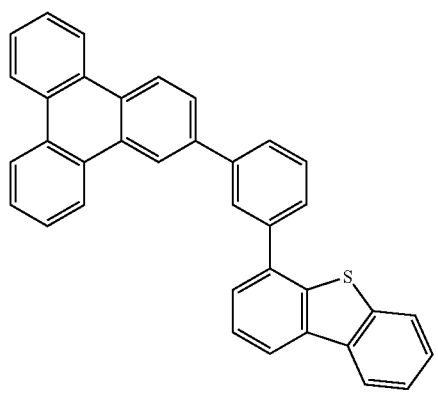
B-6
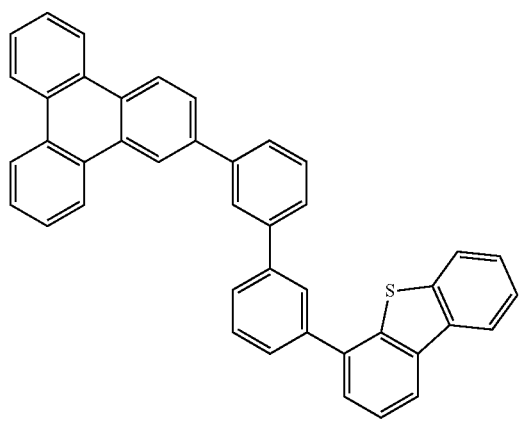
B-7
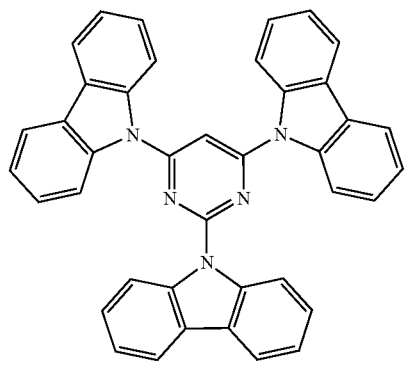
B-8
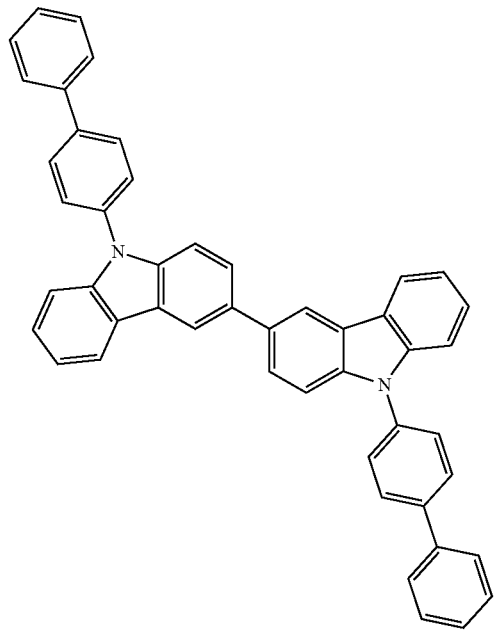
B-9
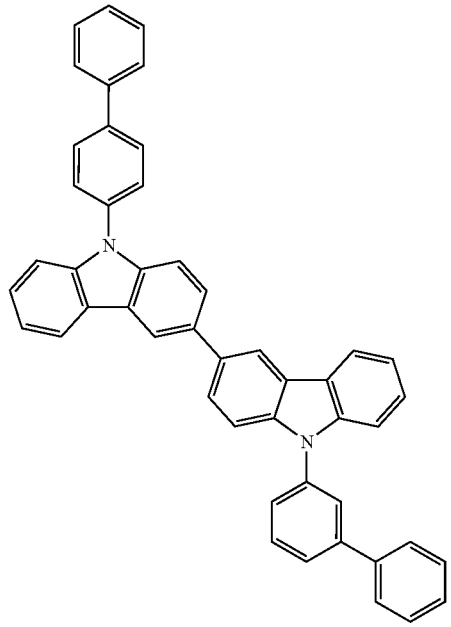

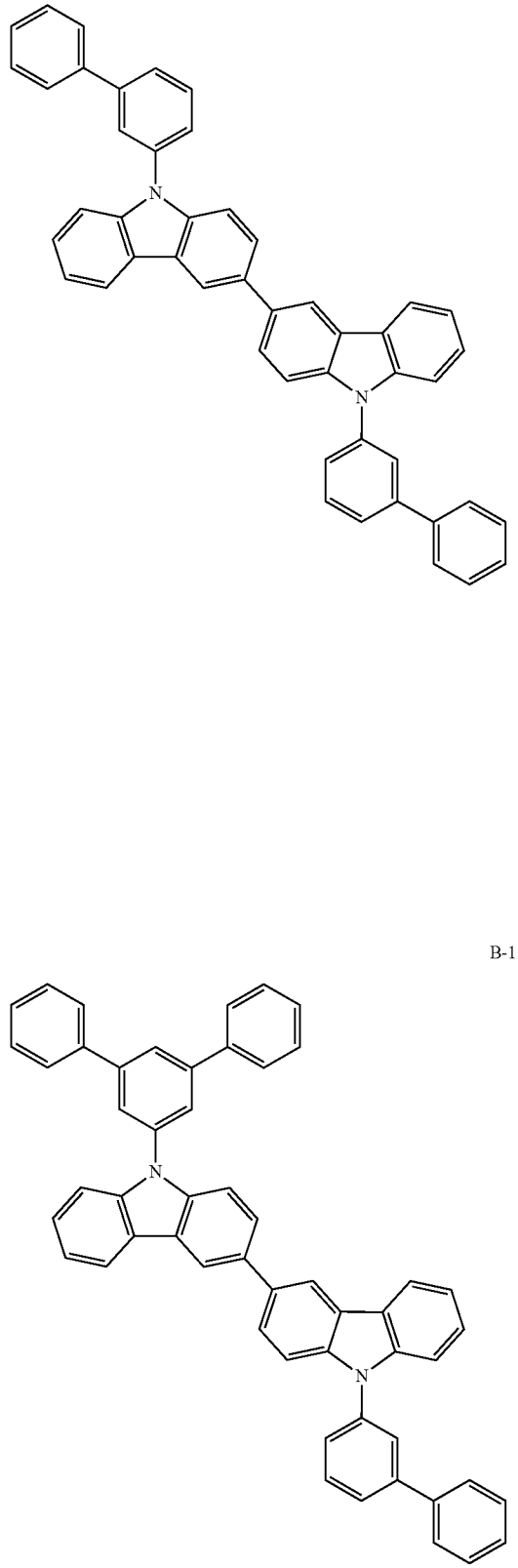
B-10
B-11
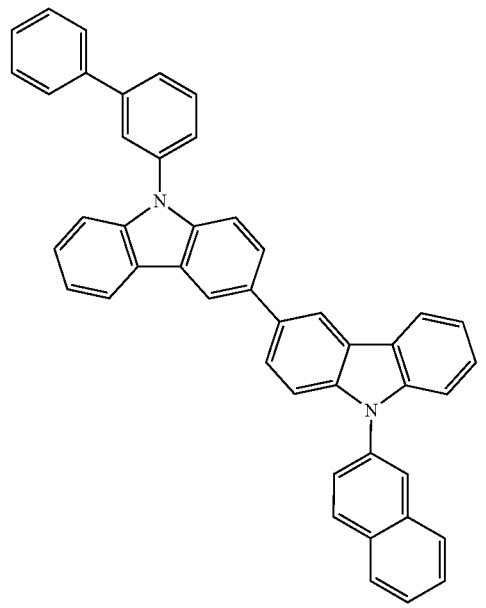
B-12
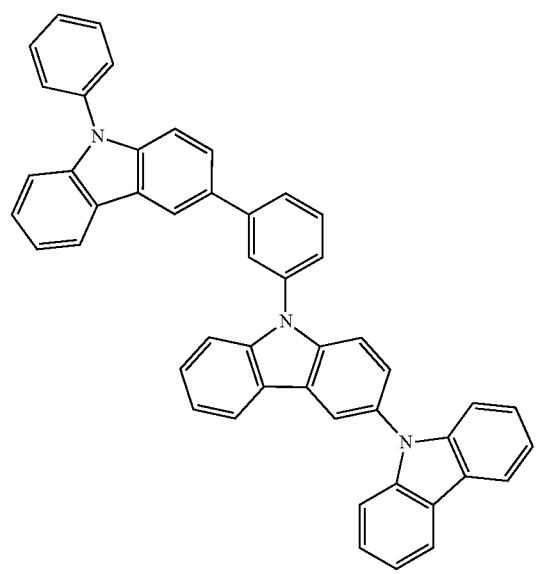
B-13
B-14

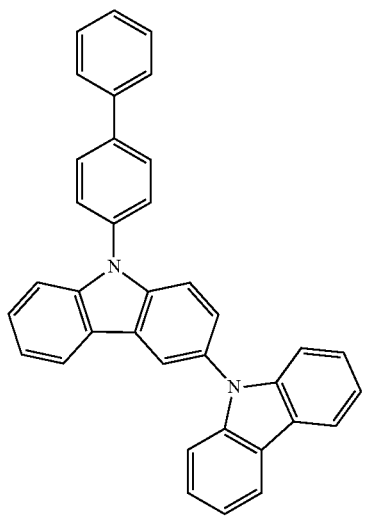
B-15
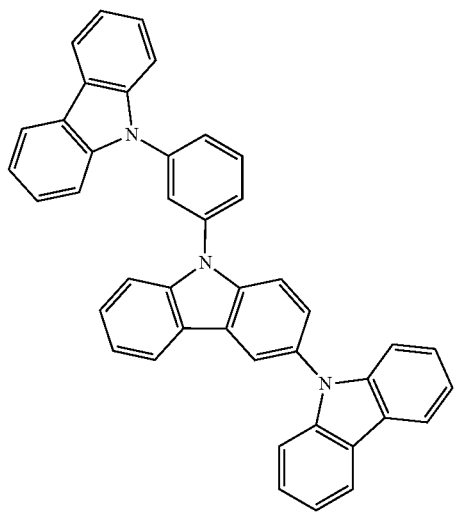
B-18
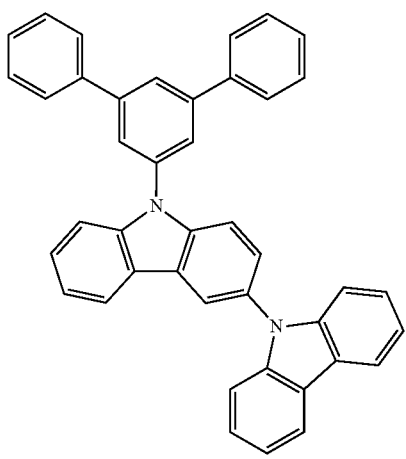
B-16
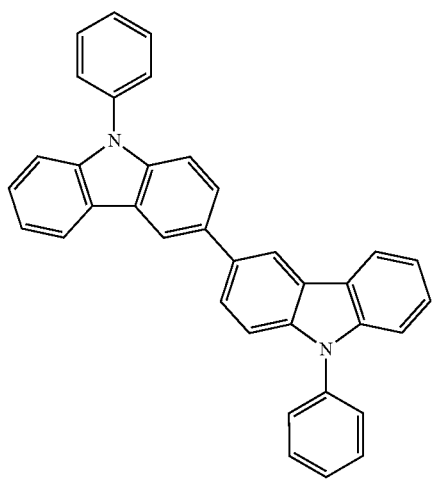
B-19
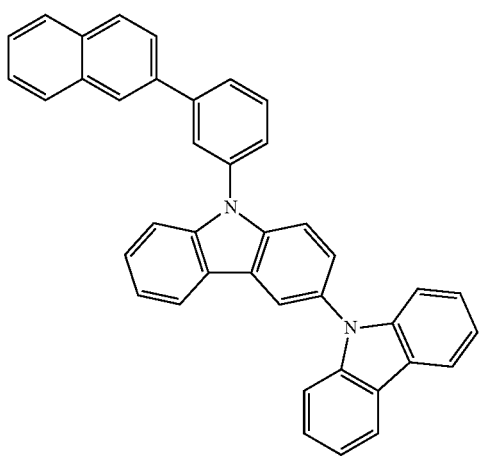
B-17
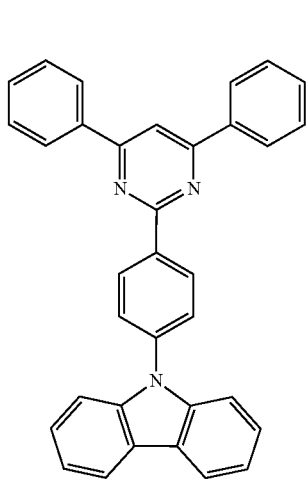
B-20

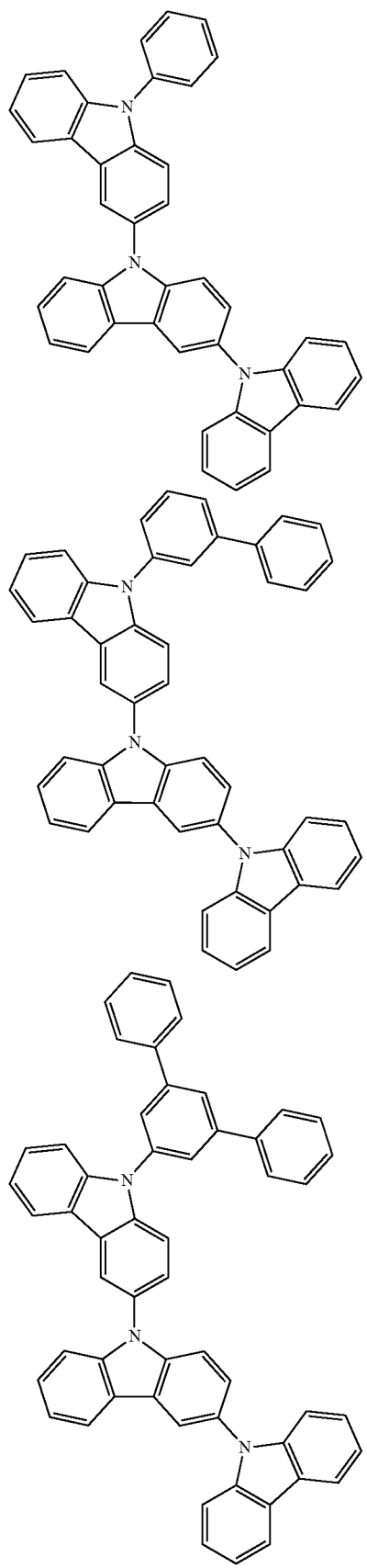
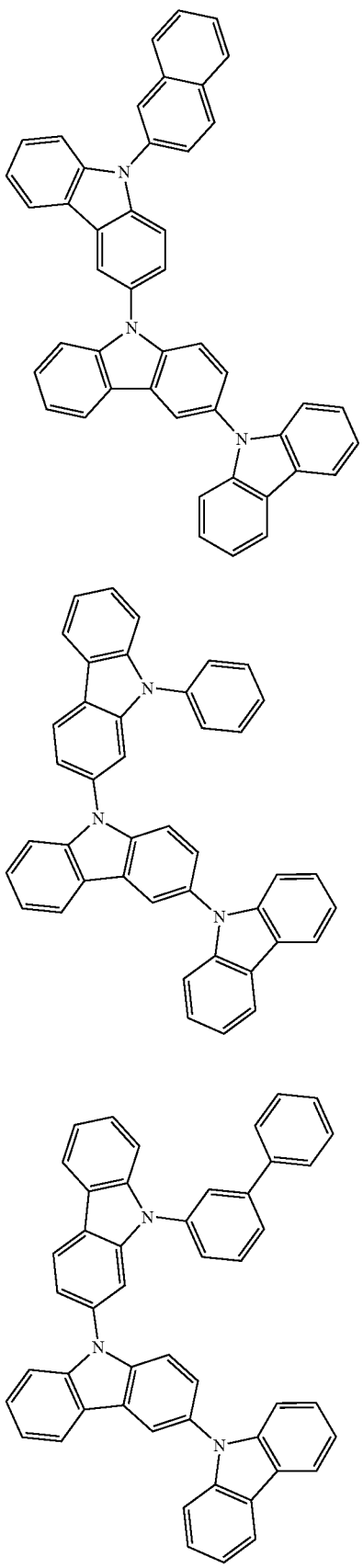

B-27
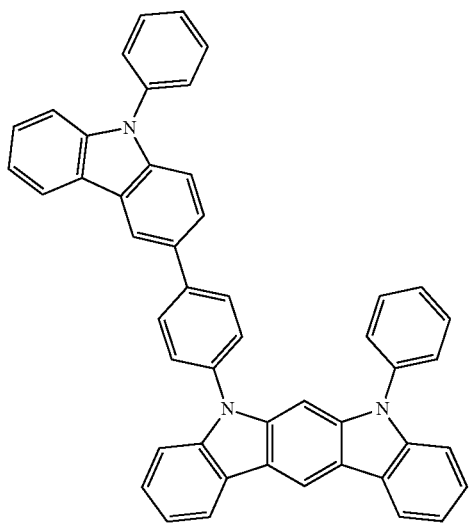
B-28
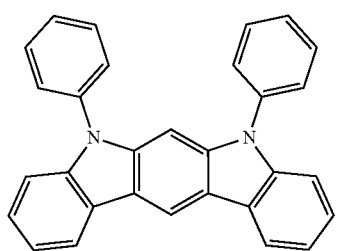
B-29
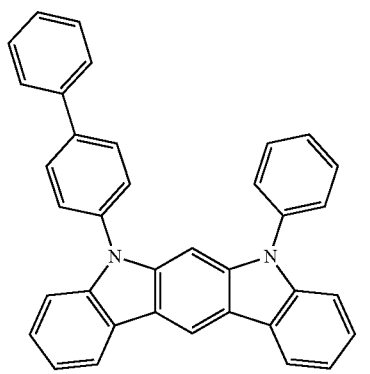
B-30
B-31
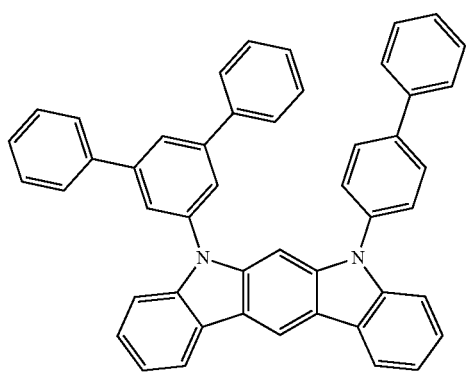
B-32
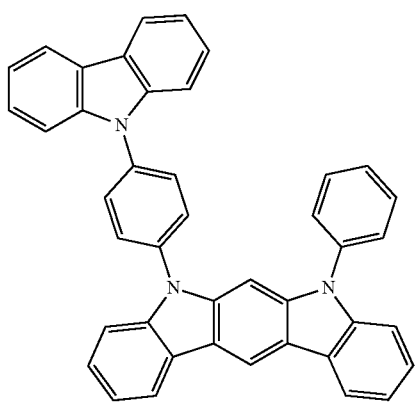
B-33
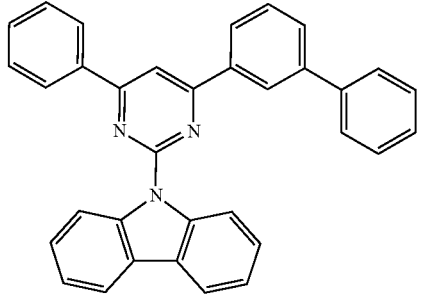
B-34
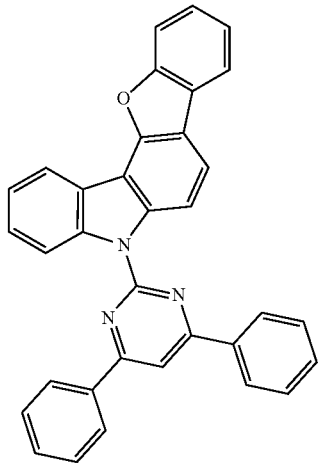

B-35
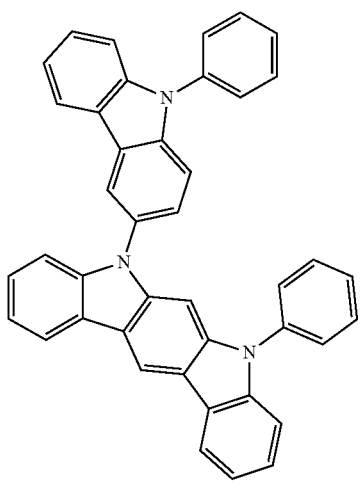
B-36
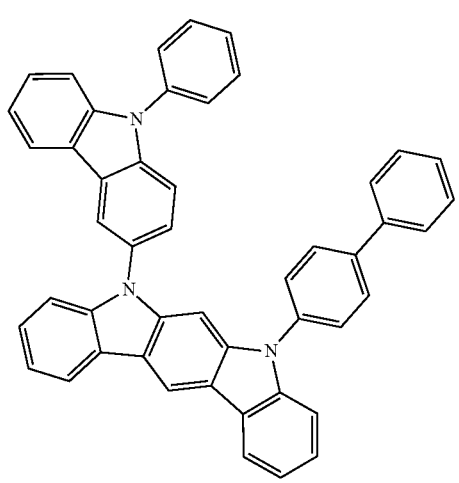
B-37
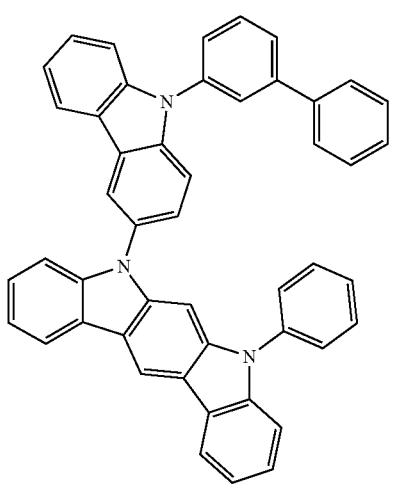
B-38
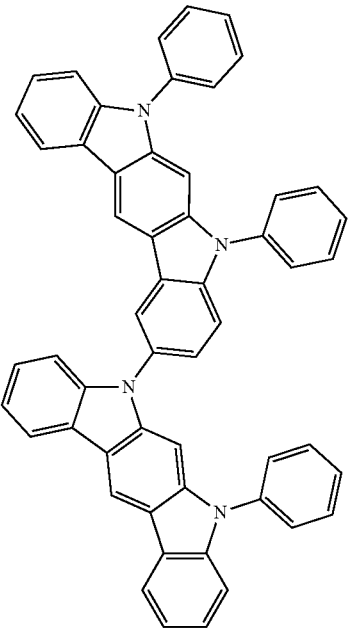
B-39
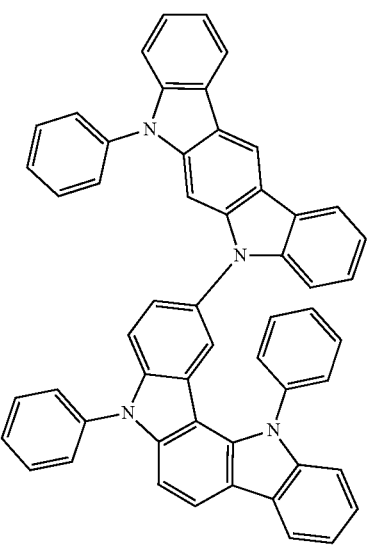
B-40
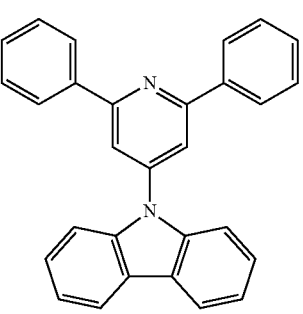

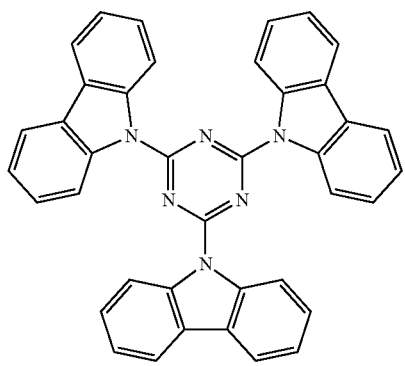
B-41
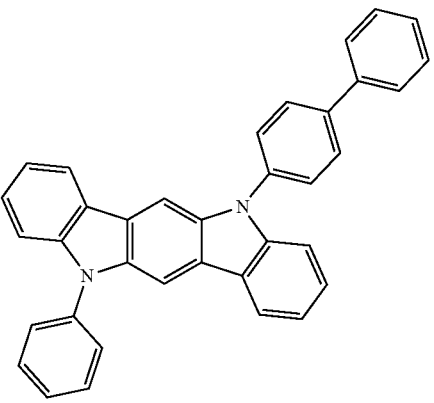
B-45
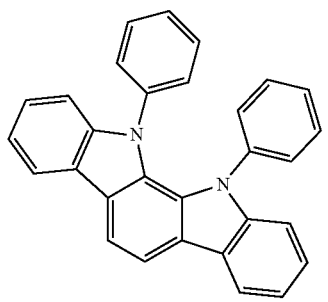
B-42
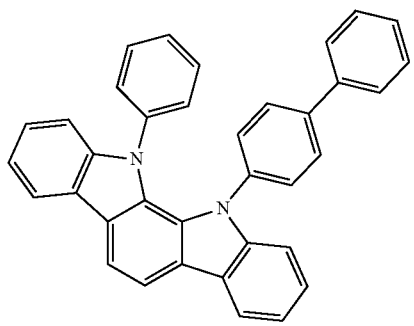
B-43
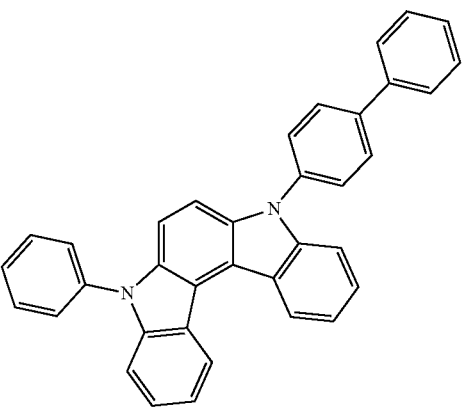
B-46
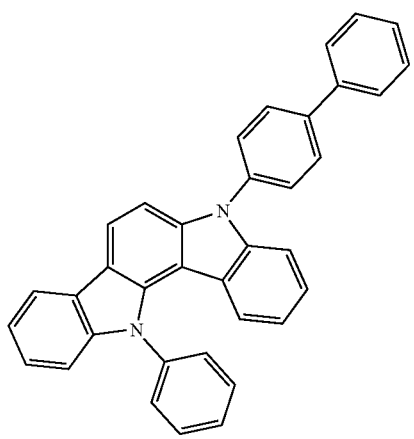
B-44
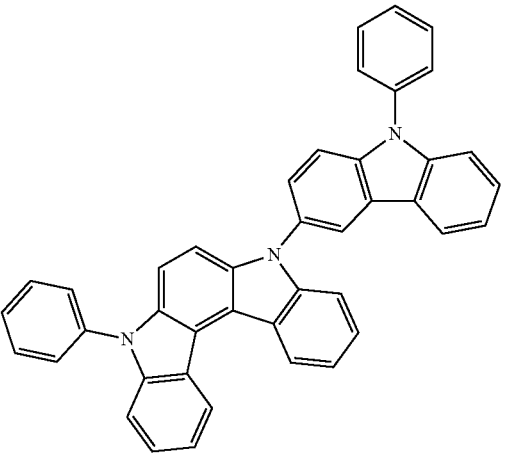
B-47

-continued
B-48
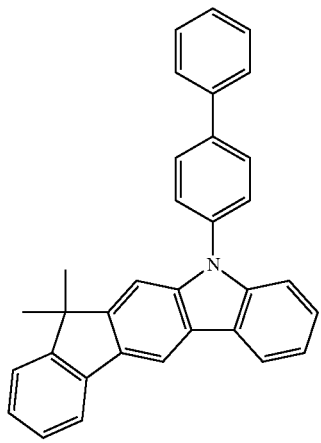
B-49
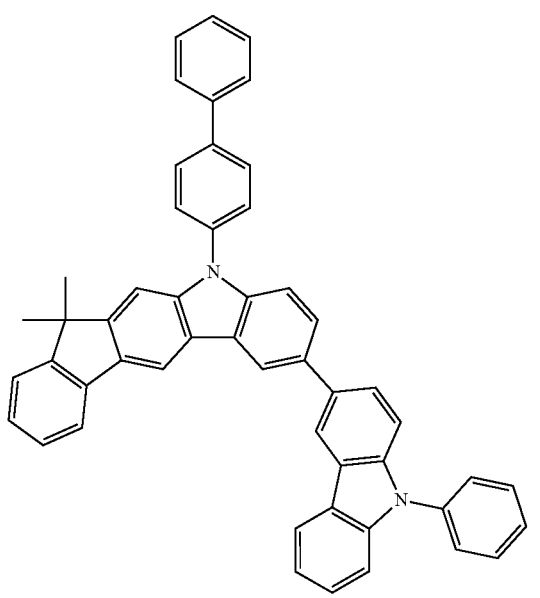
B-50
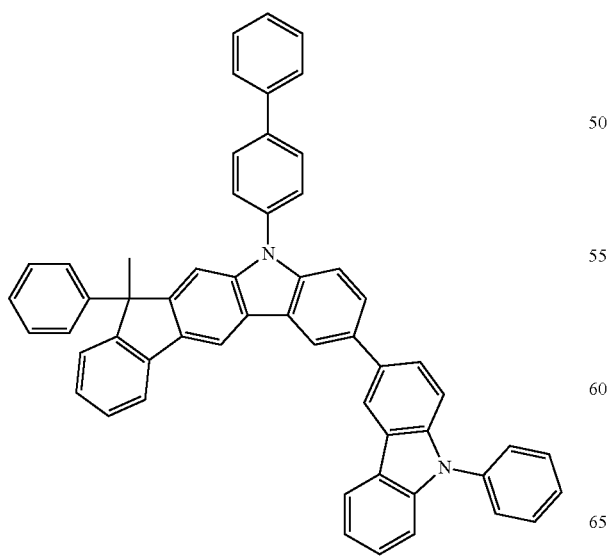
B-51
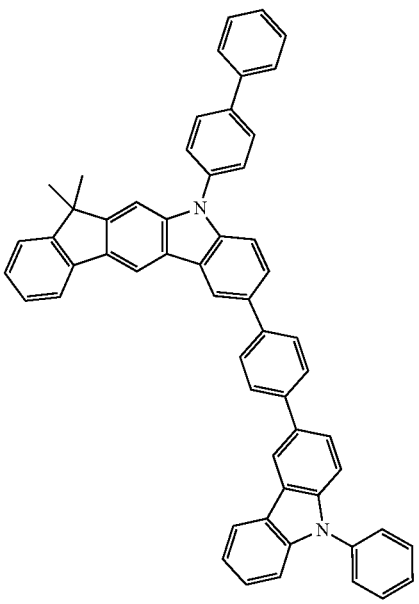
B-52
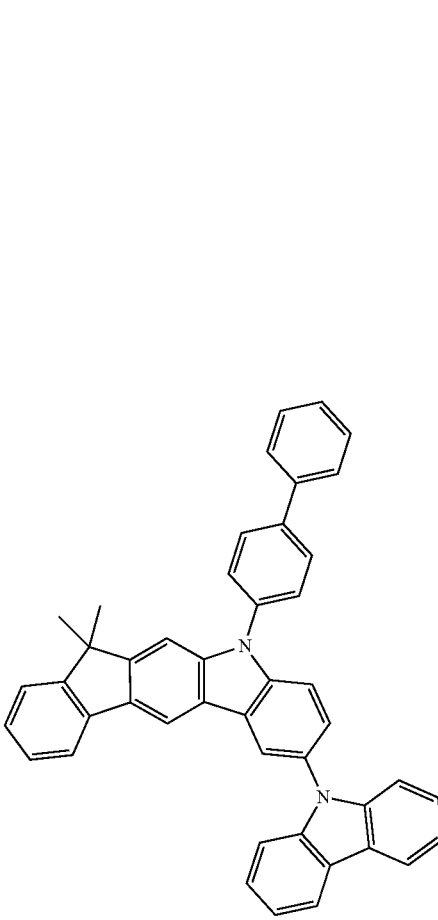

B-53
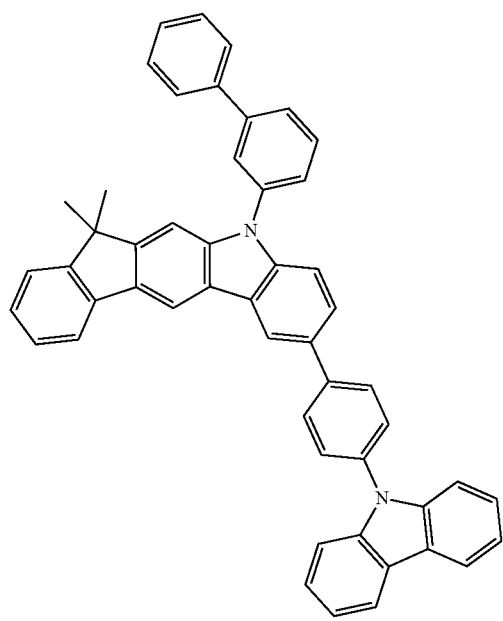
B-54
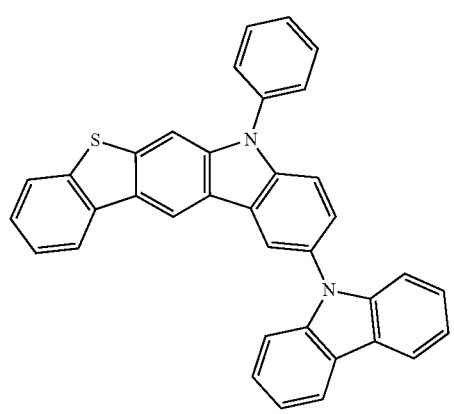
B-55
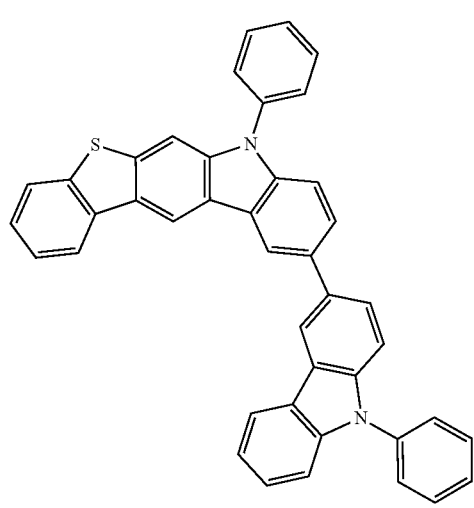
B-56
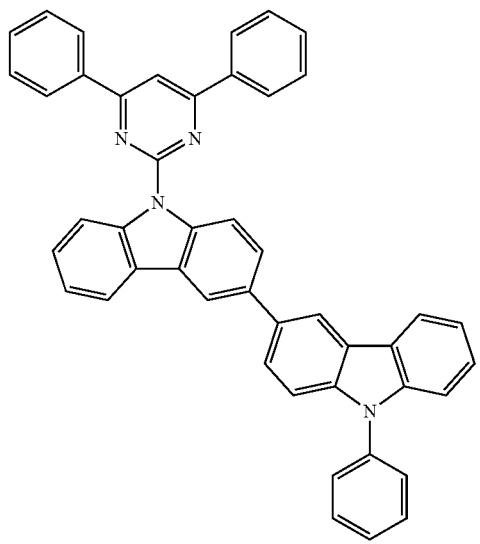
B-57
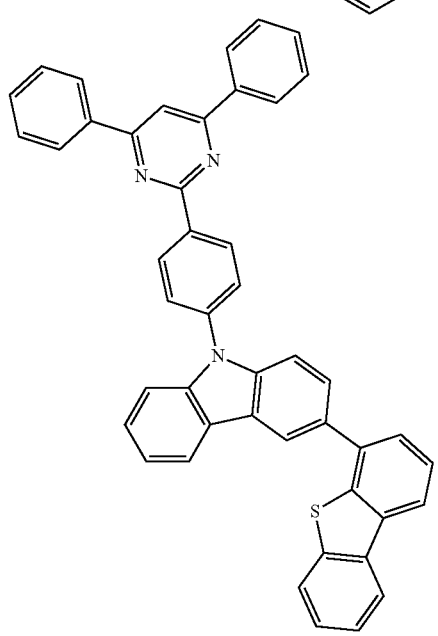
B-58
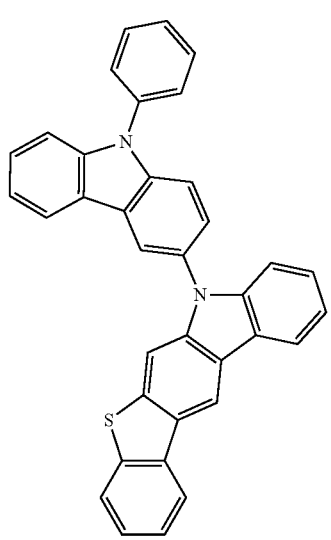

B-59
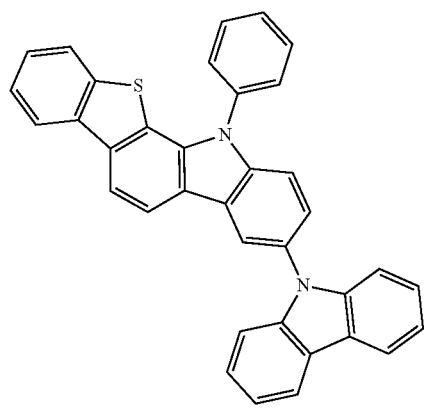
B-60
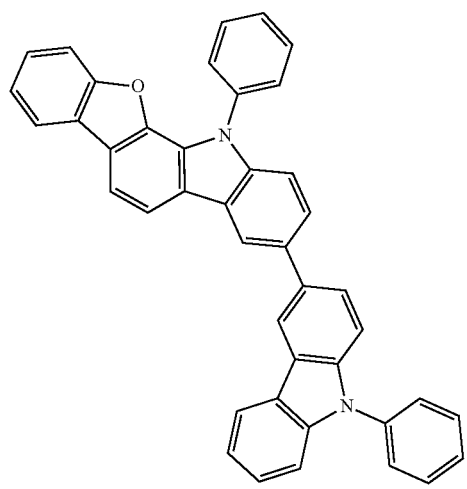
B-61
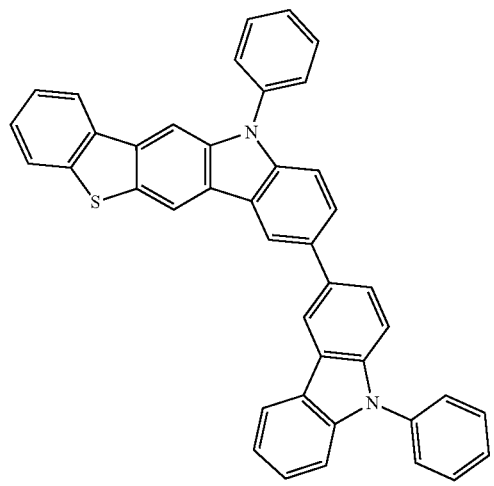
B-62
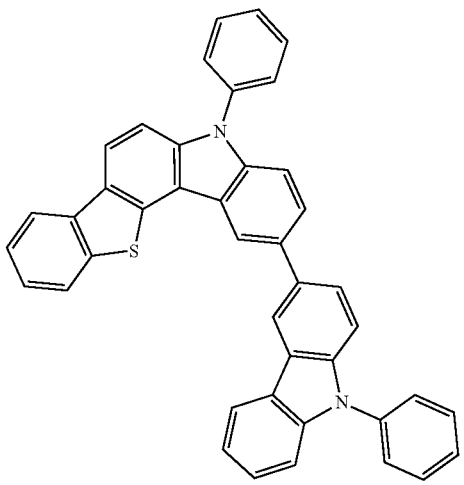
B-63
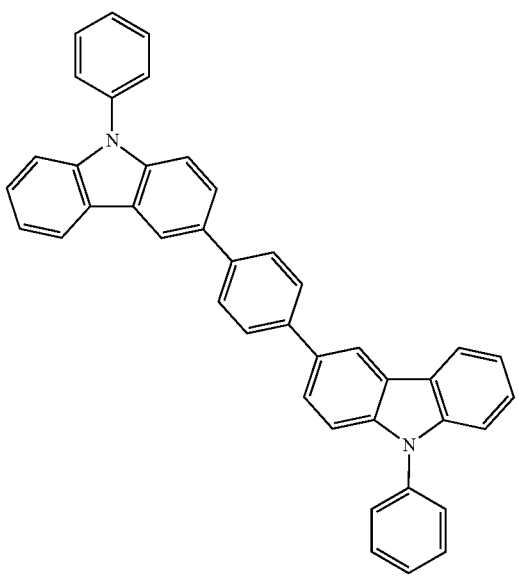
B-64
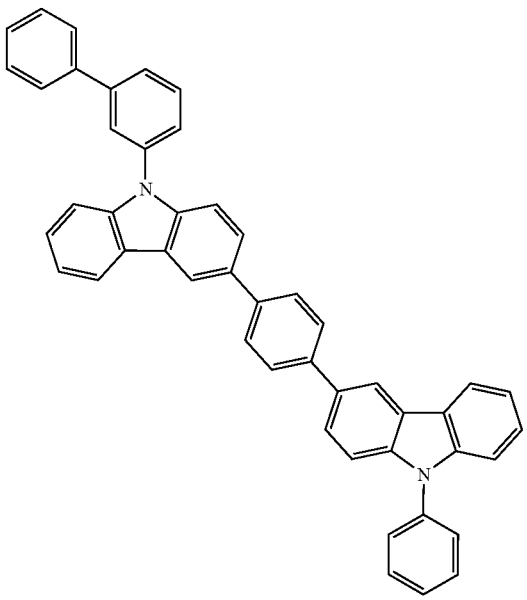

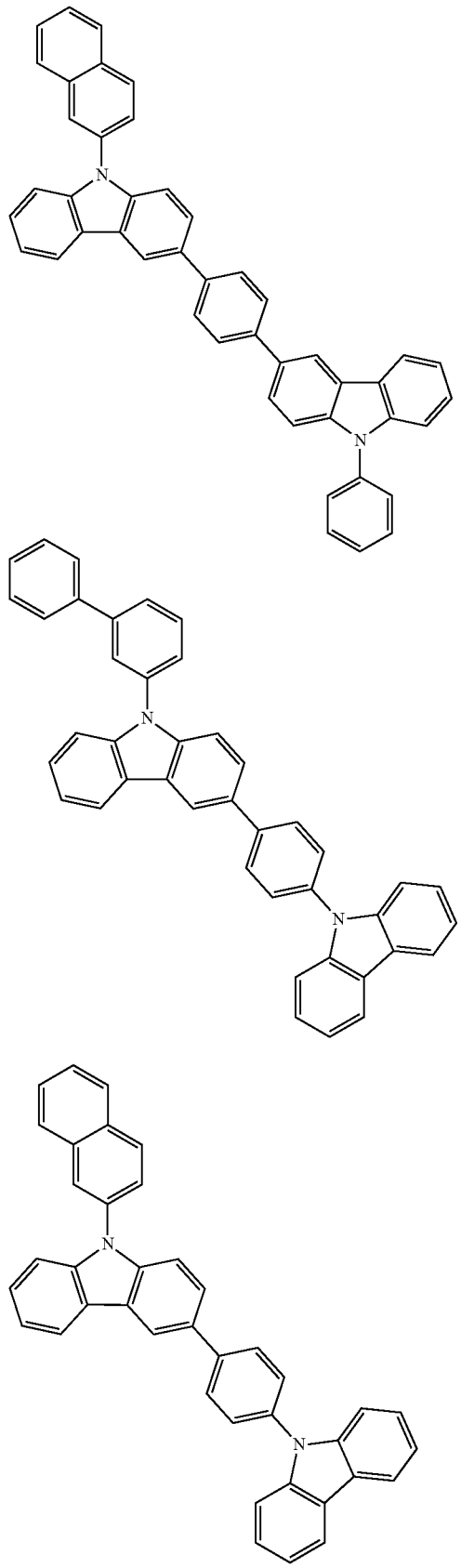
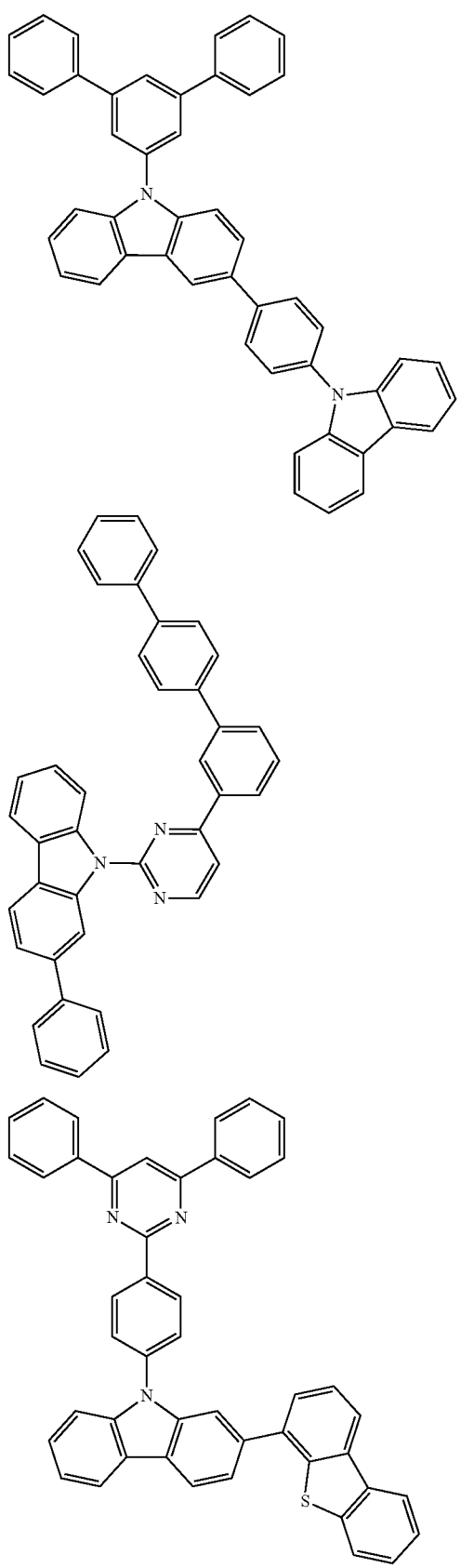

-continued
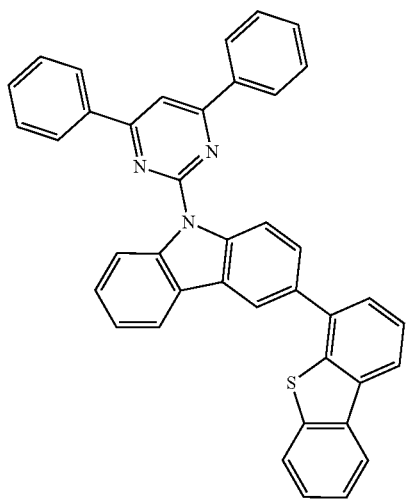
B-71
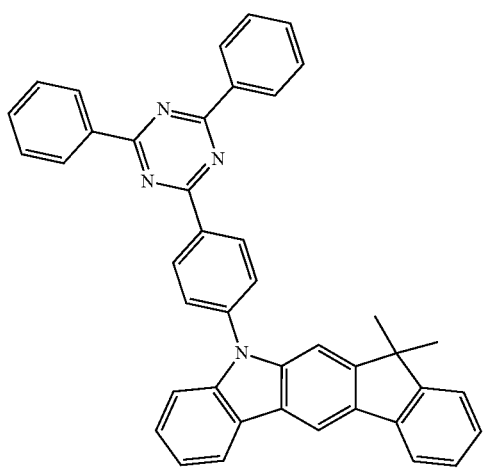
B-72
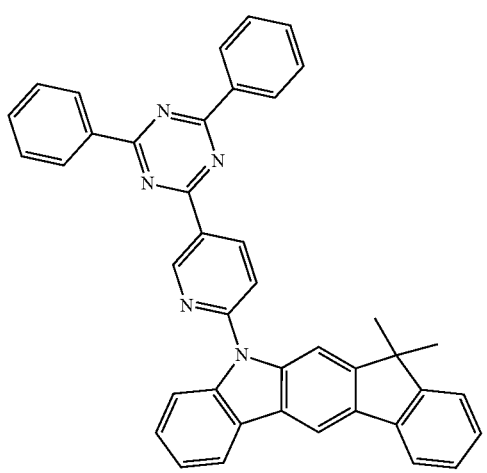
B-73
-continued
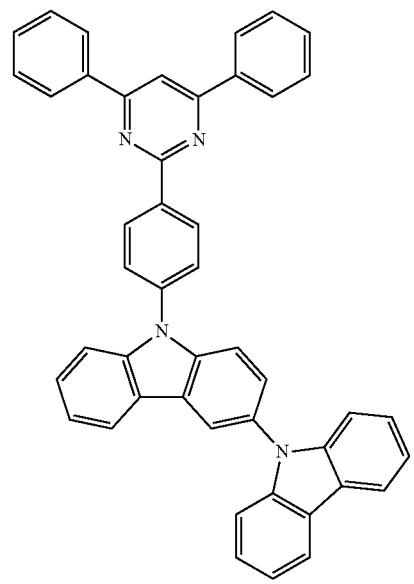
B-74
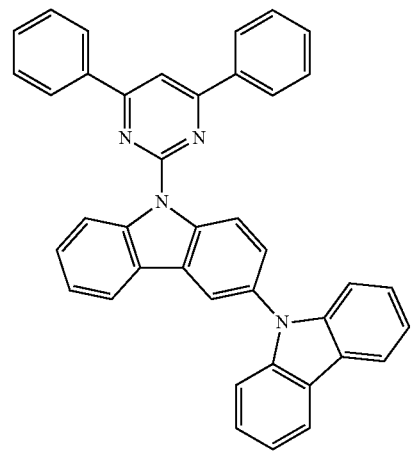
B-75
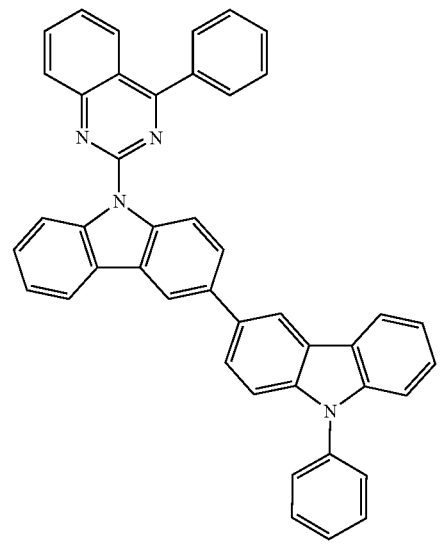
B-76

-continued
B-77
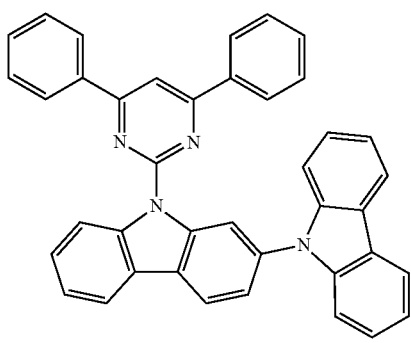
B-78
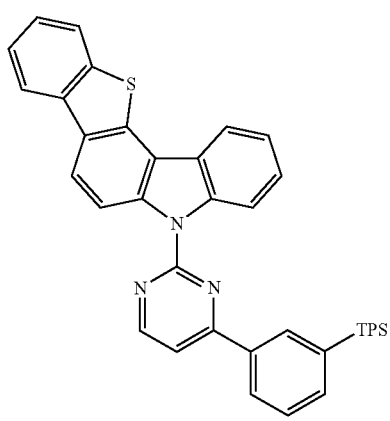
B-79
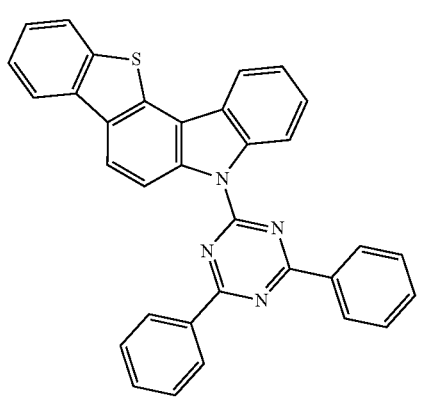
B-80
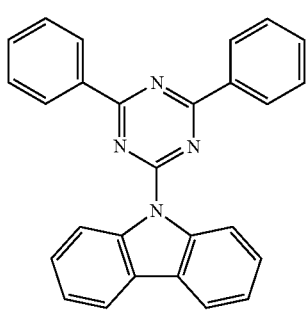
-continued
B-81
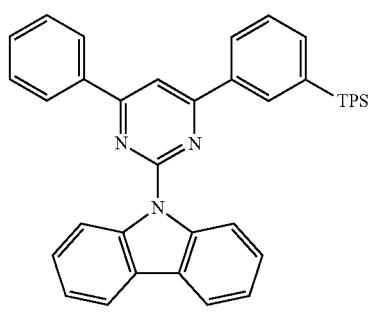
B-82
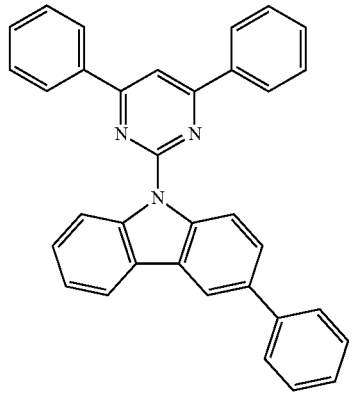
B-83
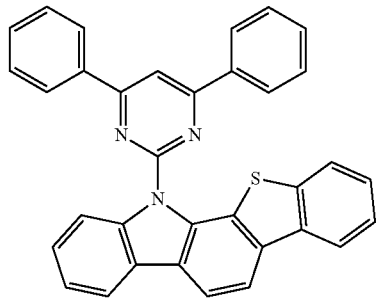
B-84
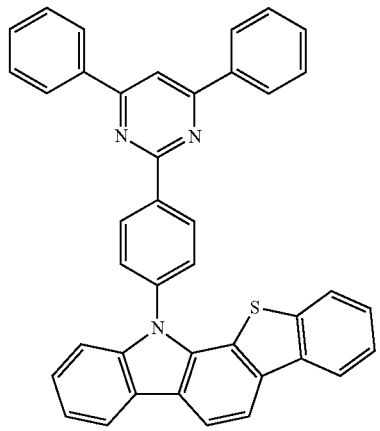

B-85
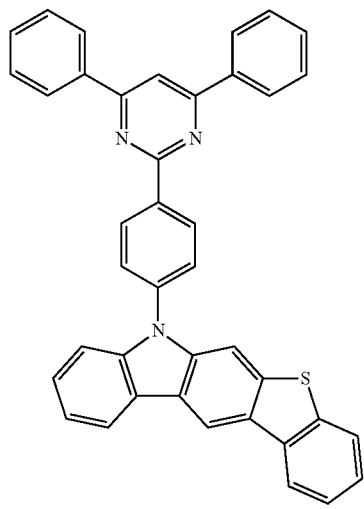
B-86
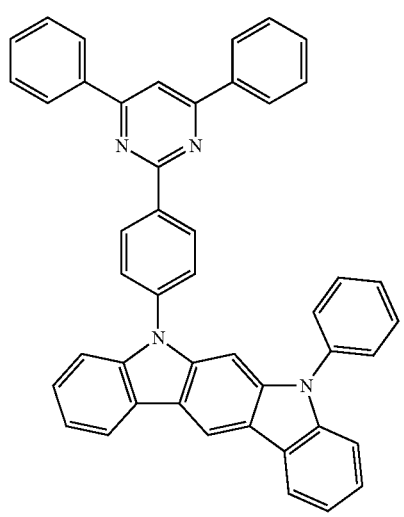
B-87
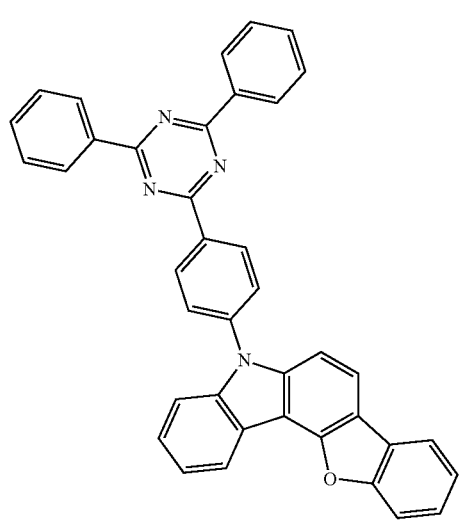
B-88
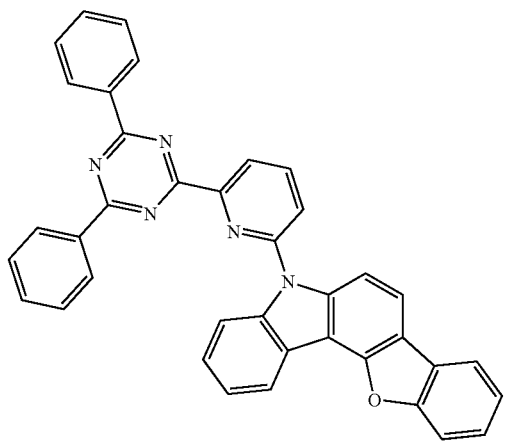
B-89
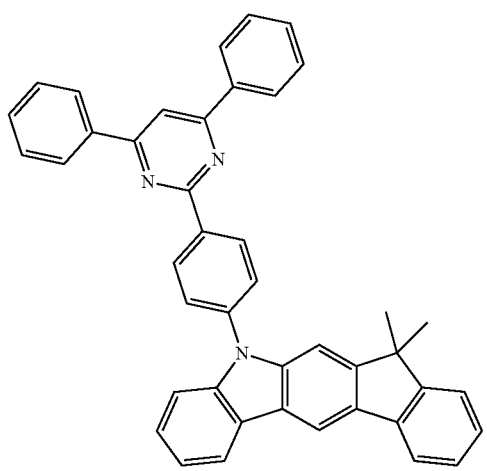
B-90
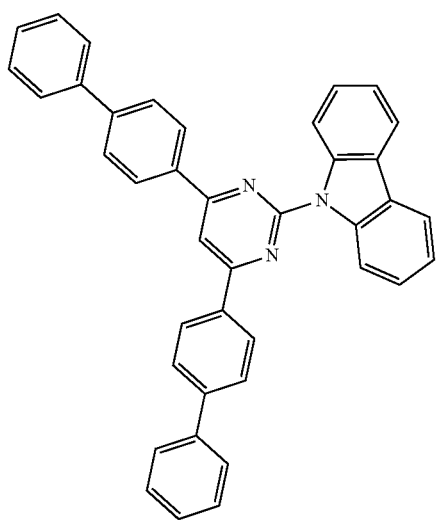

B-91
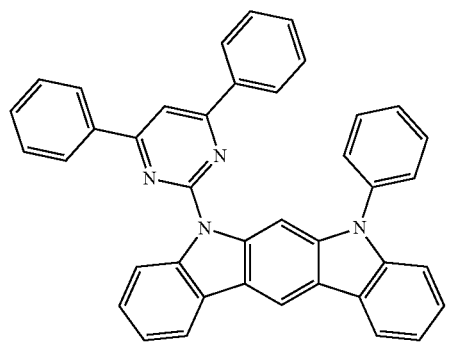
B-92
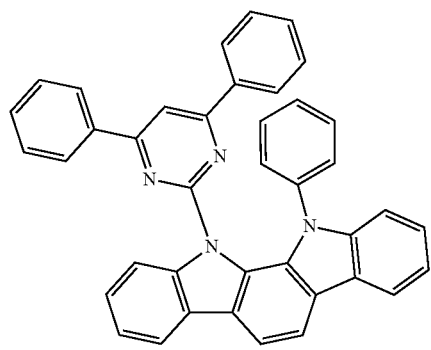
B-93
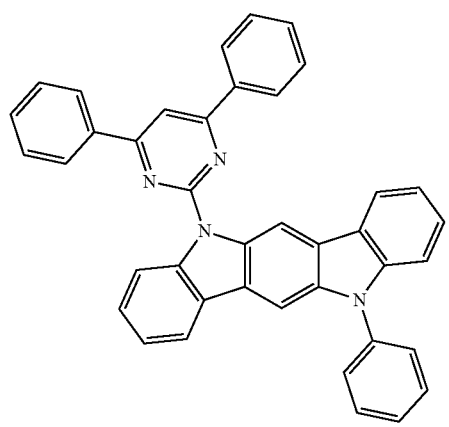
B-94
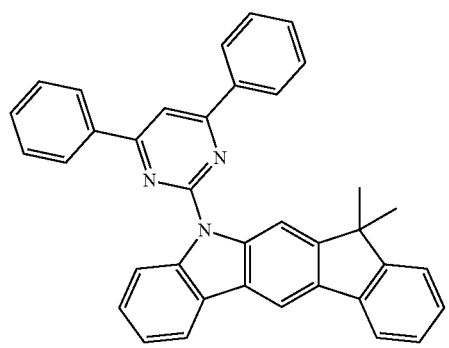
B-95
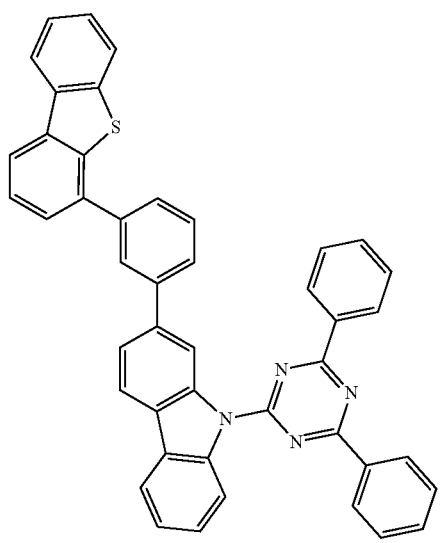
B-96
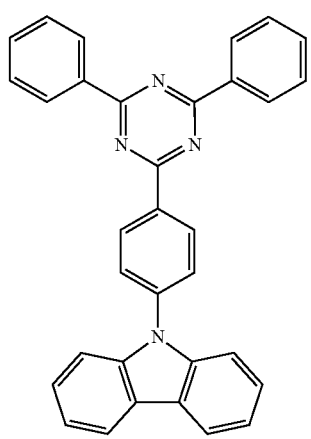
B-97
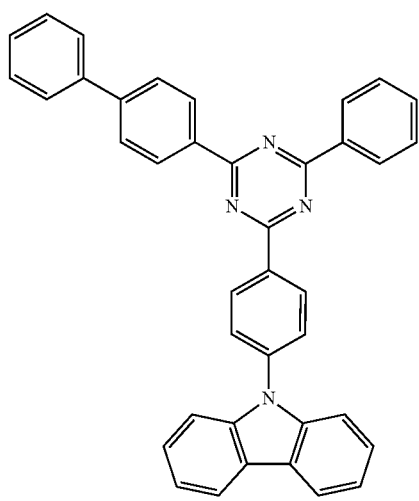

B-98
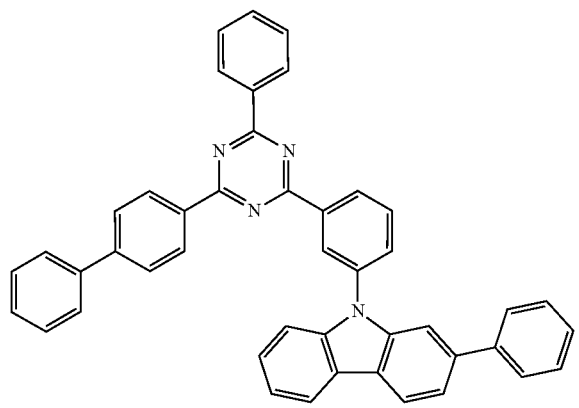
B-99
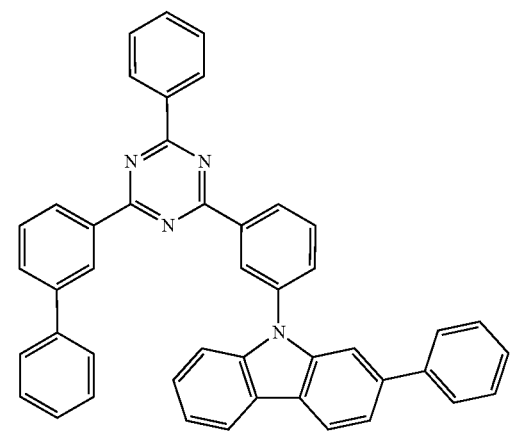
B-100
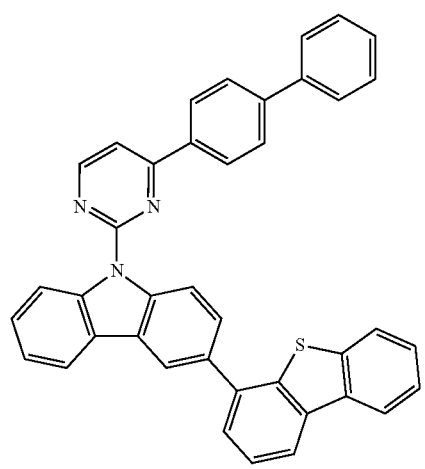
B-101
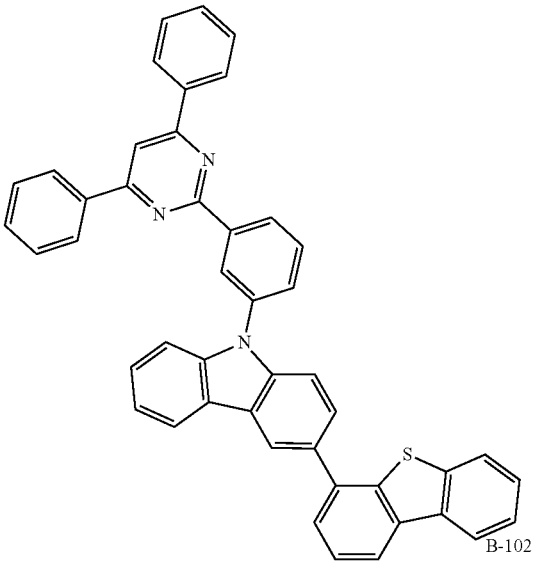
B-102
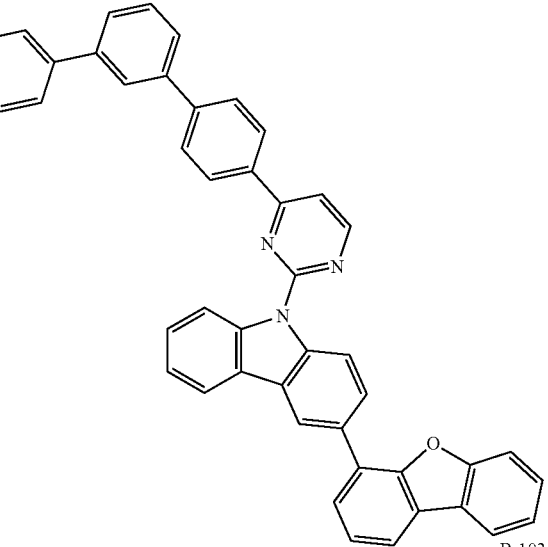
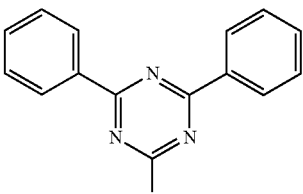
B-103
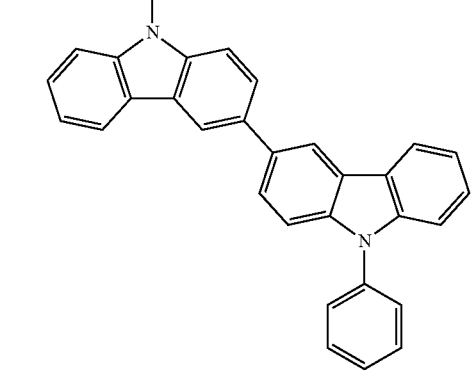

B-104
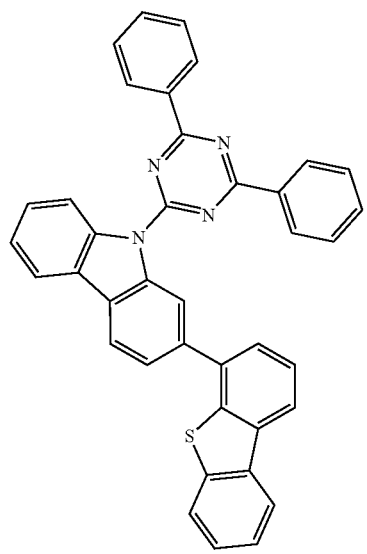
B-105
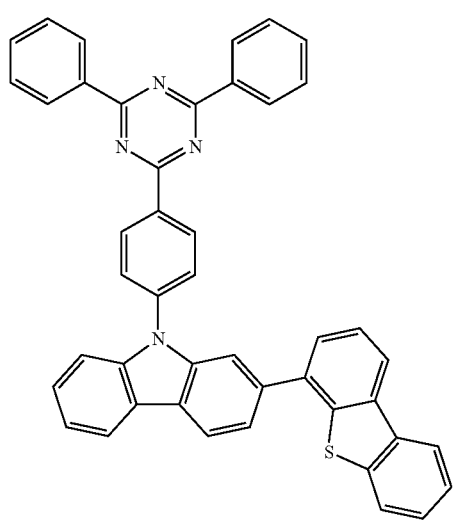
B-106
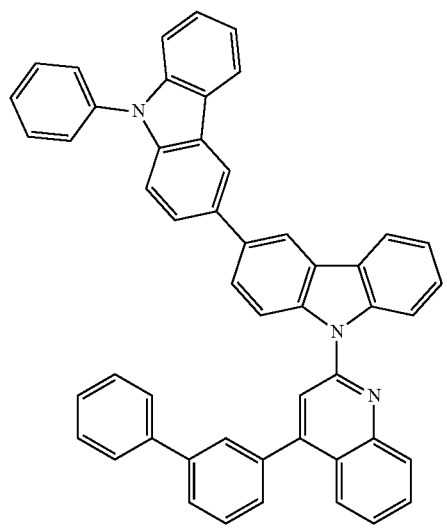
B-107
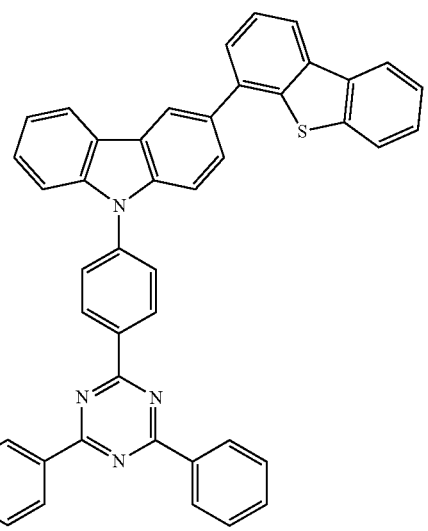
B-108
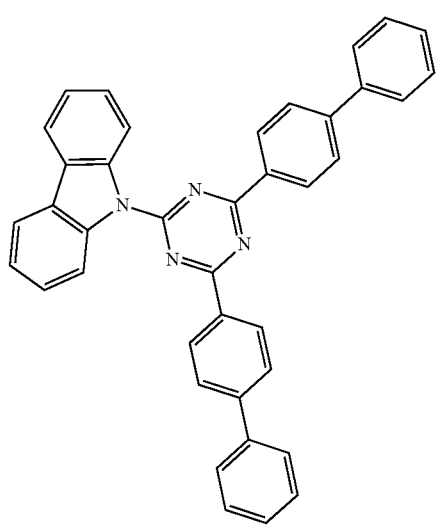
B-109
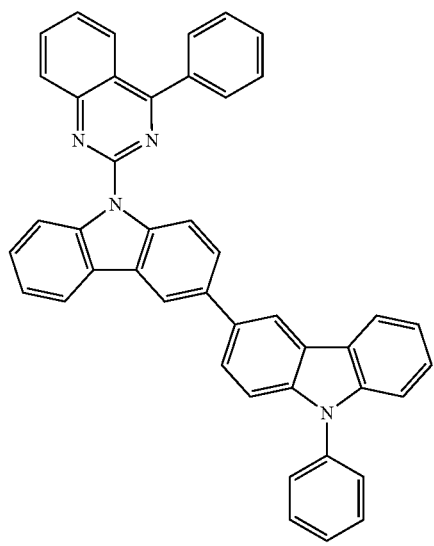

B-110
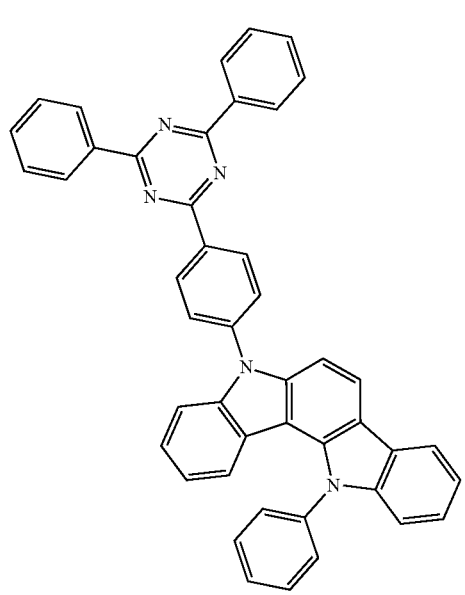
B-113
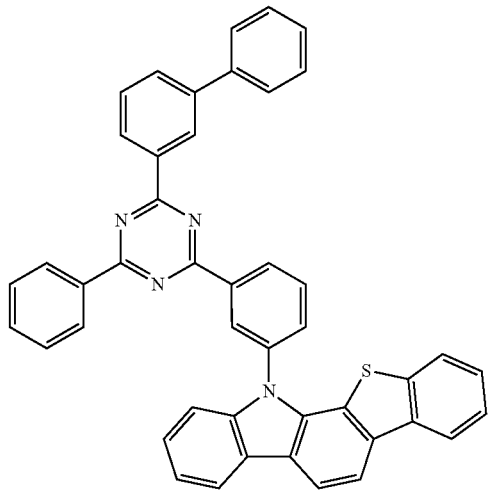
B-111
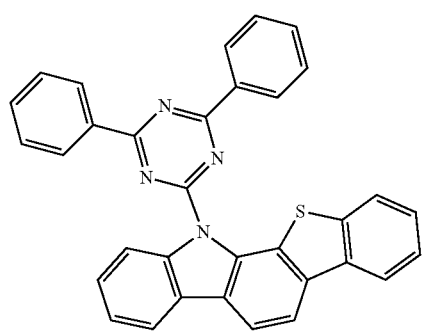
B-114
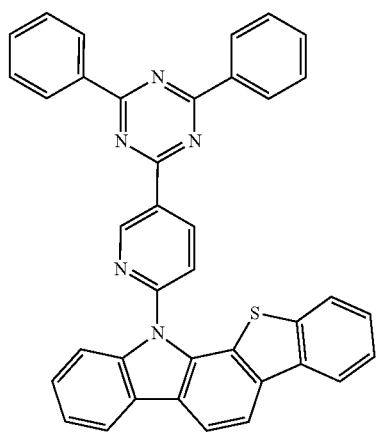
B-112
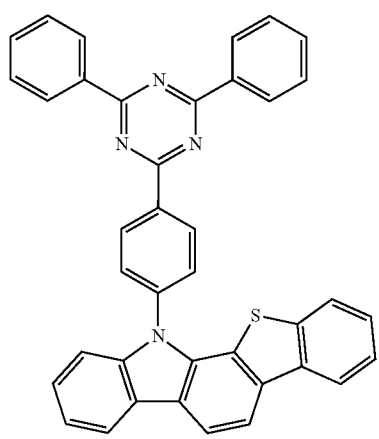
B-115
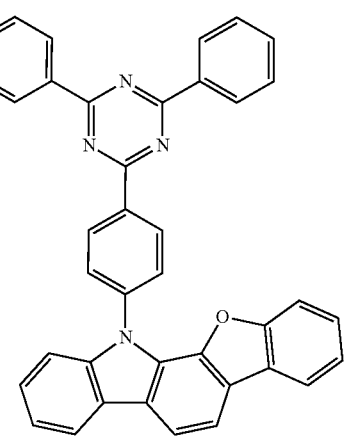

B-116
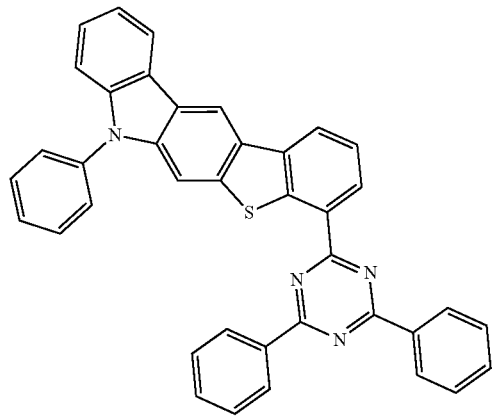
B-117
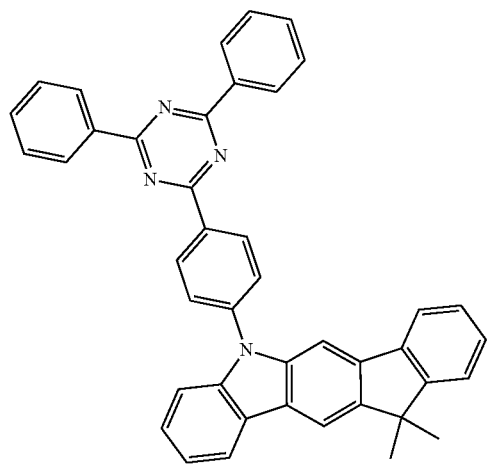
B-118
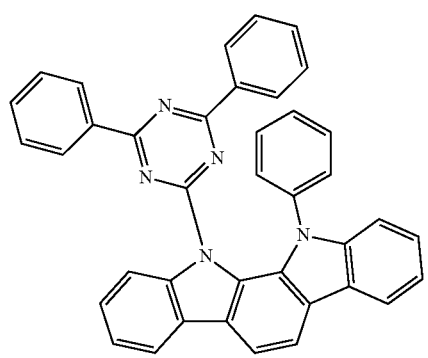
B-119
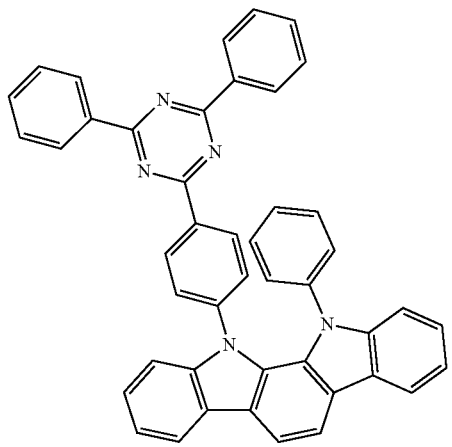
B-120
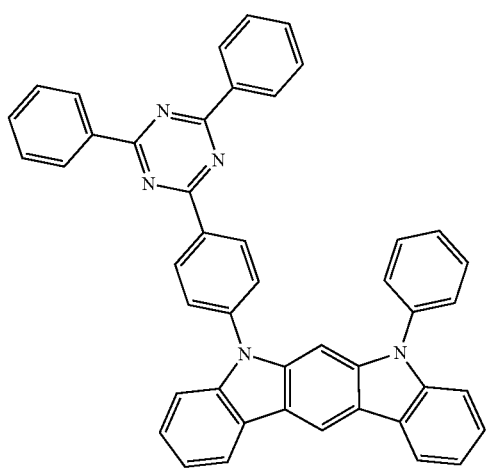
B-121
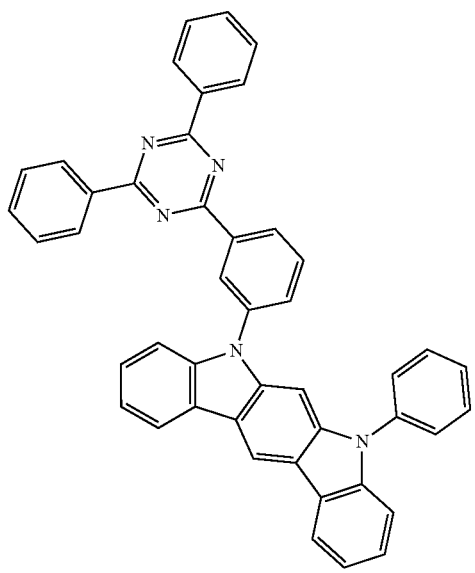

B-122
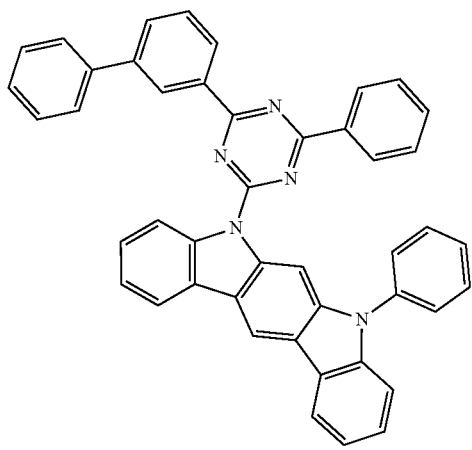
B-125
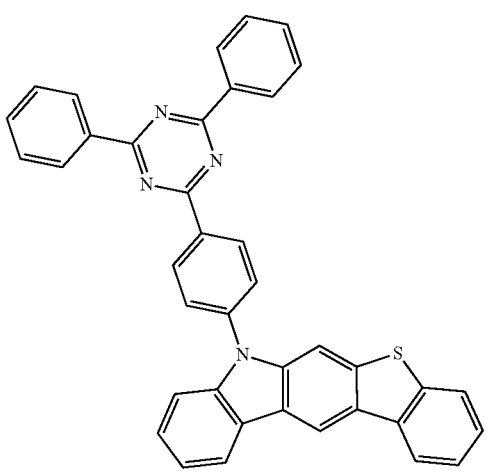
B-123
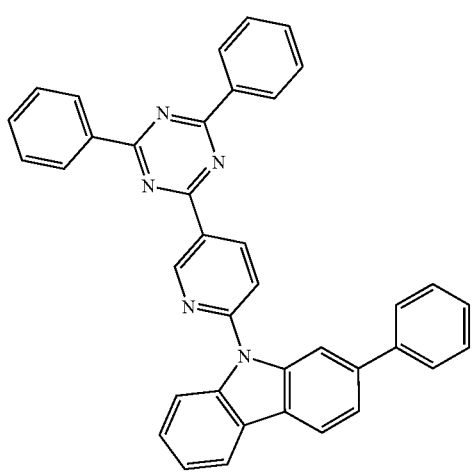
B-126
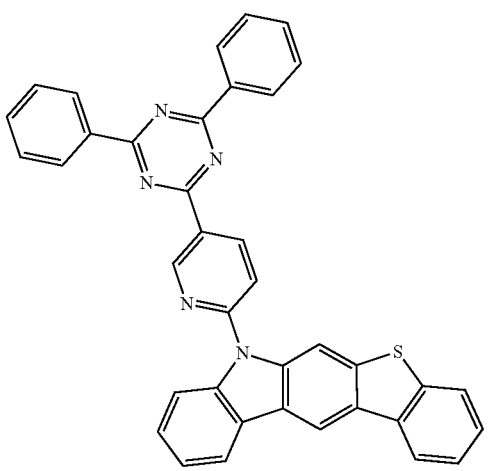
B-124
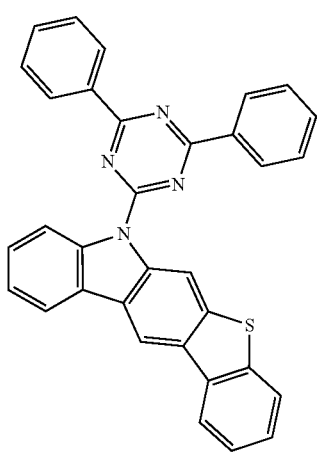
B-127
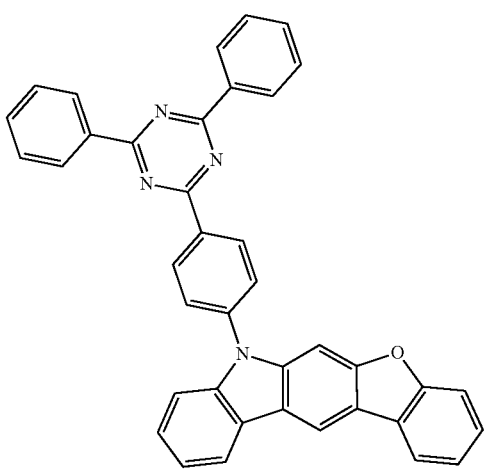

-continued
B-128
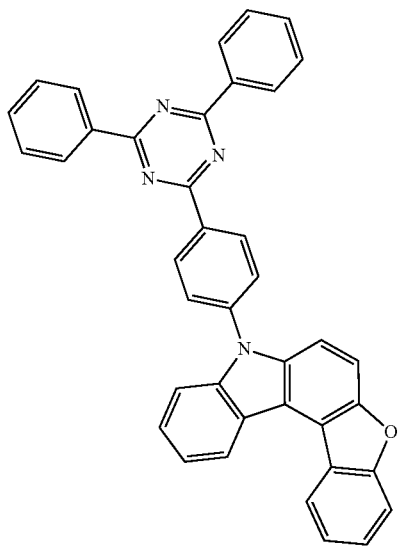
B-129
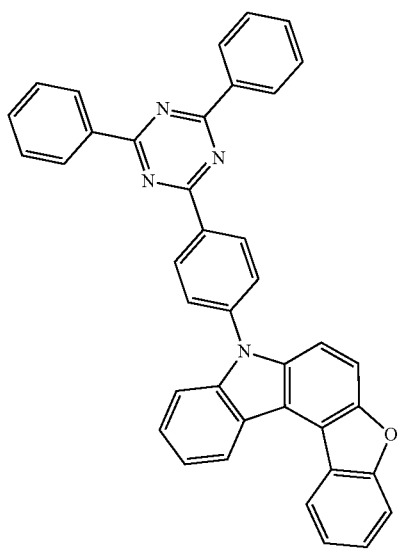
B-130
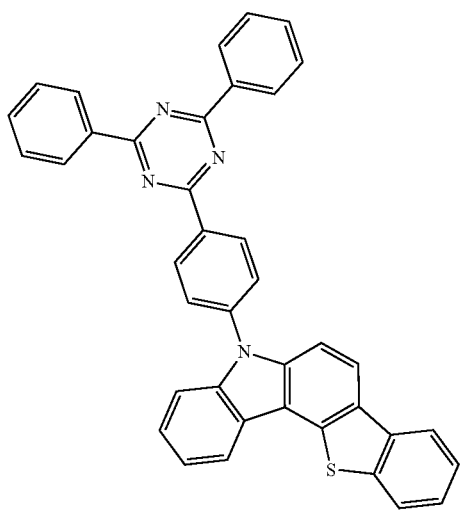
-continued
B-131
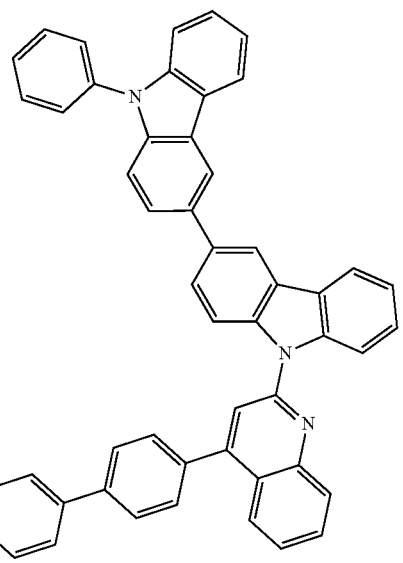
B-132
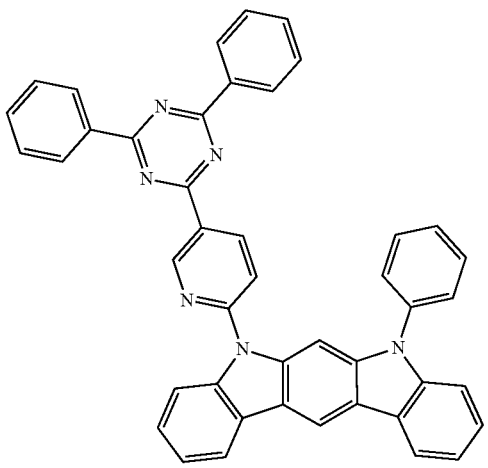
B-133
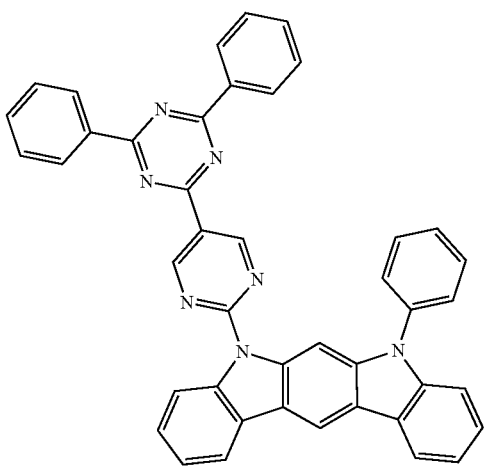

B-134
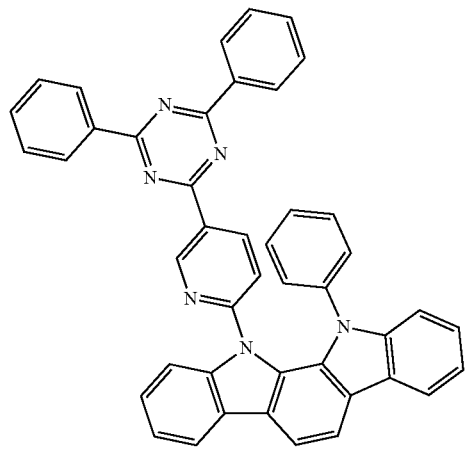
B-135
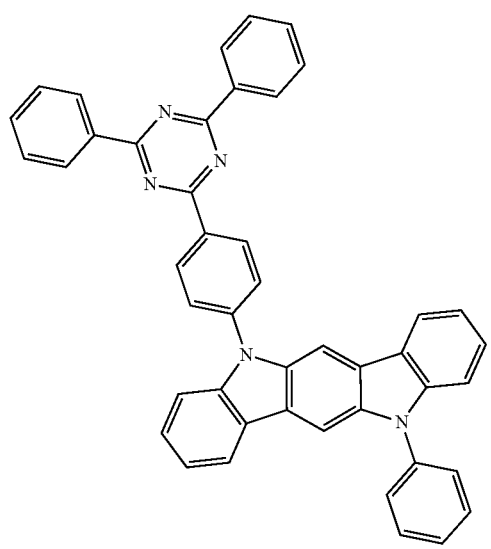
B-136
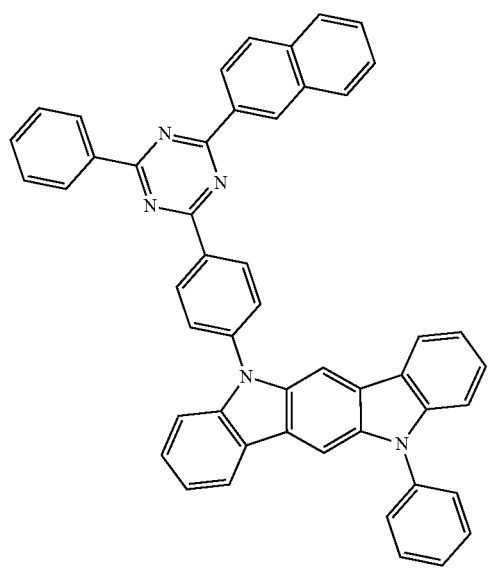
B-137
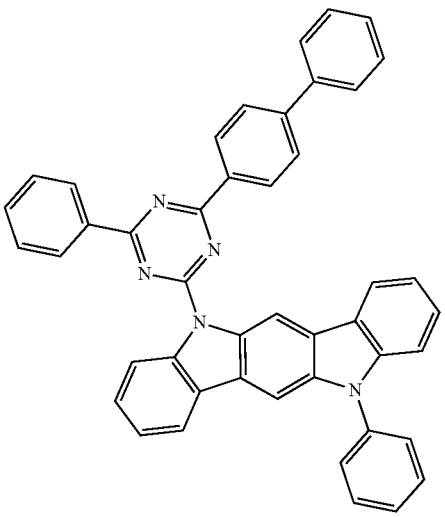
B-138
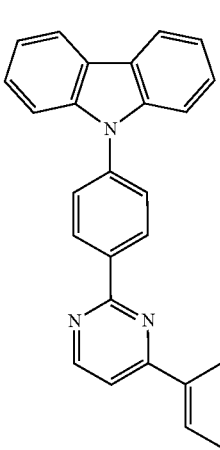
B-139
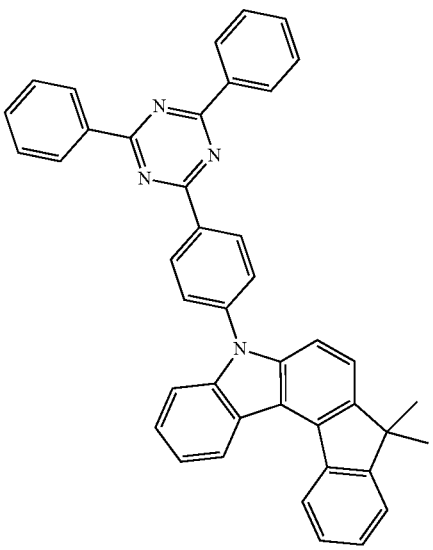

-continued
B-140
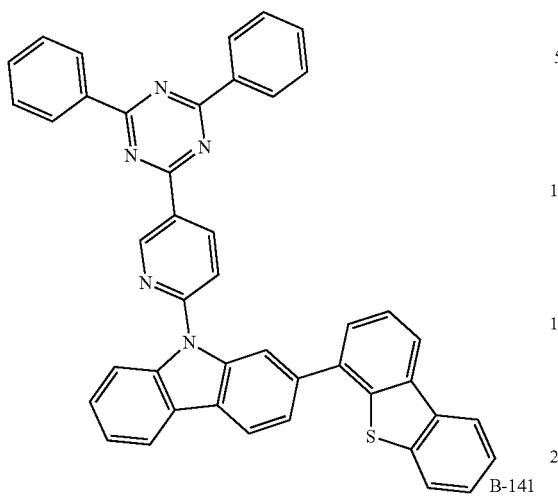
B-141
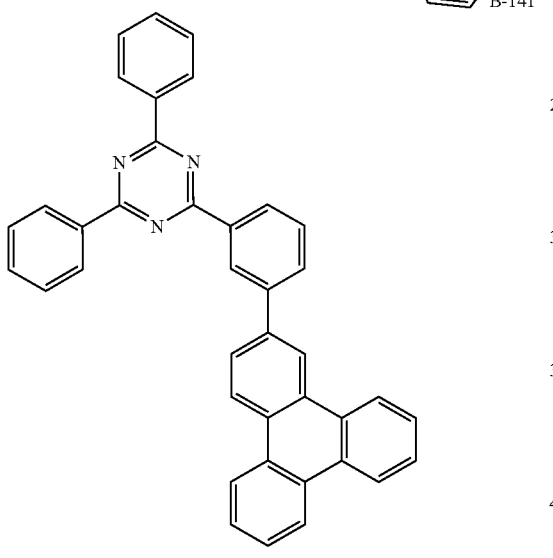
B-142
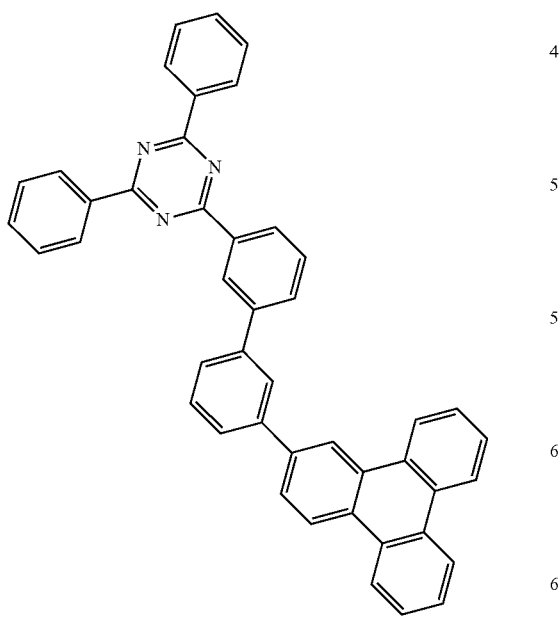
-continued
B-143
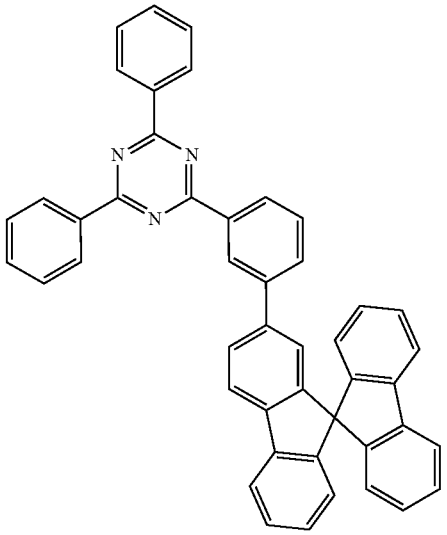
B-144
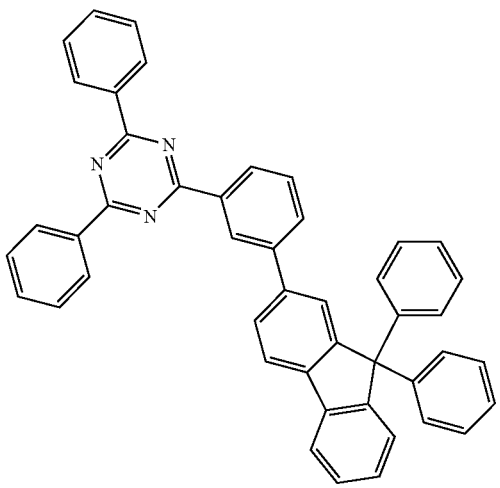
B-145
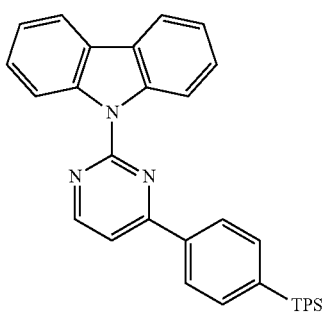

B-146
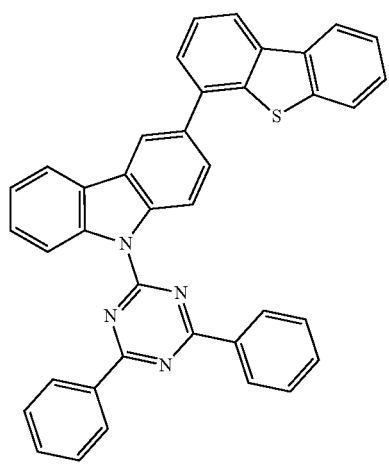
B-147
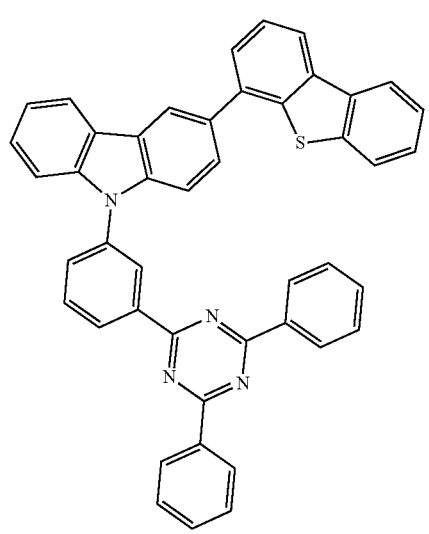
B-148
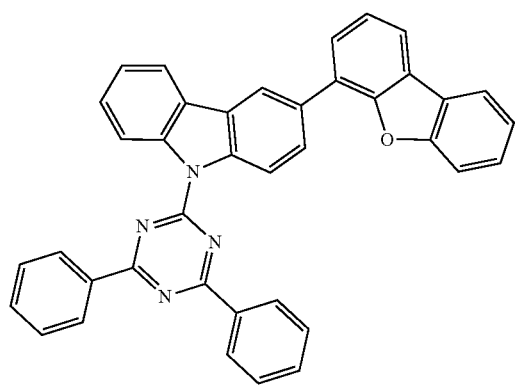
B-149
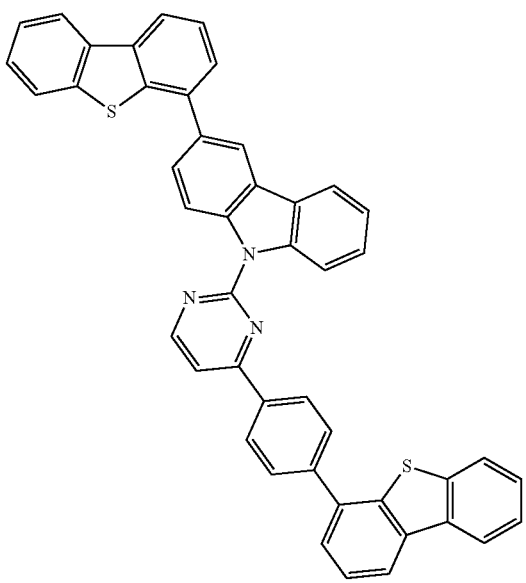
B-150
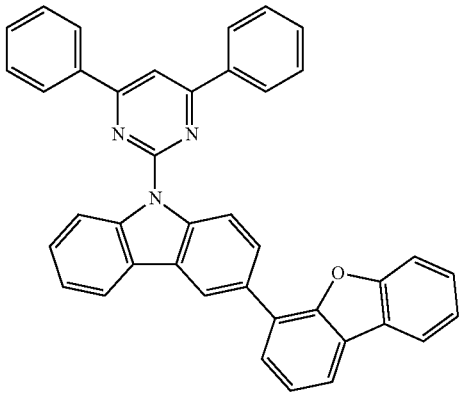
B-151
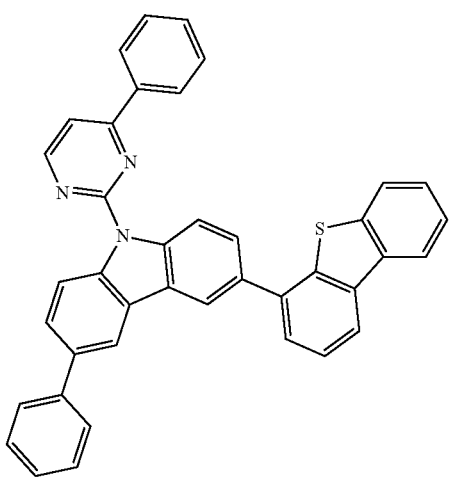

B-152
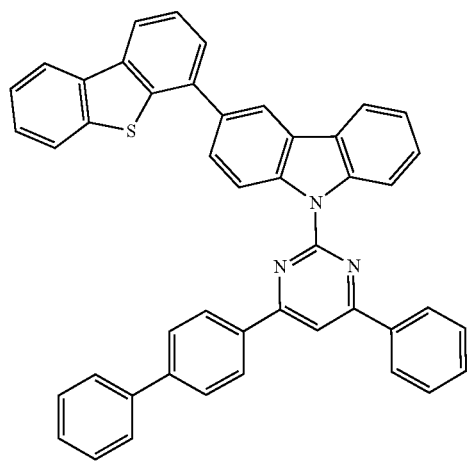
B-153
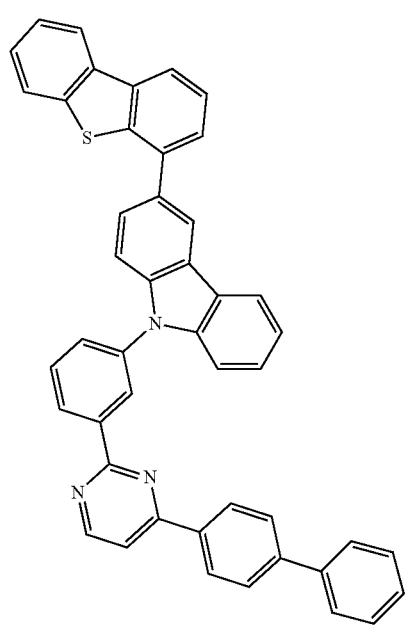
B-154
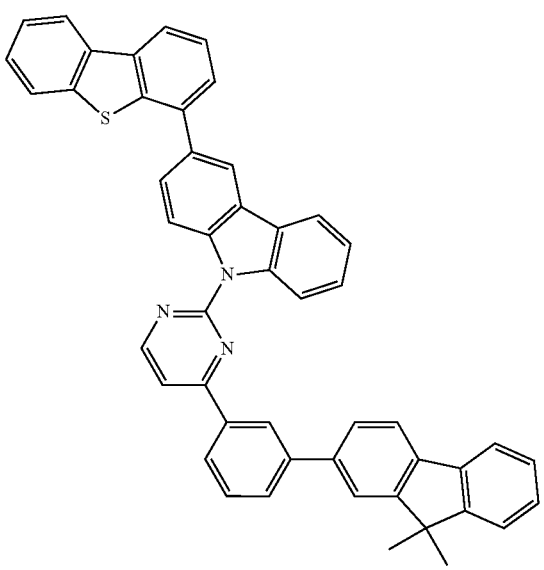
B-155
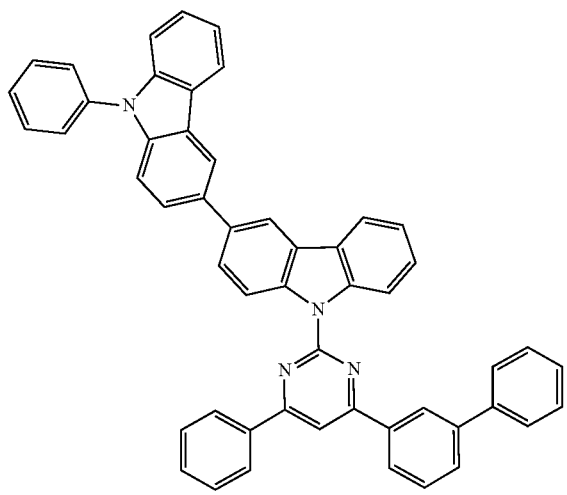
B-156
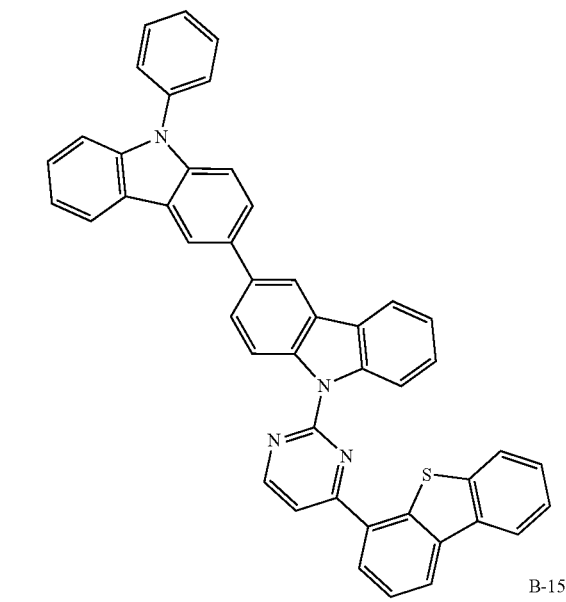
B-157
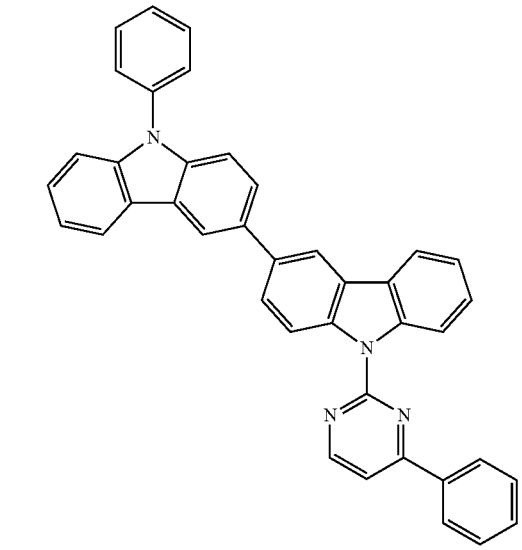

B-158
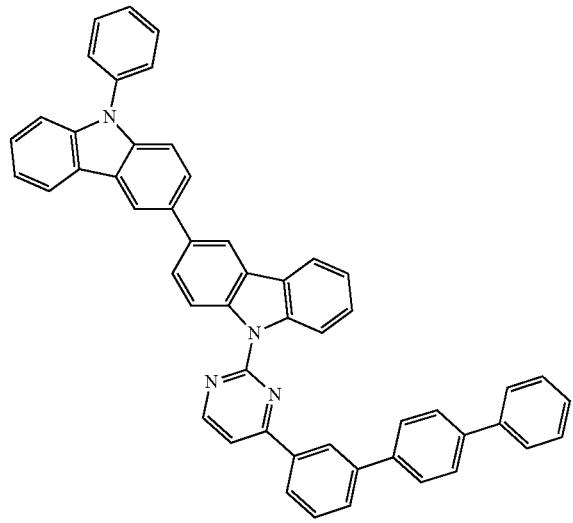
B-159
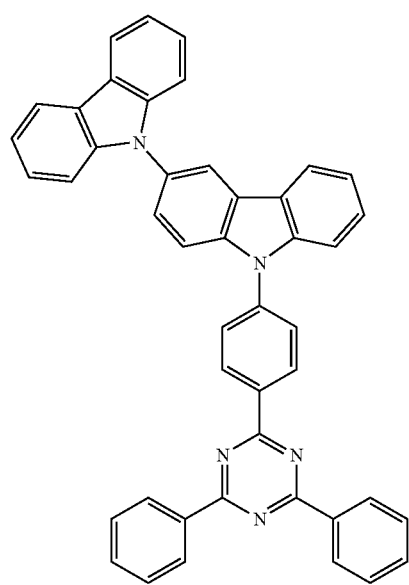
B-160
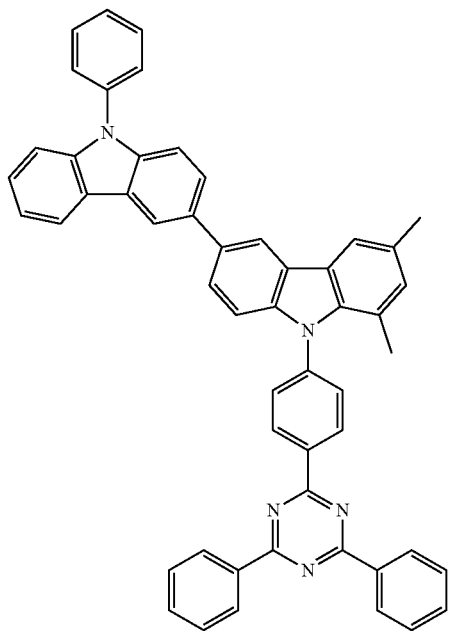
B-161
B-162
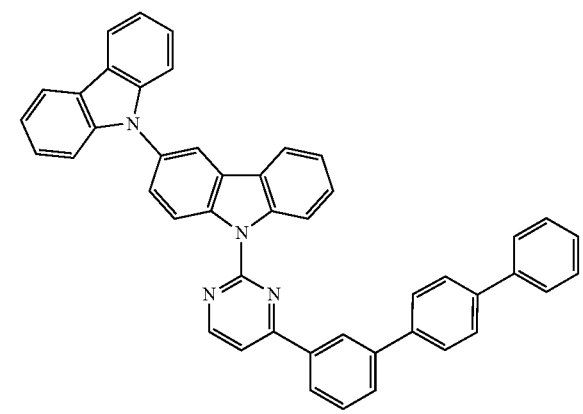

B-163
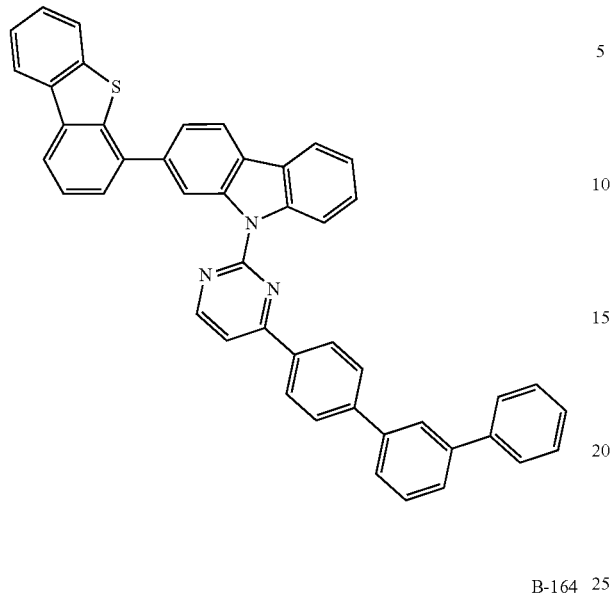
B-166
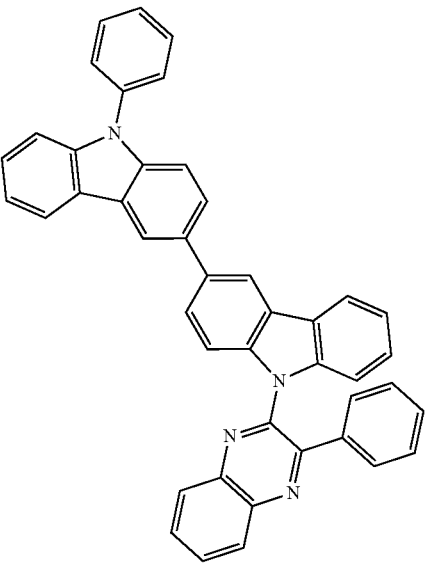
B-164
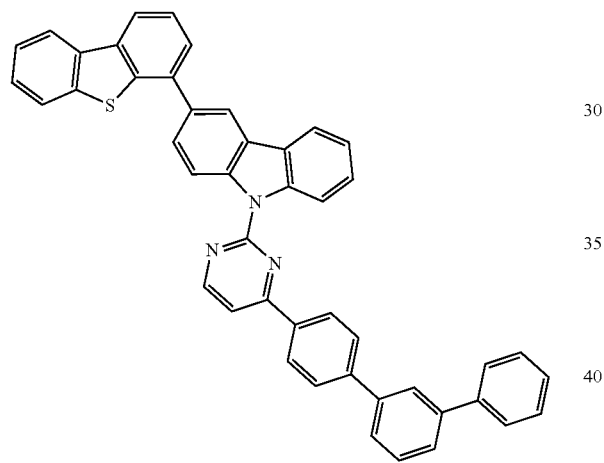
B-165
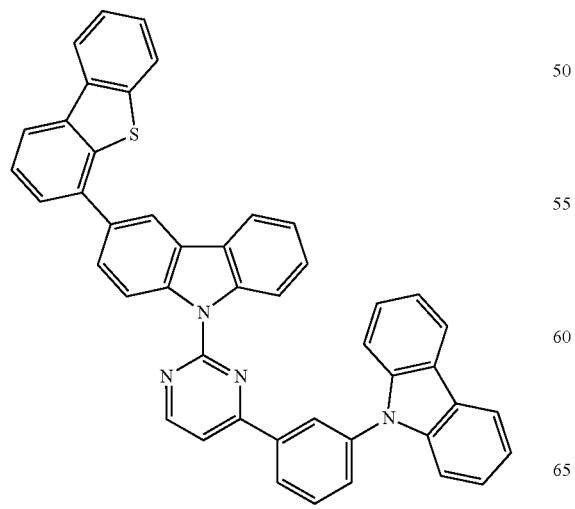
B-167
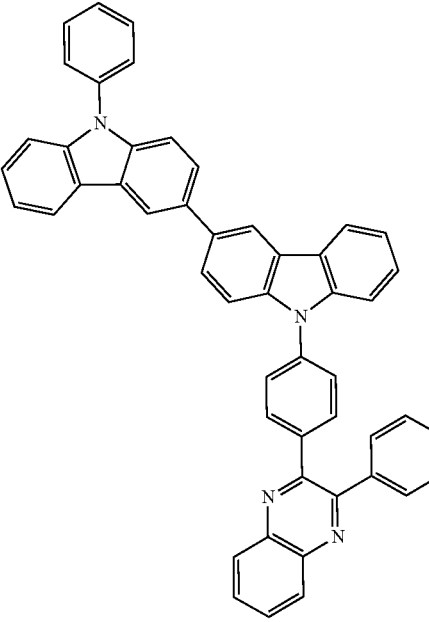

B-168
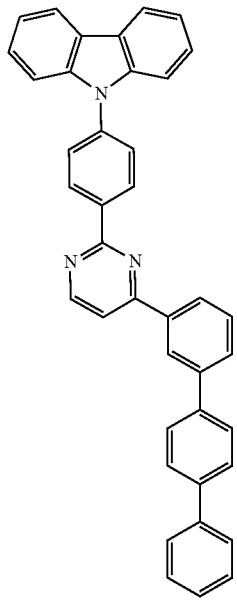
B-169
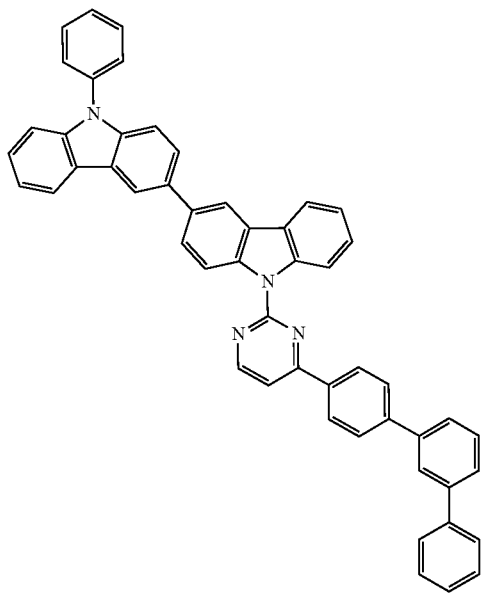
B-170
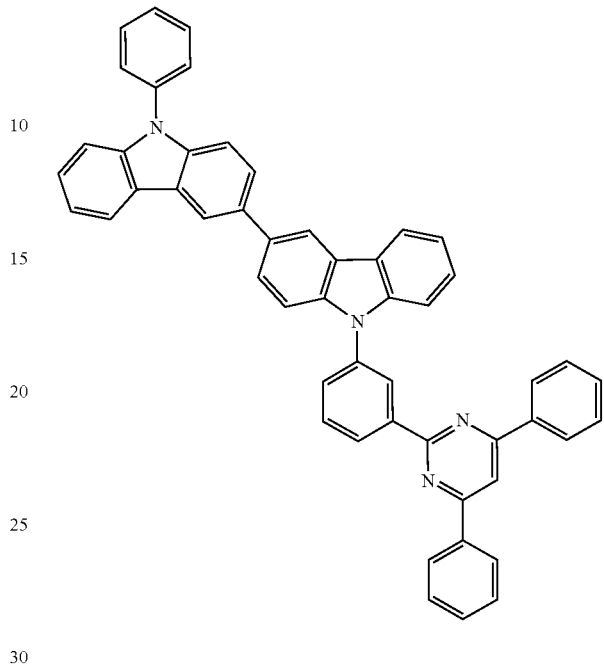
B-171
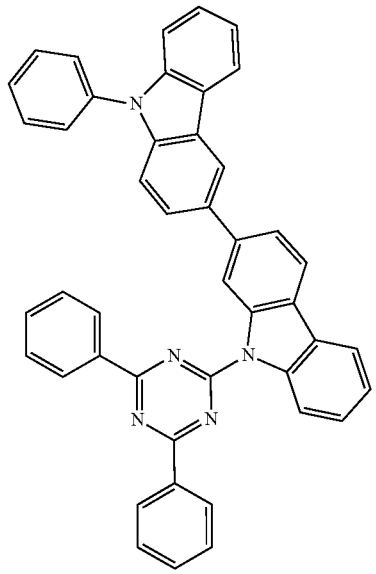

B-172
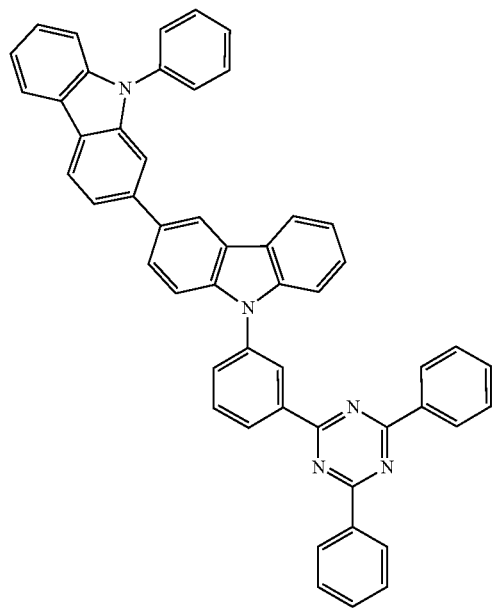
B-174
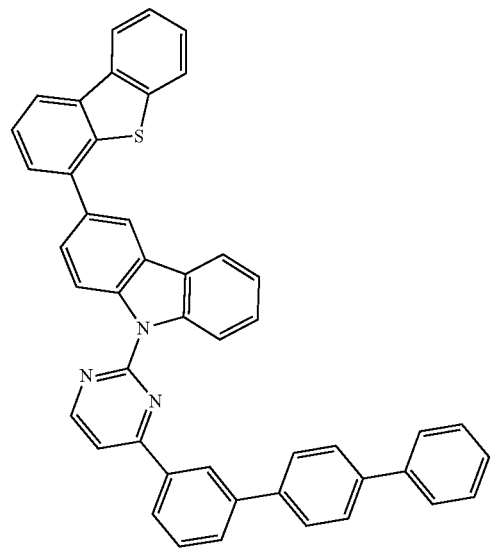
B-173
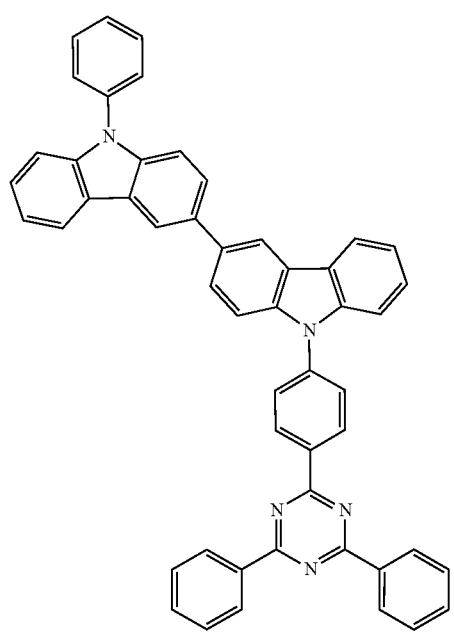
B-175
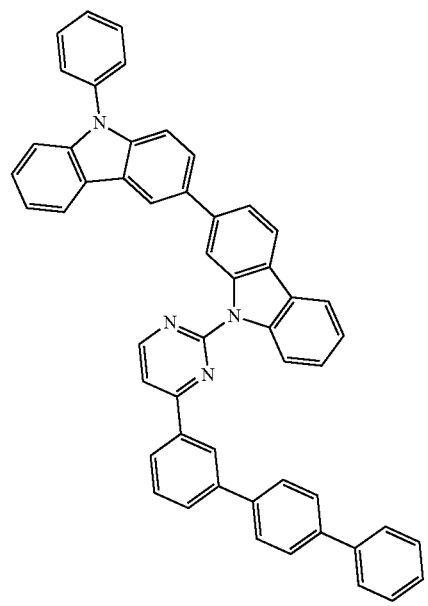

B-176
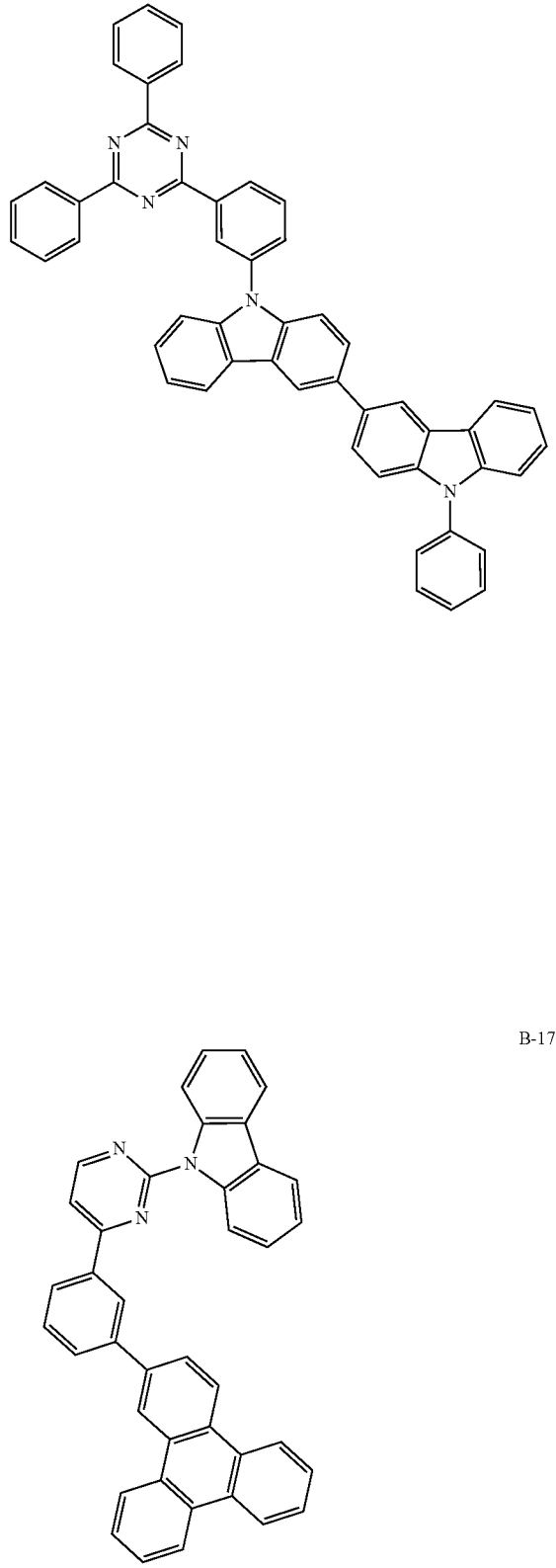
B-177
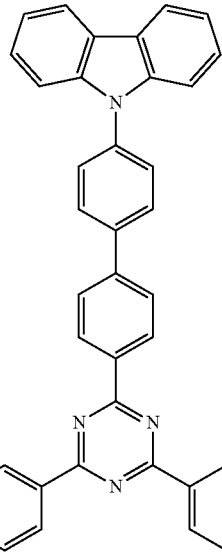
B-178
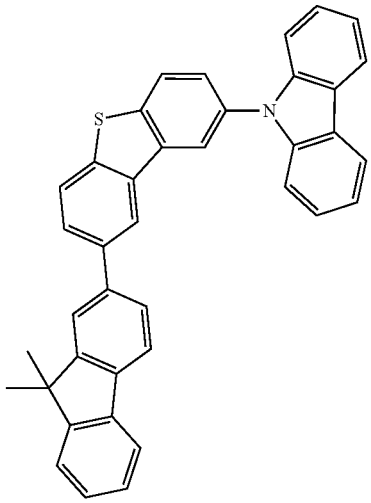
B-179
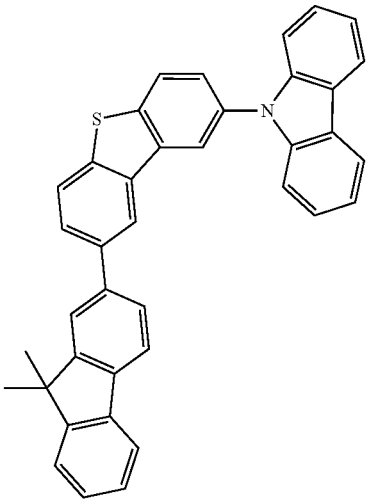
B-180
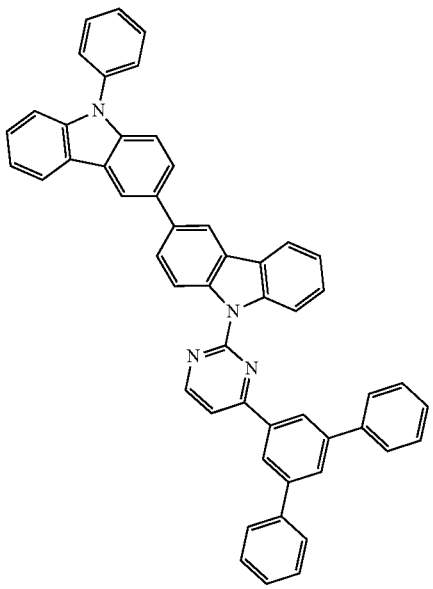

B-181
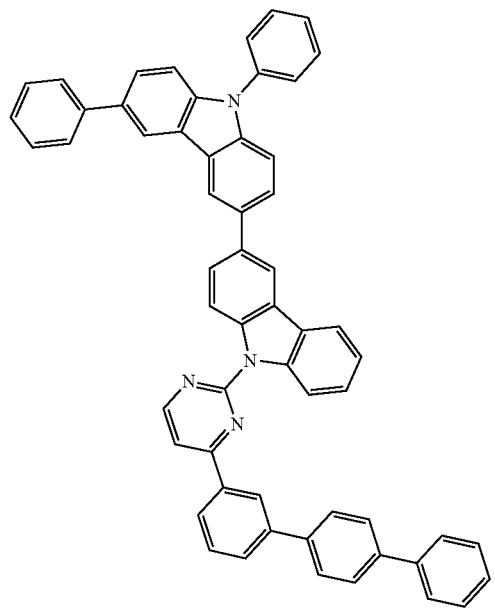
B-183
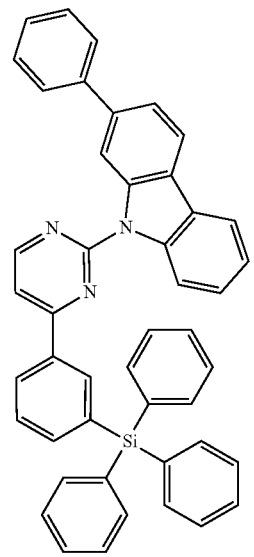
B-182
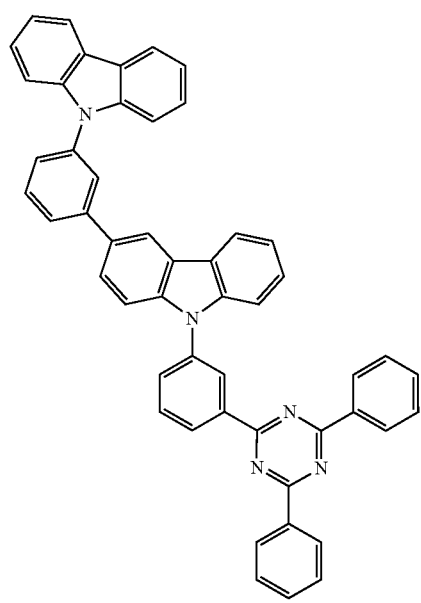
B-184
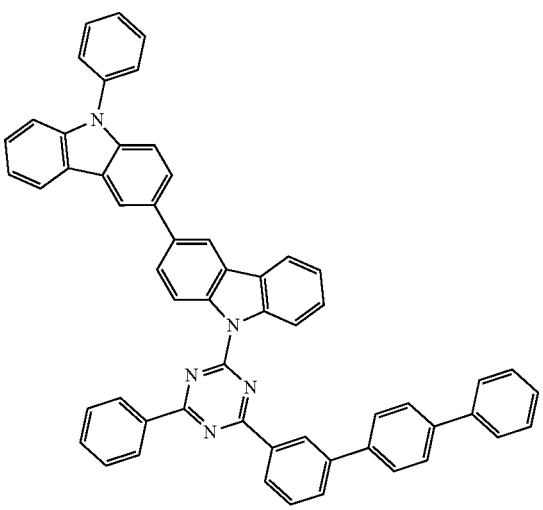

B-185
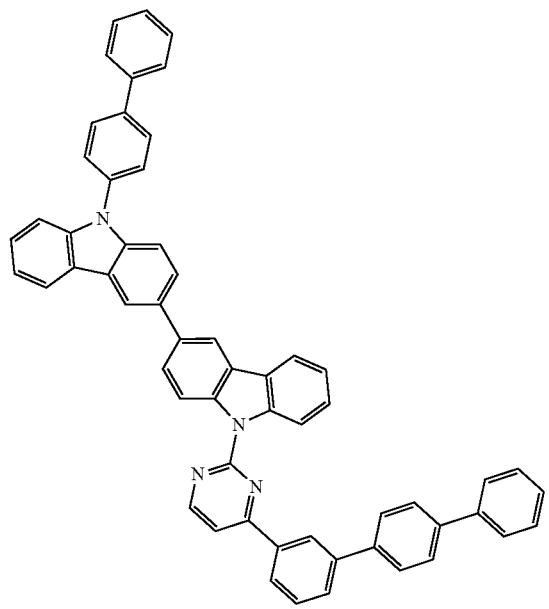
B-188
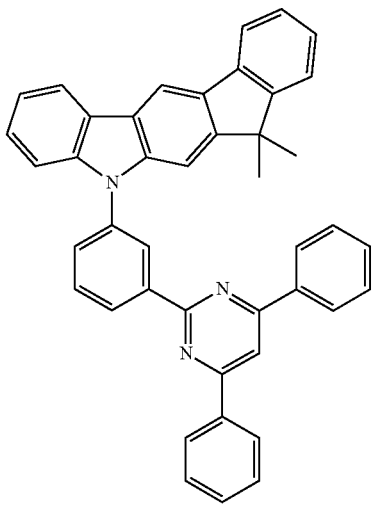
B-189
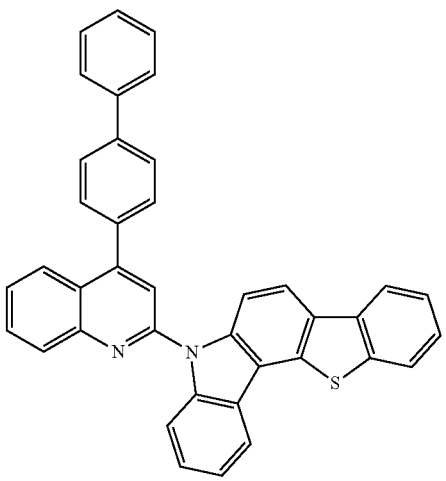
B-186
B-187
B-190
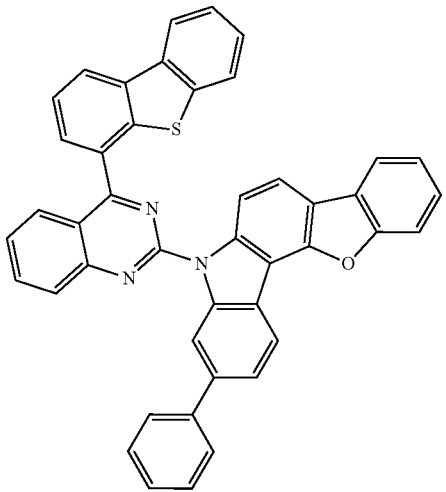

B-191
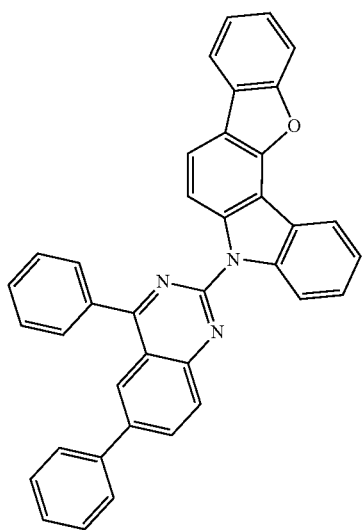
B-192
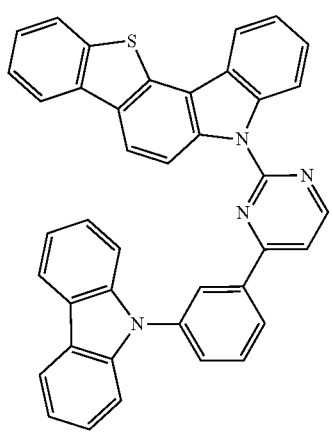
B-193
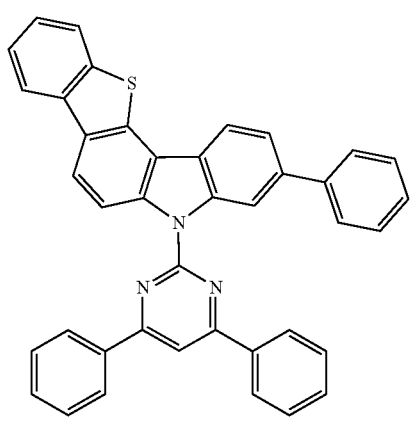
B-194
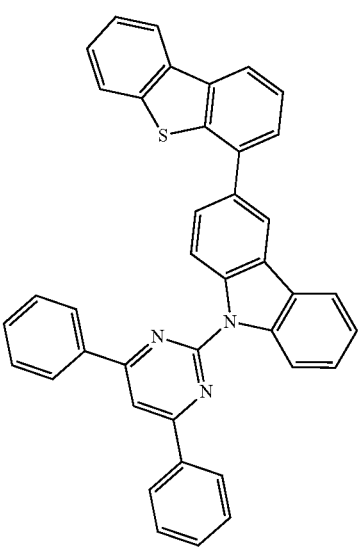
B-195
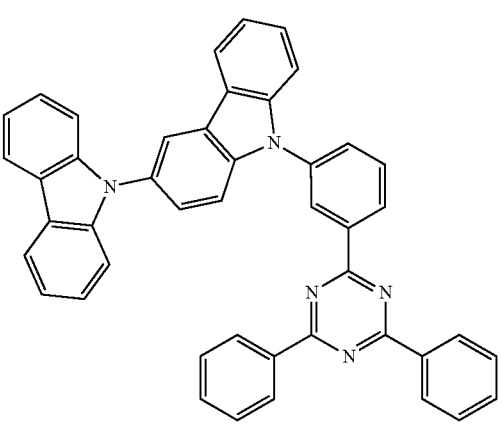
B-196
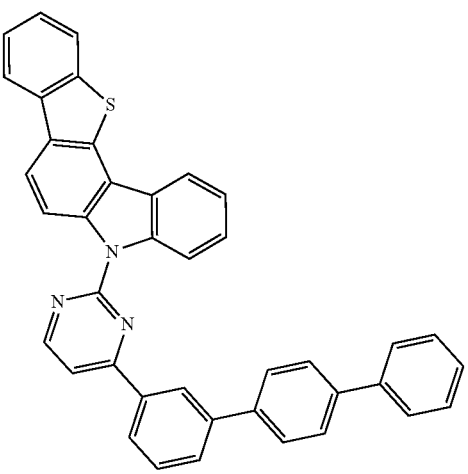

-continued
B-197
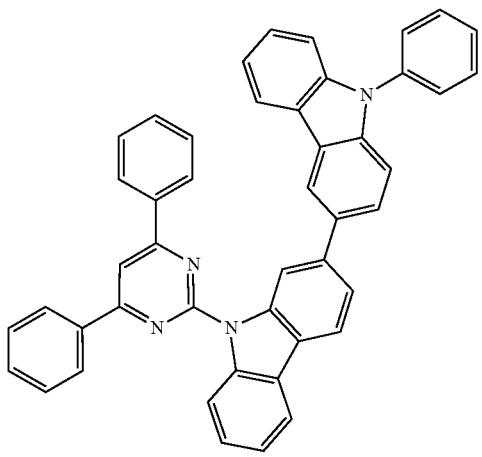
B-198
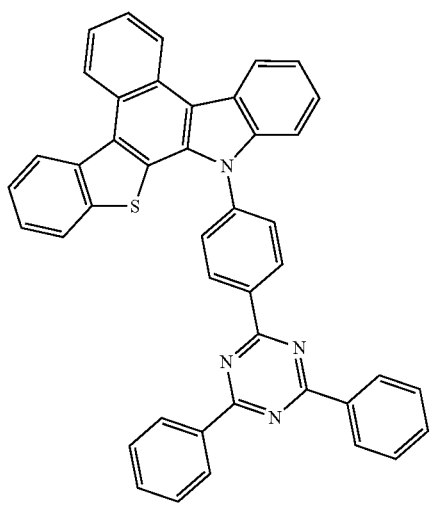
B-199
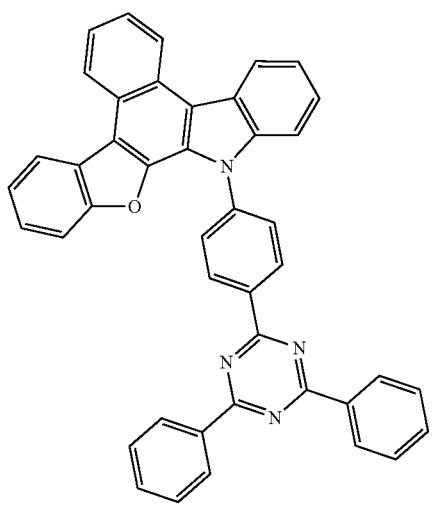
-continued
B-200
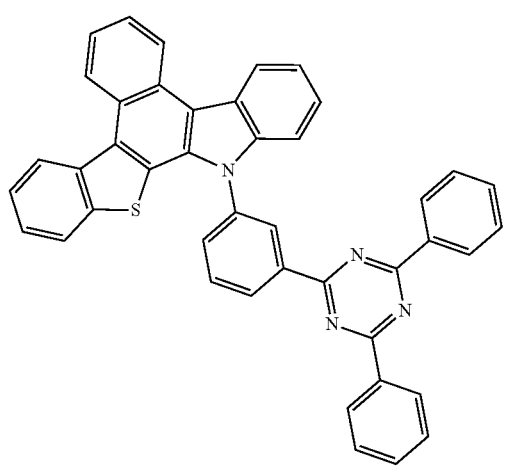
B-201
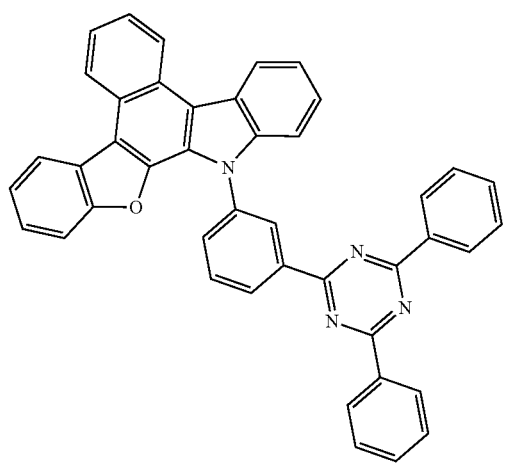
B-202
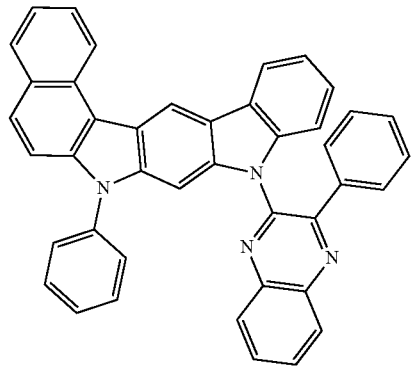

B-203
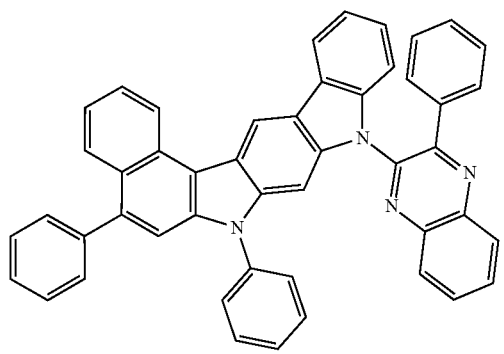
B-204
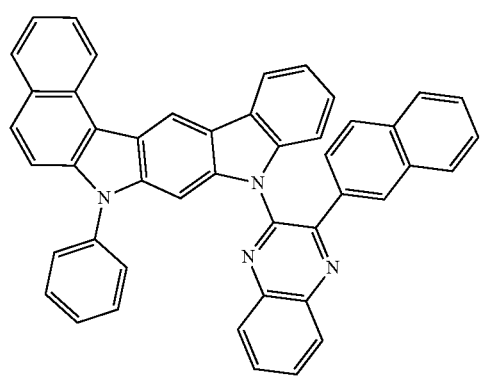
B-205
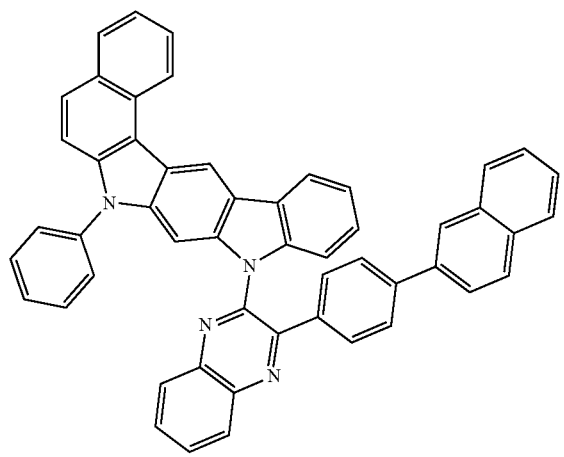
B-206
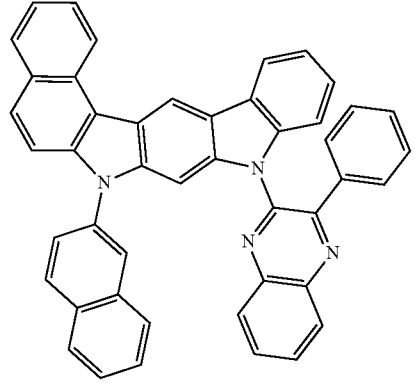
B-207
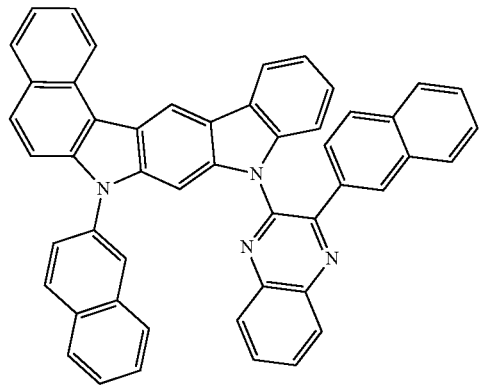
B-208
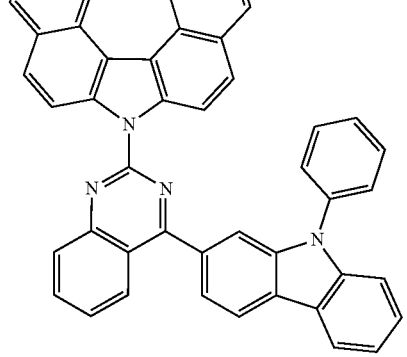
B-209
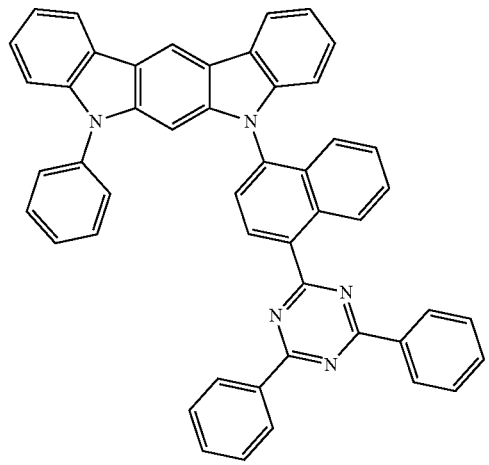

B-210
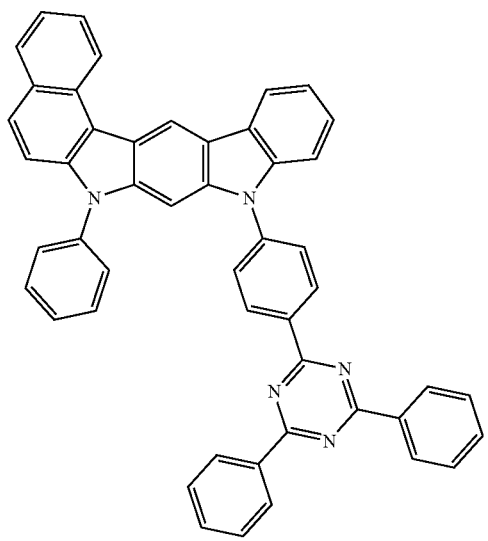
B-211
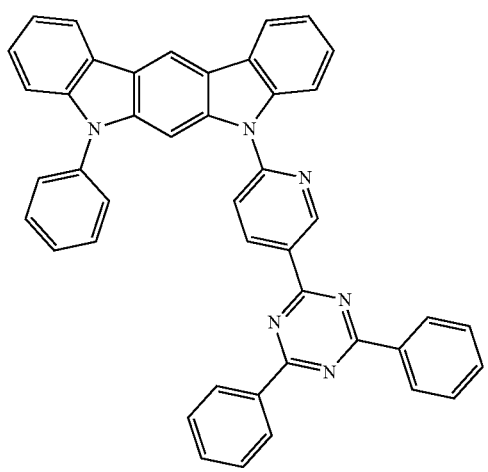
B-212
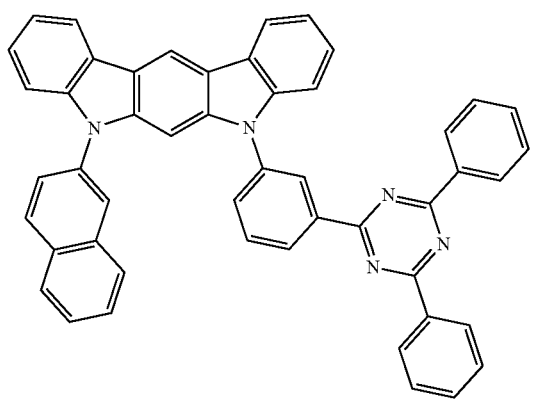
B-213
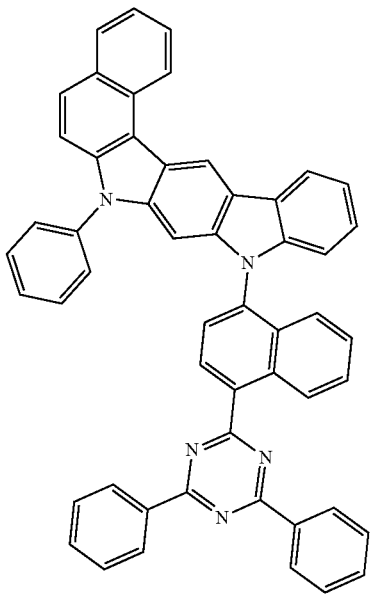
B-214
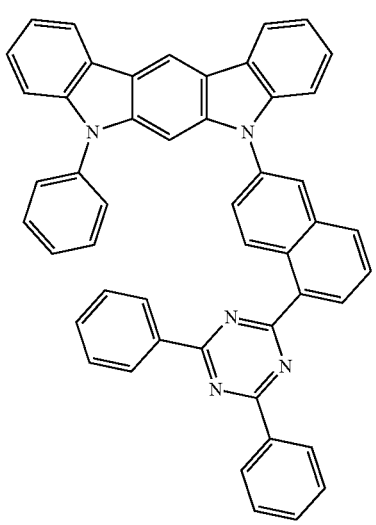
B-215
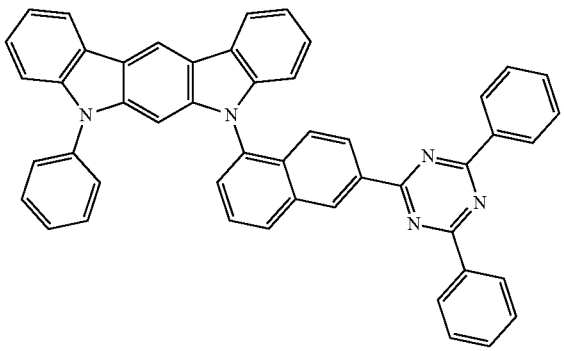

B-216 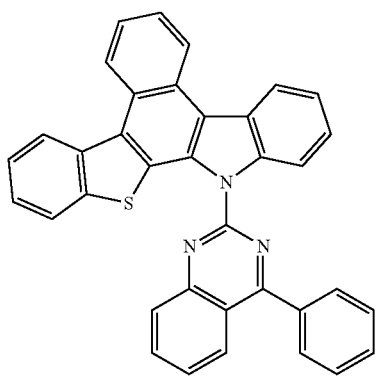
B-220 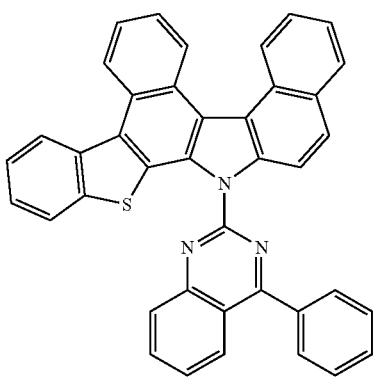
B-217 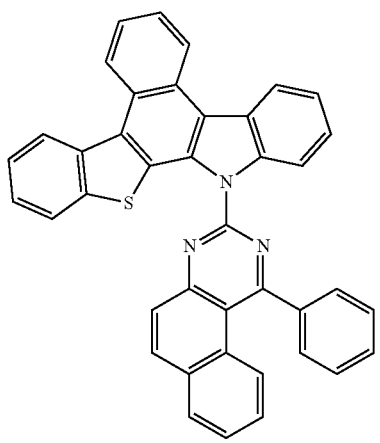
B-221 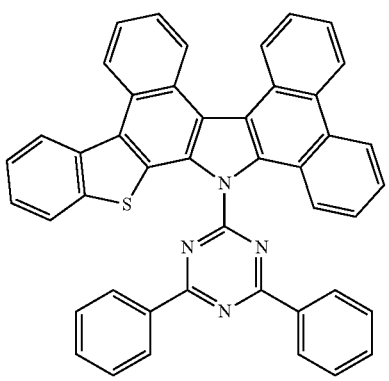
B-218 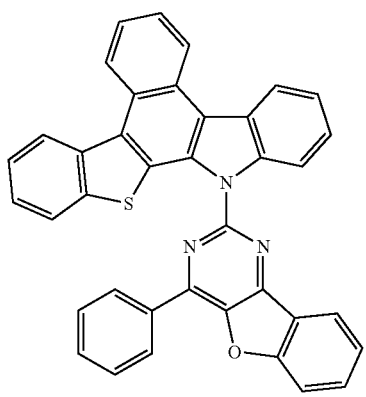
B-222 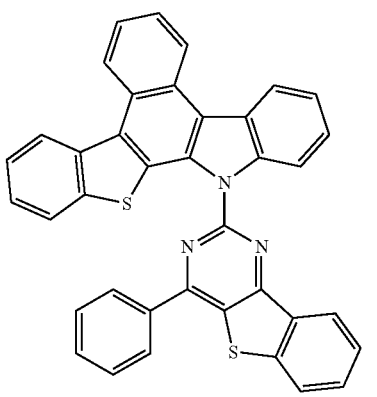
B-219 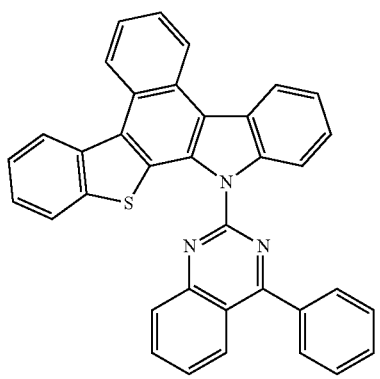
B-223 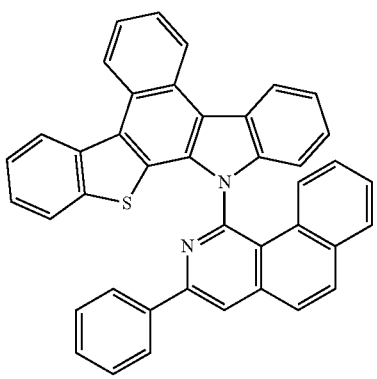

B-224
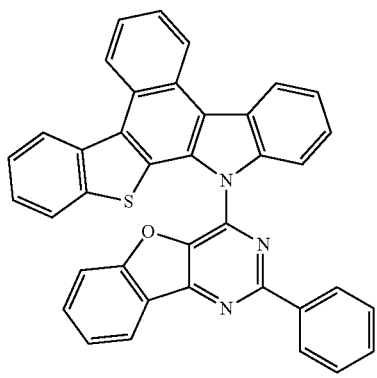
B-225
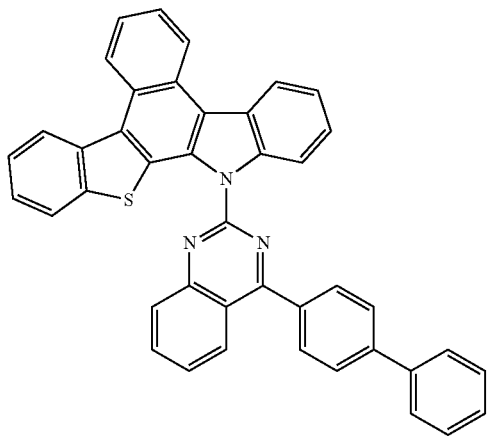
B-226
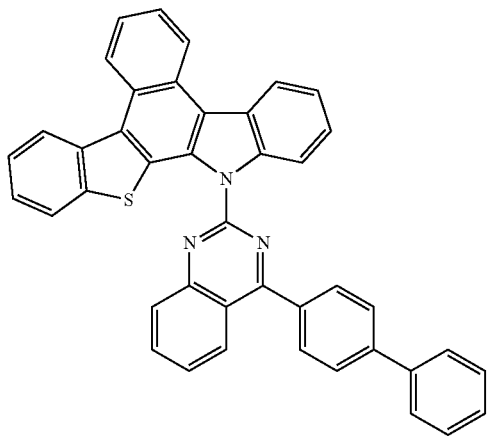
B-227
B-228
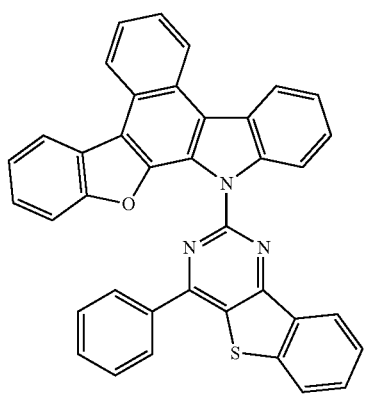
B-229
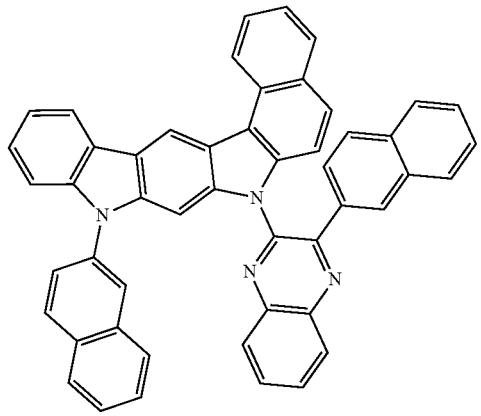
B-230
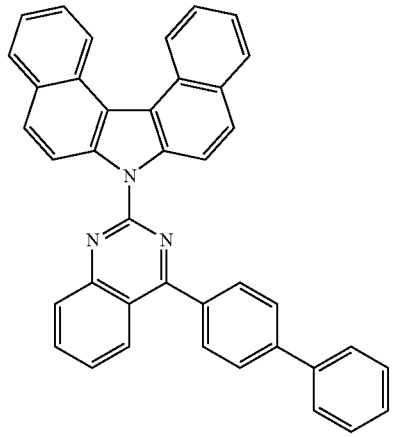
B-231
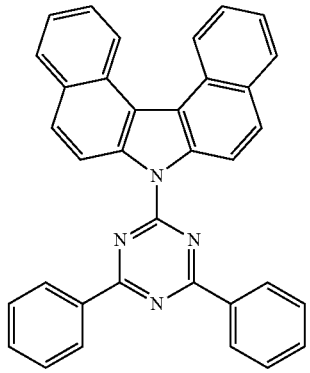

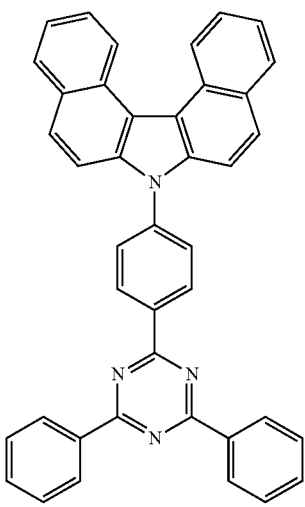

B-232

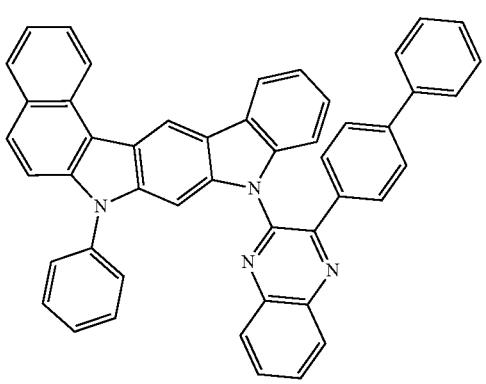

B-233

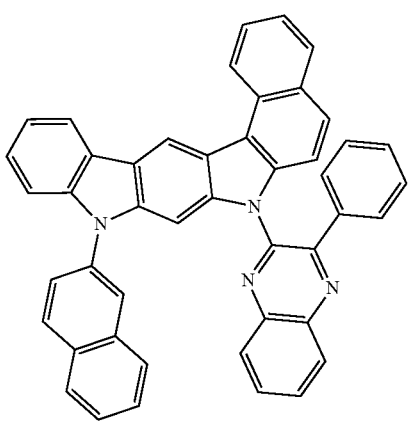

B-234

The compound represented by any one of formulas 11 to 13 of the present disclosure may be produced by a synthetic method known to one skilled in the art, but is not limited thereto.

The organic electroluminescent device of the present disclosure may comprise an anode, a cathode, and at least one organic layer between the two electrodes. The organic layer may comprise at least one light-emitting layer, and may further comprise at least one layer selected from a hole injection layer, a hole transport layer, a hole auxiliary layer, a light-emitting auxiliary layer, an electron transport layer, an electron buffer layer, an electron injection layer, an interlayer, a hole blocking layer, and an electron blocking layer.

The light-emitting layer is a layer from which light is emitted, and can be a single layer or a multi-layer of which two or more layers are stacked. In the light-emitting layer, it is preferable that the doping concentration of a dopant compound with respect to a host compound is less than 20 wt %.

The light-emitting auxiliary layer may be placed between the anode and the light-emitting layer, or between the cathode and the light-emitting layer. When the light-emitting auxiliary layer is placed between the anode and the light-emitting layer, it can be used for promoting the hole injection and/or the hole transport, or for preventing the overflow of electrons. When the light-emitting auxiliary layer is placed between the cathode and the light-emitting layer, it can be used for promoting the electron injection and/or the electron transport, or for preventing the overflow of holes. Also, the hole auxiliary layer may be placed between the hole transport layer (or hole injection layer) and the light-emitting layer, and may be effective to promote or block the hole transport rate (or the hole injection rate), thereby enabling the charge balance to be controlled. In addition, the electron blocking layer may be placed between the hole transport layer (or hole injection layer) and the light-emitting layer, and may block overflowing electrons from the light-emitting layer and confine the excitons in the light-emitting layer to prevent light leakage. When an organic electroluminescent device includes two or more hole transport layers, the hole transport layer, which is further included, may be used as a hole auxiliary layer or an electron blocking layer. The light-emitting auxiliary layer, the hole auxiliary layer or the electron blocking layer may have an effect of improving the efficiency and/or the lifespan of the organic electroluminescent device.

According to one embodiment of the present disclosure, an organic layer comprising a combination of at least one compound comprising ligand $L_1$ represented by formula 1, and at least one compound represented by any one of formulas 11 to 13 is provided. The organic layer may be a single layer or a plurality of layers, and the compound comprising ligand $L_1$ represented by formula 1 and the compound represented by any one of formulas 11 to 13 may be comprised in the same layer or different layers, respectively. Also, the present disclosure provides an organic electroluminescent device comprising the organic layer.

According to another embodiment of the present disclosure, an organic electroluminescent device comprising at least one dopant compound comprising ligand $L_1$ represented by formula 1 is provided.

According to a further embodiment of the present disclosure, an organic electroluminescent material comprising at least one compound comprising ligand $L_1$ represented by formula 1, and an organic electroluminescent device comprising the material are provided. The material may consist of only the compound comprising ligand $L_1$ represented by formula 1, and may further comprise conventional materials comprised in an organic electroluminescent material.

Also, the organic electroluminescent device of the present disclosure may comprise the compound comprising ligand $L_1$ represented by formula 1, and further comprise at least one compound selected from the group consisting of arylamine-based compounds and styrylarylamine-based compounds.

In addition, in the organic electroluminescent device of the present disclosure, the organic layer may further comprise at least one metal selected from the group consisting of metals of Group 1, metals of Group 2, transition metals of the 4th period, transition metals of the $5^{th}$ period, lanthanides and organic metals of d-transition elements of the Periodic Table, or at least one complex compound comprising said metal, besides the compound comprising ligand $L_1$ represented by formula 1. Further, the organic layer may further comprise a light-emitting layer and a charge generating layer.

Further, the organic electroluminescent device of the present disclosure may emit white light by further including at least one light-emitting layer containing a blue, red or green light-emitting compound, which are known in the art. Also, it may further comprise a yellow or orange light-emitting layer, if necessary.

In the organic electroluminescent device of the present disclosure, at least one layer selected from a chalcogenide layer, a metal halide layer and a metal oxide layer (hereinafter, "a surface layer") may be preferably placed on an inner surface(s) of one or both electrodes. Specifically, a chalcogenide (including oxides) layer of silicon or aluminum is preferably placed on an anode surface of an electroluminescent medium layer, and a metal halide layer or a metal oxide layer is preferably placed on a cathode surface of an electroluminescent medium layer. Such a surface layer may provide operation stability for the organic electroluminescent device. Preferably, the chalcogenide includes $SiO_X$ ($1 \leq X \leq 2$), $AlO_X$ ($1 \leq X \leq 1.5$), SiON, SiAlON, etc.; the metal halide includes LiF, $MgF_2$, $CaF_2$, a rare earth metal fluoride, etc.; and the metal oxide includes $Cs_2O$, $Li_2O$, MgO, SrO, BaO, CaO, etc.

In the organic electroluminescent device of the present disclosure, a mixed region of an electron transport compound and a reductive dopant, or a mixed region of a hole transport compound and an oxidative dopant is preferably placed on at least one surface of a pair of electrodes. In this case, the electron transport compound is reduced to an anion, and thus it becomes easier to inject and transport electrons from the mixed region to an electroluminescent medium. Further, the hole transport compound is oxidized to a cation, and thus it becomes easier to inject and transport holes from the mixed region to the electroluminescent medium. Preferably, the oxidative dopant includes various Lewis acids and acceptor compounds; and the reductive dopant includes alkali metals, alkali metal compounds, alkaline earth metals, rare-earth metals, and mixtures thereof. A reductive dopant layer may be employed as a charge-generating layer to prepare an organic electroluminescent device having two or more light-emitting layers and emitting white light.

In order to form each layer of the organic electroluminescent device of the present disclosure, dry film-forming methods such as vacuum evaporation, sputtering, plasma and ion plating methods, or wet film-forming methods such as ink jet printing, nozzle printing, slot coating, spin coating, dip coating, and flow coating methods may be used. The dopant and host compounds of the present disclosure may be co-evaporated or mixture-evaporated.

When using a wet film-forming method, a thin film may be formed by dissolving or diffusing materials forming each layer into any suitable solvent such as ethanol, chloroform, tetrahydrofuran, dioxane, etc. The solvent may be any solvent where the materials forming each layer can be dissolved or diffused, and where there are no problems in film-formation capability.

The co-evaporation is a mixed deposition method in which two or more isomer materials are placed in a respective individual crucible source and a current is applied to both cells at the same time to evaporate the materials. The mixture-evaporation is a mixed deposition method in which two or more isomer materials are mixed in one crucible source before evaporating them, and a current is applied to the cell to evaporate the materials.

A display system or a lighting system can be produced by using the organic electroluminescent device of the present disclosure.

Hereinafter, the synthesis method of the compound according to the present disclosure will be explained in detail. However, the present disclosure is not limited by the following examples.

Example 1: Preparation of Compound C-2

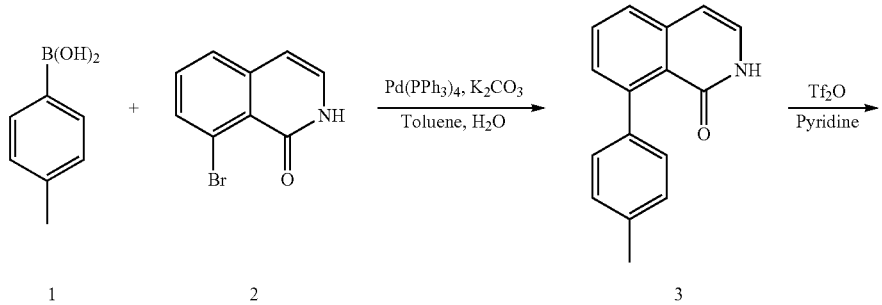

-continued

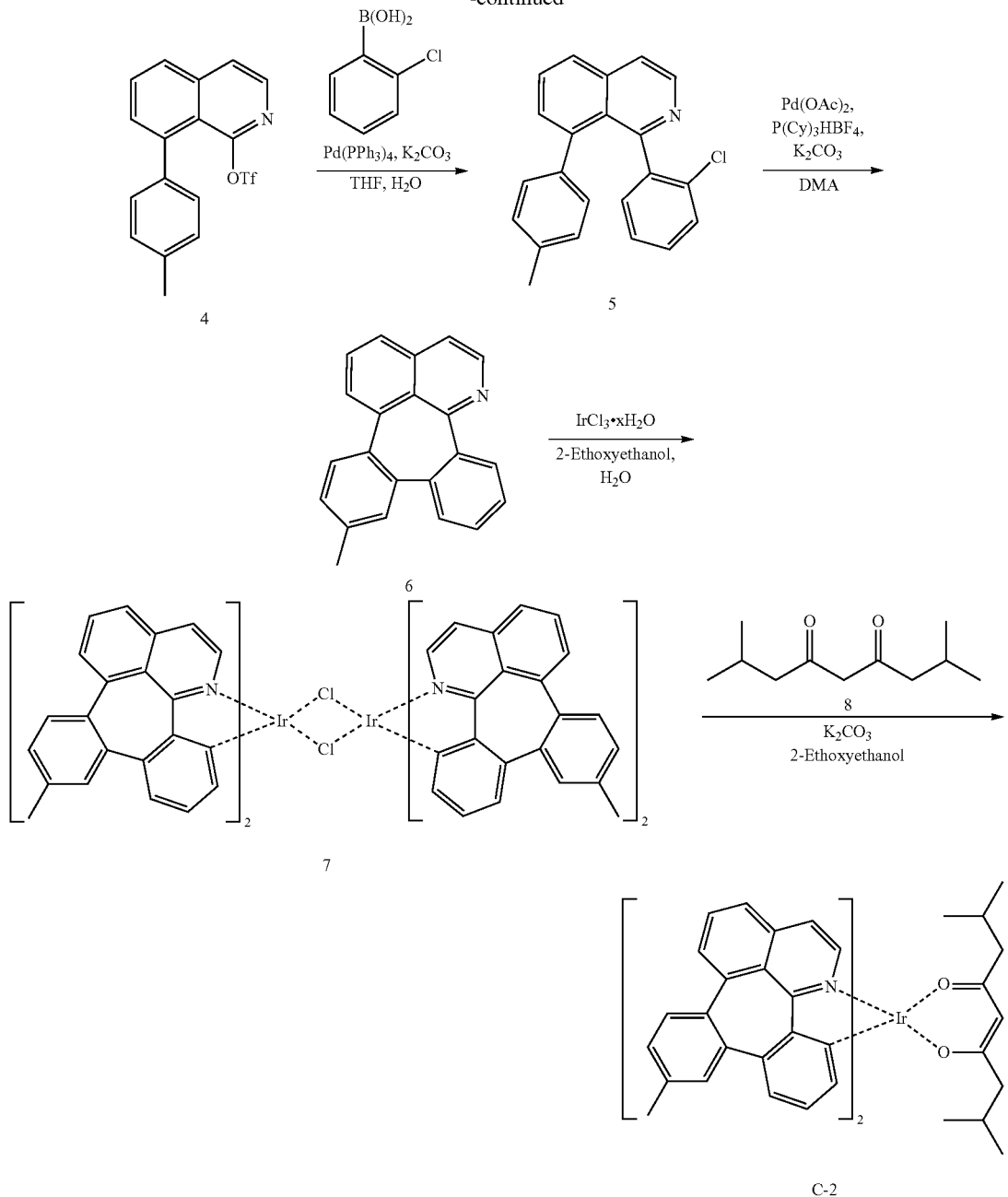

Synthesis of Compound 3

60 g of compound 1 (267 mmol), 65 g of compound 2 (242 mmol), 16 g of Pd(PPh$_3$)$_4$ (13 mmol), 56 g of K$_2$CO$_3$ (669 mmol), 1.3 L of toluene (0.2 M), and 330 mL of H$_2$O (2 M) were introduced into a flask, and the mixture was stirred at 130° C. for 12 hours. The reaction mixture was extracted with EA, and moisture was removed with MgSO$_4$. The residue was distilled under reduced pressure, and purified by column chromatography using EA/Hx=1/1 to obtain 46 g of compound 3 (yield: 73%).

Synthesis of Compound 4

46 g of compound 3 (196 mmol) and 402 mL of pyridine (0.5 M) were introduced into a flask, the mixture was cooled to 0° C., and then 69 g of Tf$_2$O (245 mmol) was slowly added. The reaction mixture was stirred for 12 hours, and added to 500 mL of water to obtain a solid, which was dissolved in CHCl$_3$ and extracted to remove water. The resulting product was purified by column chromatography using MC/Hx=1/1 to obtain 64 g of compound 4 (yield: 88%).

Synthesis of Compound 5

64 g of compound 4 (172 mmol), 55 g of 2-chlorophenylboronic acid (225 mmol), 10 g of Pd(PPh$_3$)$_4$ (8.6 mmol), 36 g of K$_2$CO$_3$ (432 mmol), 866 mL of toluene (0.2 M), and 216 mL of H$_2$O (2M) were introduced into a flask, and the mixture was stirred at 100° C. for 4 hours. The reaction mixture was extracted with EA and moisture was removed with MgSO$_4$. The residue was distilled under reduced pressure, and purified by column chromatography using MC/Hx=1/1 to obtain 33 g of compound 5 (yield: 57%).

Synthesis of Compound 6

33 g of compound 5 (98 mmol), 98 g of $K_2CO_3$ (254 mmol), 4.4 g of $Pd(OAC)_2$ (196 mmol), 11 g of $P(Cy)_3HBF_4$ (29 mmol), and 492 mL of DMA (0.2 M) were introduced into a flask, and the mixture was stirred at 195° C. for 12 hours. The reaction mixture was extracted with EA, and moisture was removed with $MgSO_4$. The residue was distilled under reduced pressure, and purified by column chromatography using MC/Hx=1/1 to obtain 13 g of compound 6 (yield: 43%).

Synthesis of Compound 7

9.8 g of compound 6 (33 mmol), 4.5 g of $IrCl_3 \cdot xH_2O$ (30 mmol), 116 mL of 2-ethoxyethanol, and 39 mL of $H_2O$ were stirred at 140° C. for 24 hours. After reaction, the reaction mixture was cooled to room temperature, washed with water and MeOH, and then dried to obtain 10.1 g of compound 7 (yield: 80%).

Synthesis of Compound C-2

10.1 g of compound 7 (6.2 mmol), 12 g of compound 8 (62 mmol), 8.6 g of $K_2CO_3$ (62 mmol), and 78 mL of 2-ethoxyethanol (0.08 M) were added to 250 mL of RBF under nitrogen, and the mixture was stirred at room temperature for 1 day. After reaction, 200 mL of water was added to the reaction mixture, and the mixture was stirred for 30 minutes, and filtered. The resulting product was purified by column chromatography to obtain 4.4 g of compound C-2 (yield: 74%).

Compound C-2 prepared above has the following physical properties. In the Table below, the PL value of compound C-2 was measured in methylene chloride (MC).

$^1$H NMR (600 MHz, $CDCl_3$, δ): 8.24 (d, J=6 Hz, 2H), 7.78 (dd, J=1.2 Hz, 2H), 7.73-7.69 (m, 4H), 7.31 (bs, 2H), 7.25-7.22 (m, 6H), 7.19 (dd, J=0.6 Hz, 2H), 6.67 (t, J=7.2 Hz, 2H), 5.30 (s, 2H), 5.09 (s, 1H), 2.42 (s, 6H), 1.88 (m, 2H), 1.78 (m, 2H), 1.70 (m, 2H), 0.54 (d, J=6.6 Hz, 6H), 0.38 (d, J=4.2 Hz, 6H)

| Compound | MW | PL | M.P. |
|---|---|---|---|
| C-2 | 667.85 | 621 nm | 360° C. |

Photoluminescence Quantum Yield (PLQY) Measurement Example 1 and Comparative Example 1

In order to measure the photoluminescence quantum yield (PLOY) of compound C-2 according to one embodiment of the present disclosure and comparative compound A, a test was carried out under the following conditions.

Used apparatus and measurement condition: JASCO FP8300 (including an integrating sphere), 77 K (liquid nitrogen)

Sample condition: Dissolving sample in 2-methyl-THF ($10^{-4}$ and then $N_2$ purging The results obtained through the apparatus are provided in Table 1 below.

TABLE 1

| Compound | Comparative Example 1 Compound A | Example 1 Compound C-2 |
|---|---|---|
| PLQY (%) | 30.62 | 49.81 |

The luminescent efficiency commonly used in OLEDs is a current efficiency $\eta_c[cd/A]$, which represents a magnitude of luminance per unit current. Since the current efficiency is a luminous efficiency similar to a power efficiency, it includes a spectral sensitivity, and thus it is maximized in a yellow (Y) to green (G) region, and it rapidly reduces in a blue (B) and red (R) region. If two materials have a correctly identical luminosity, the superiority of luminescent efficiency may be determined by comparing the current efficiencies thereof. However, since said materials have different wavelengths, they may be correctly evaluated by comparing quantum efficiencies thereof rather than luminous efficiencies thereof. In this case, an external quantum efficiency (EQE) may be properly compared, and may be expressed by the following equation 1.

$$\eta_{EQE} \eta_{out} \times \eta_{IQE} \qquad \text{[Equation 1]}$$

In equation 1, $\eta_{EQE}$ represents an external quantum efficiency, $\eta_{out}$ represents an out-coupling efficiency, and $\eta_{IQE}$ represents an internal quantum efficiency. The internal quantum efficiency ($\eta_{IQE}$) may be represented by the following equation 2.

$$\eta_{IQE} = \gamma \times \eta_r \times \eta_f \times \eta_r \qquad \text{[Equation 2]}$$

In equation 2, $\eta_{IQE}$ represents an internal quantum efficiency, γ represents a recombination efficiency or a charge balance, $\eta_r$ represents an exciton formation efficiency (singlet: 0.25, triplet: 0.75), and $\eta_f$ represents PLQY.

That is, the internal quantum efficiency and the external quantum efficiency are proportional to the PLQY of a material.

From Table 1 above, it can be confirmed that the PLQY value of Example compound C-2 is greater than the PLQY value of comparative compound A. Thus, the quantum efficiency of the compound according to the present disclosure is relatively higher than that of the comparative compound. Therefore, the organic electroluminescent compound of the present disclosure has superior luminescent property to the conventional material.

The invention claimed is:

1. An organic electroluminescent compound comprising ligand $L_1$ represented by the following formula 1, wherein the ligand $L_1$ is coordinated to a metal having an atomic number greater than 40:

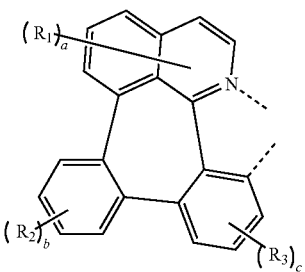

(1)

wherein $R_1$ to $R_3$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or adjacent $R_1$'s, adjacent $R_2$'s, and adjacent $R_3$'s, each independently, may be linked to each other to form a ring(s), and a represents an integer of 1 to 5, b represents an integer of 1 to 4, and c represents an integer of 1 to 3, in which, if a to c, each independently, are an integer of 2 or more, each of $R_1$, each of $R_2$, and each of $R_3$ may be the same or different.

2. The organic electroluminescent compound according to claim 1, wherein the organic electroluminescent compound is represented by the following formula 2:

$$M(L_1)x(L_2)y(L_3)z \qquad (2)$$

wherein

M represents a metal having an atomic number greater than 40;

x represents 1, 2, or 3;

y represents 0, 1, or 2;

z represents 0, 1, or 2;

the sum of x, y, and z is the oxidation number of the M;

$L_1$ represents the ligand represented by formula 1;

$L_2$ represents the ligand represented by the following formula 3; and $L_3$ represents the ligand represented by the following formula 4:

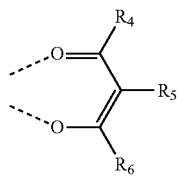

(3)

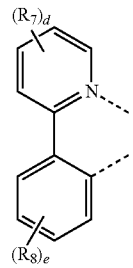

(4)

wherein $R_4$ to $R_8$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or $R_4$ and $R_5$, $R_5$ and $R_6$, adjacent $R_7$'s, and adjacent $R_8$'s, each independently, may be linked to each other to form a ring(s); and d and e, each independently, represent an integer of 1 to 4, in which, if d and e, each independently, are an integer of 2 or more, each of $R_7$ and each of $R_8$ may be the same or different.

3. The organic electroluminescent compound according to claim 1, wherein the metal having an atomic number greater than 40 is Ir or Pt.

4. The organic electroluminescent compound according to claim 1, wherein the organic electroluminescent compound is represented by the following formula 5:

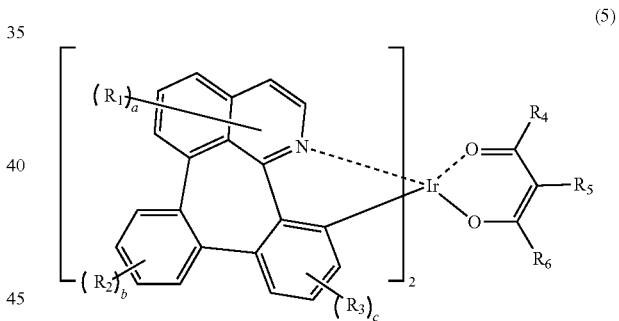

(5)

wherein $R_4$ to $R_6$, each independently, represent hydrogen, deuterium, a substituted or unsubstituted (C1-C30)alkyl, a substituted or unsubstituted (C3-C30)cycloalkyl, a substituted or unsubstituted (C6-C30)aryl, or a substituted or unsubstituted (3- to 30-membered)heteroaryl; or $R_4$ and $R_5$, and $R_5$ and $R_6$, each independently, may be linked to each other to form a ring(s); and $R_1$ to $R_3$ and a to c are as defined in claim 1.

5. The organic electroluminescent compound according to claim 2, wherein $R_1$ to $R_8$, each independently, represent hydrogen, deuterium, a (C1-C10)alkyl unsubstituted or substituted with deuterium(s), or an unsubstituted (C6-C25) aryl.

6. The organic electroluminescent compound according to claim 2, wherein $R_1$ to $R_8$, each independently, are selected from the group consisting of hydrogen, deuterium, methyl, ethyl, n-propyl, isopropyl, n-butyl, isobutyl, sec-butyl, tert-butyl, n-pentyl, tert-pentyl, neopentyl, isopentyl, sec-pentyl, 3-pentyl, and phenyl.

7. The organic electroluminescent compound according to claim 2, wherein the formula 3 is represented by any one selected from the group consisting of the following:
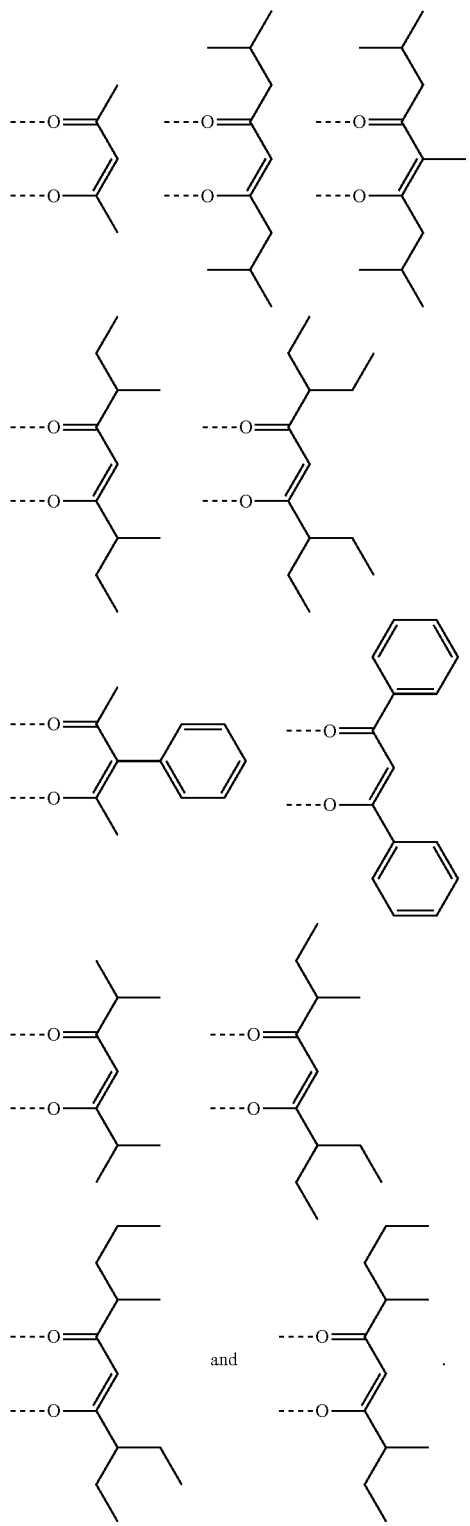
and
8. The organic electroluminescent compound according to claim 1, wherein the organic electroluminescent compound is selected from the following:
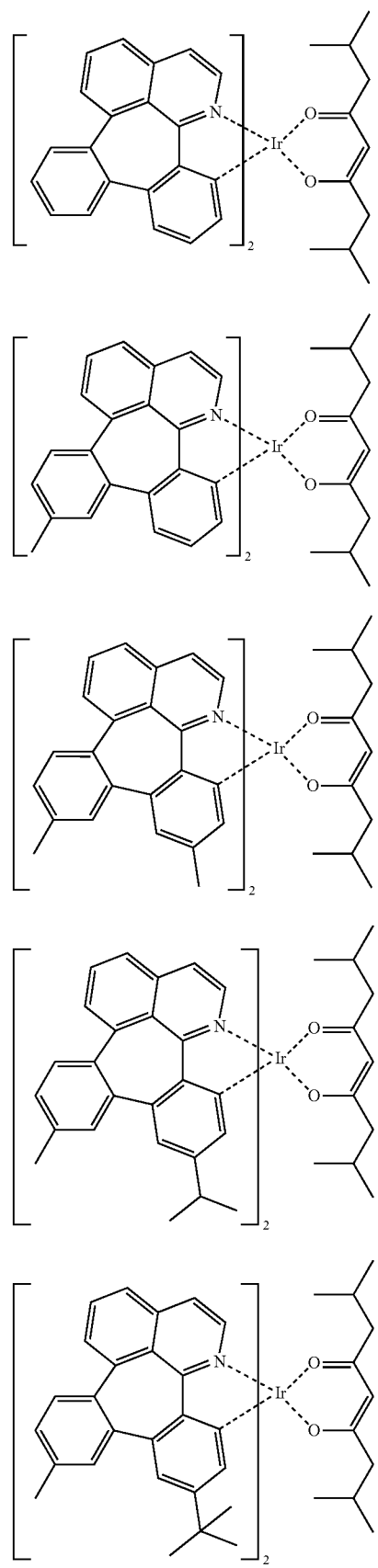

-continued
C-6
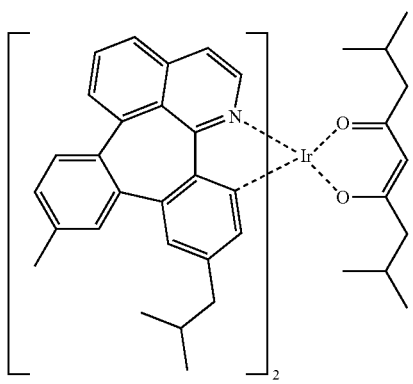
C-7
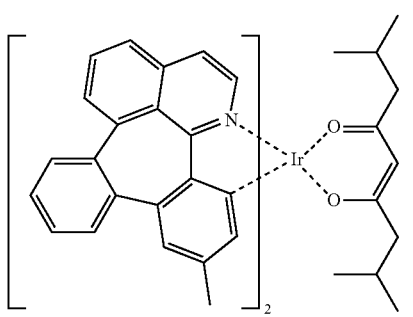
C-8
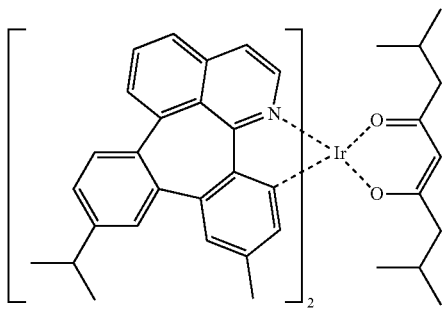
C-9
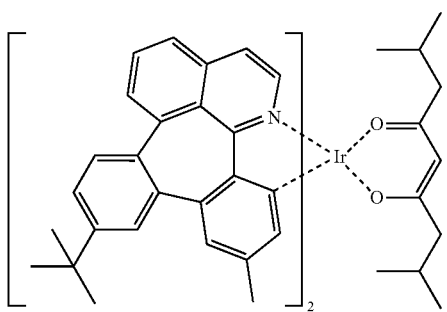
-continued
C-10
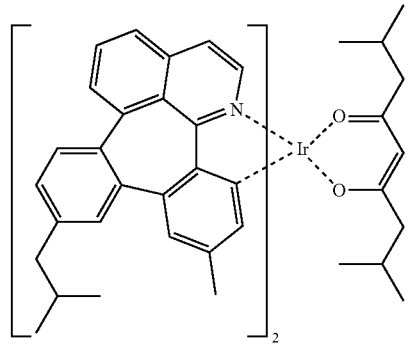
C-11
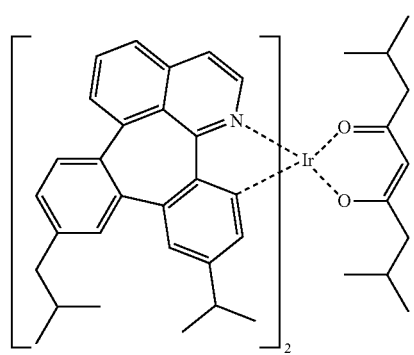
C-12
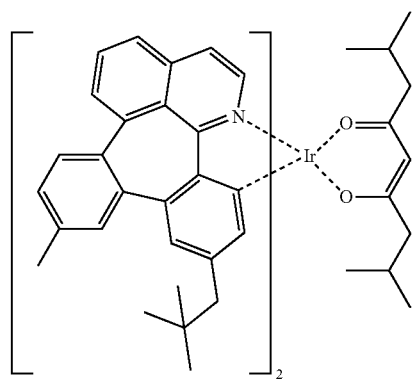
C-13
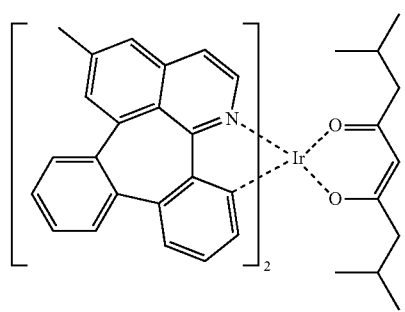

-continued
C-14
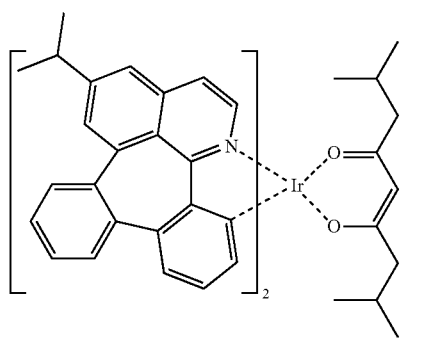
C-15
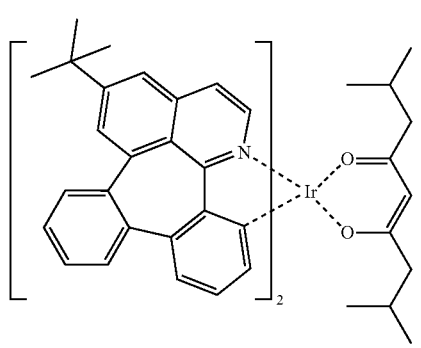
C-16
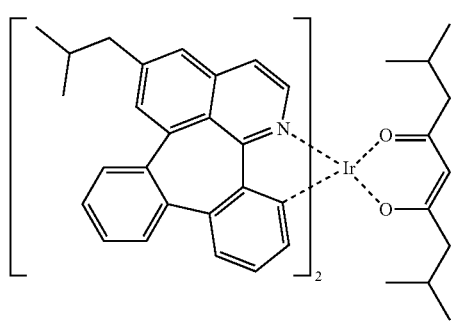
C-17
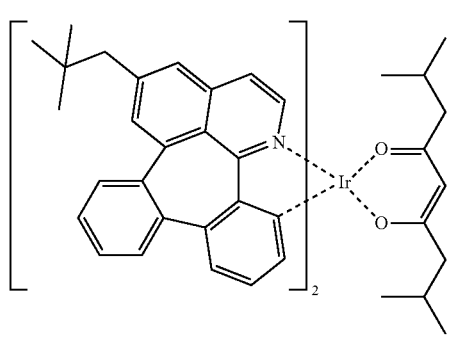
C-18
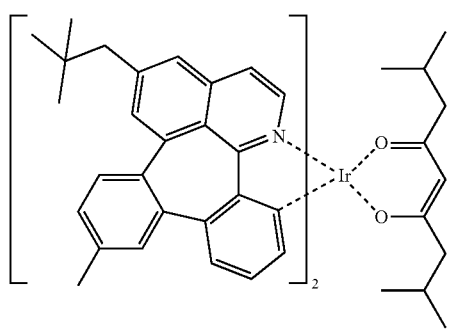
-continued
C-19
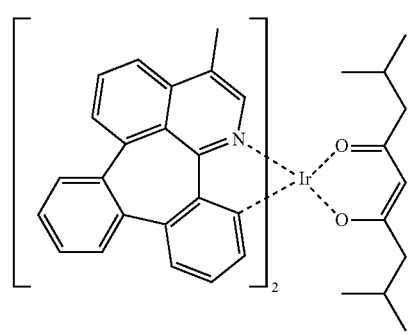
C-20
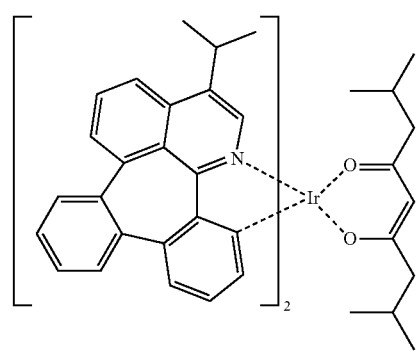
C-21
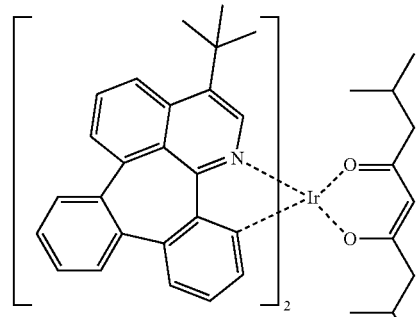
C-22
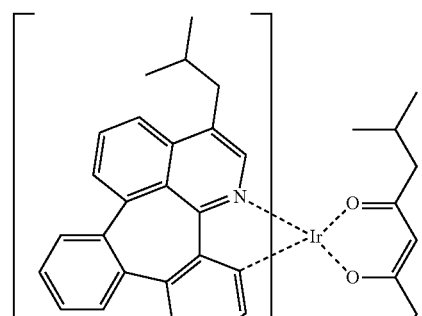

-continued
C-23
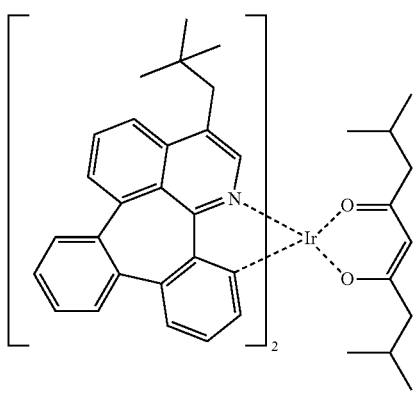
C-24
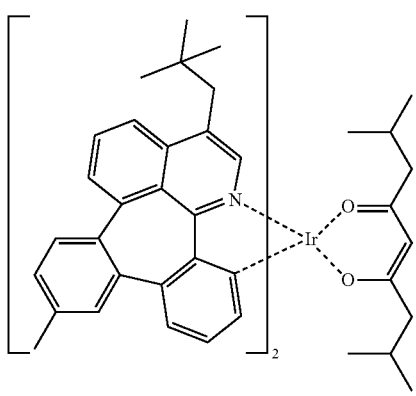
C-25
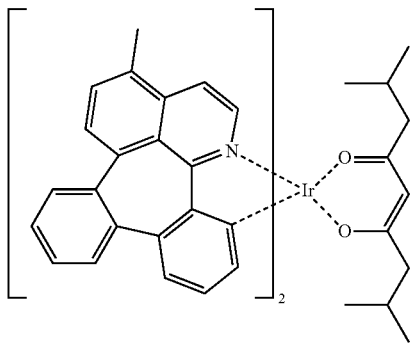
C-26
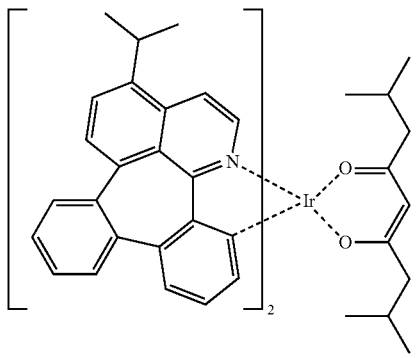
-continued
C-27
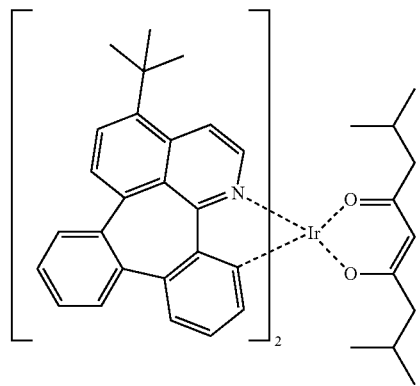
C-28
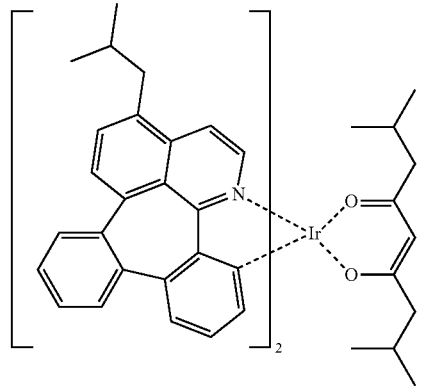
C-29
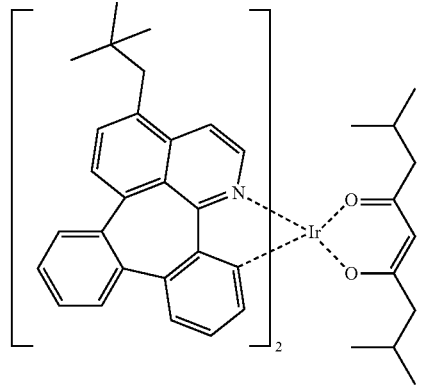
C-30
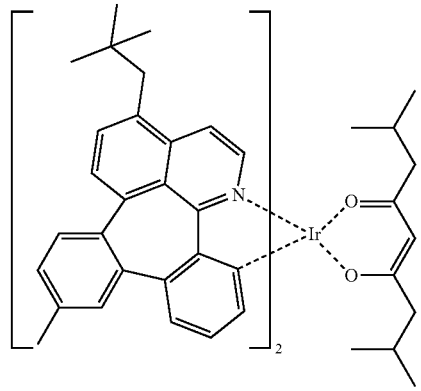

-continued
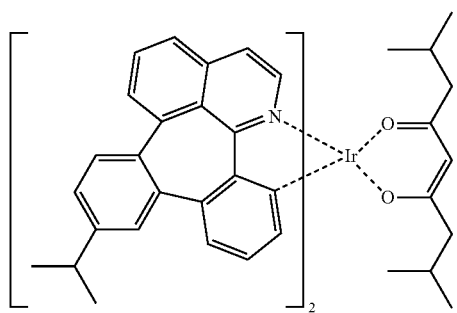
C-31
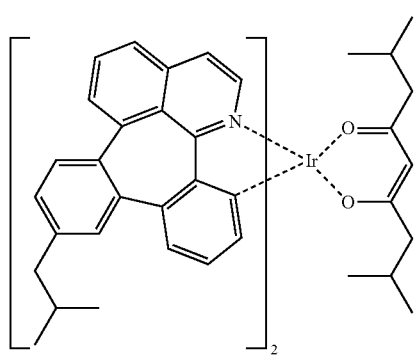
C-32
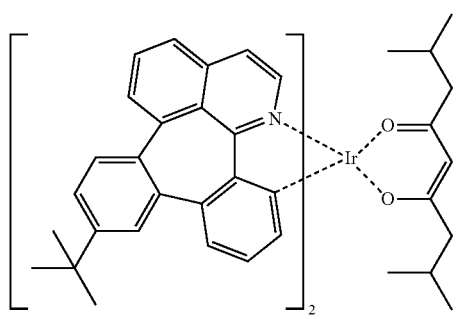
C-33
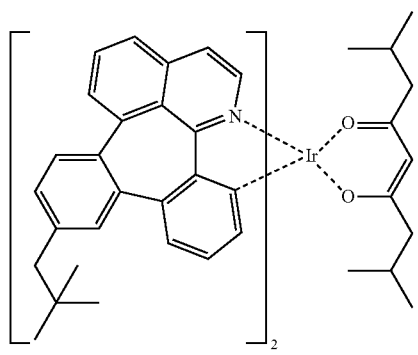
C-34
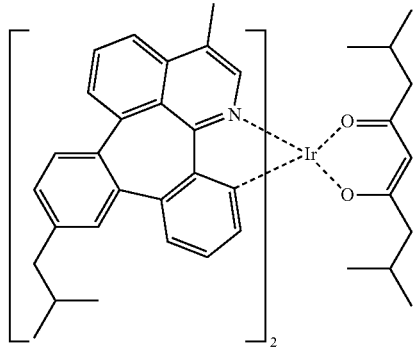
C-35
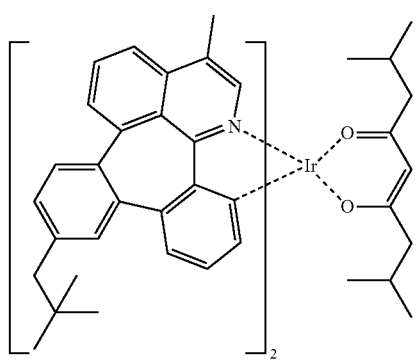
C-36
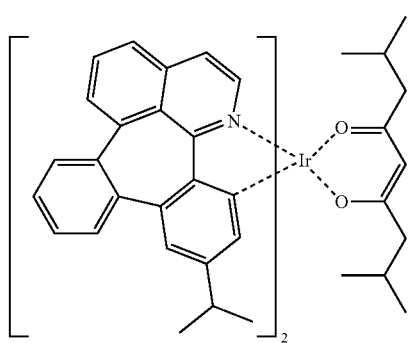
C-37
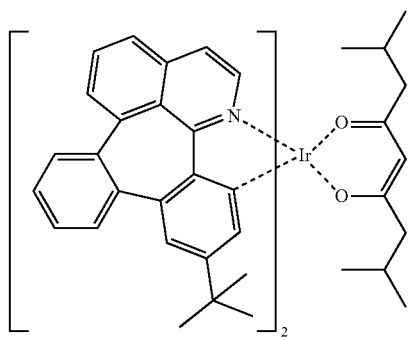
C-38

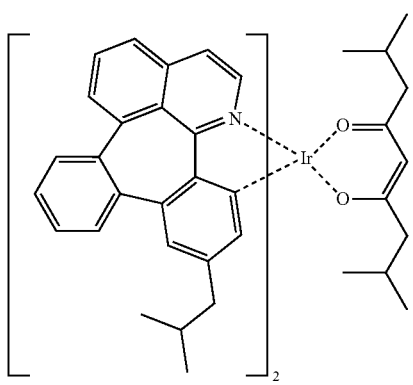
C-39
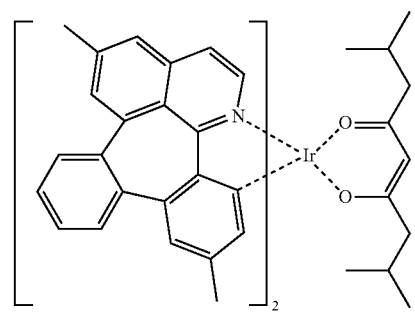
C-43
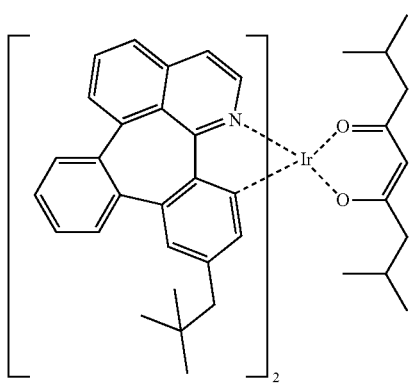
C-40
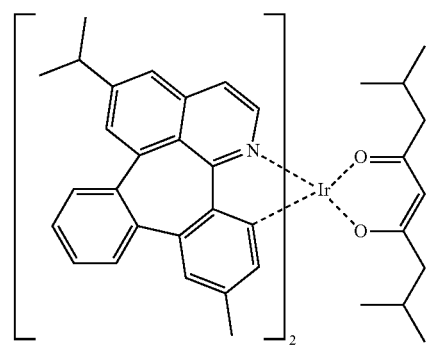
C-44
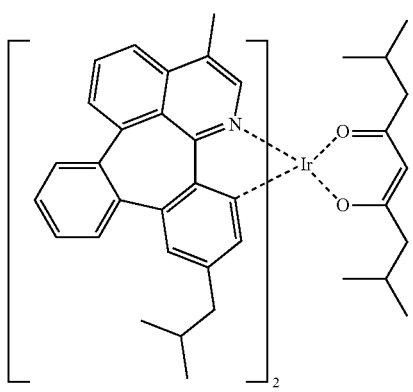
C-41
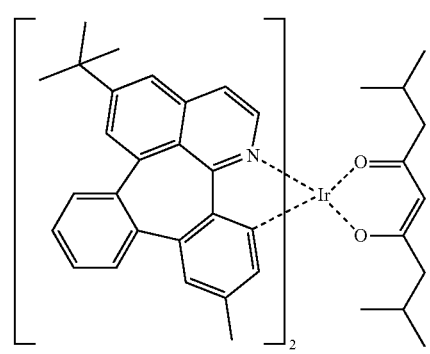
C-45
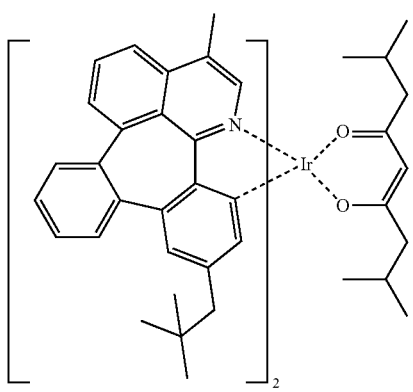
C-42
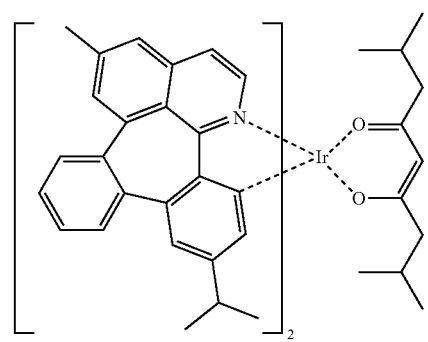
C-46

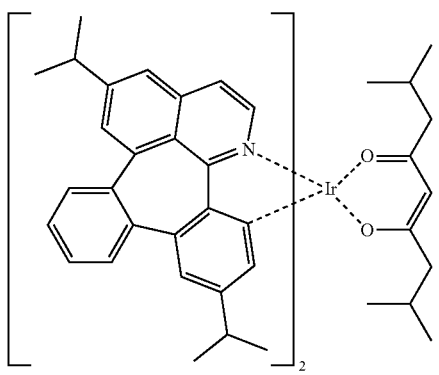
C-47
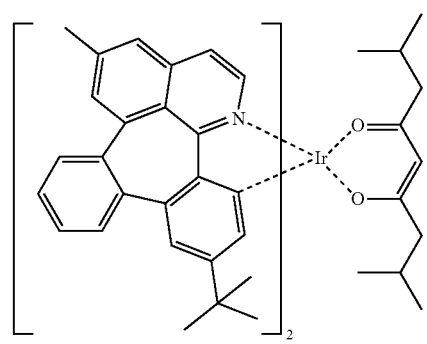
C-51
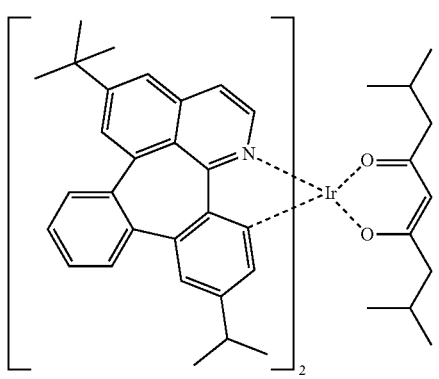
C-48
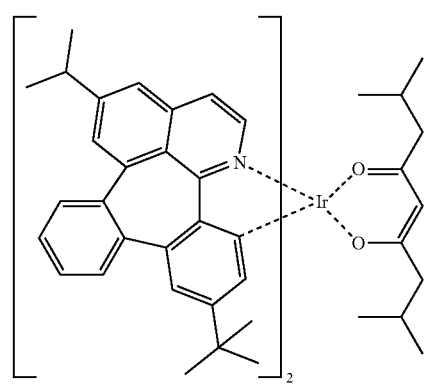
C-52
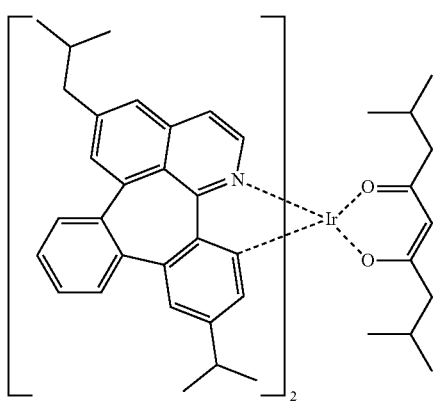
C-49
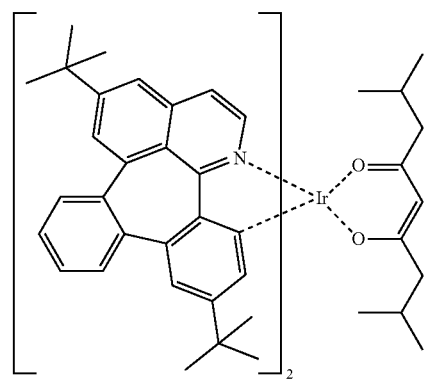
C-53
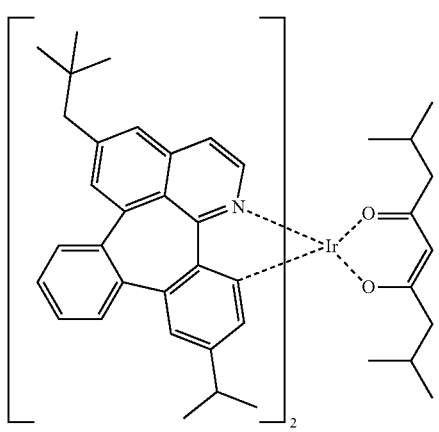
C-50
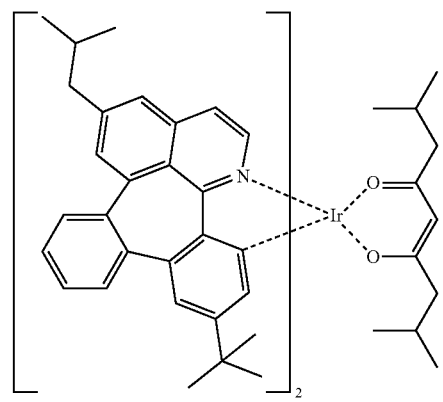
C-54

C-55
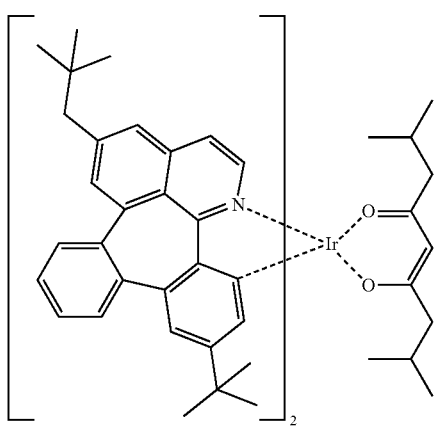
C-56
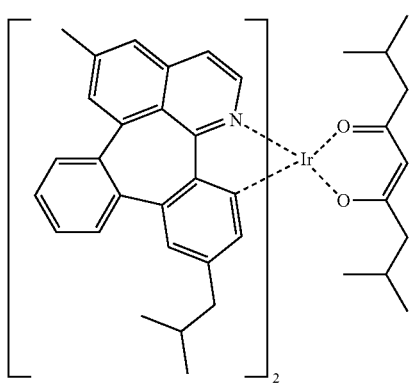
C-57
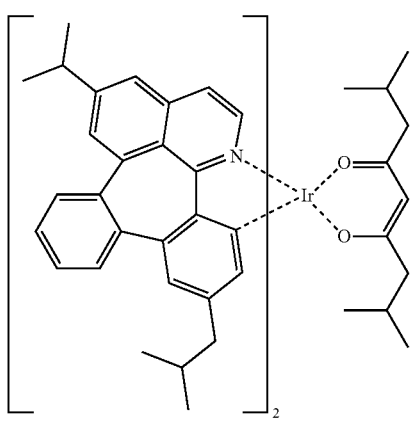
C-58
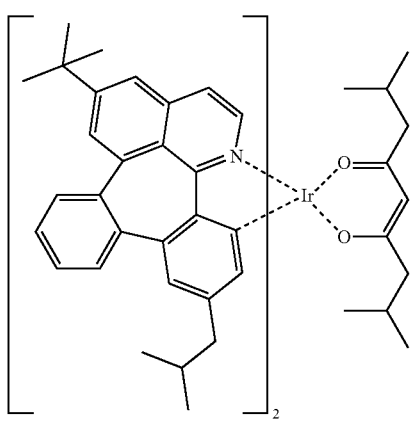
C-59
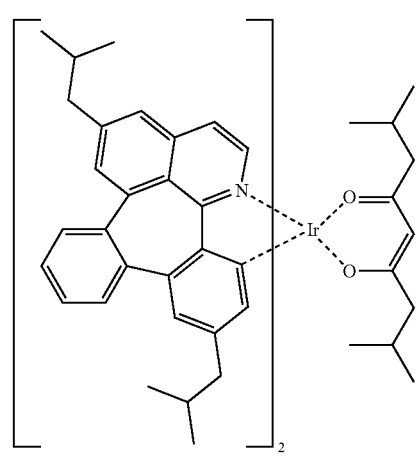
C-60
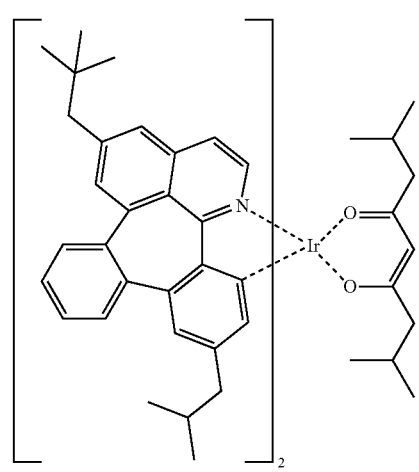
C-61
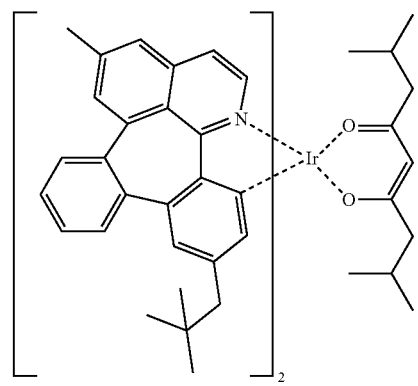

-continued
C-62
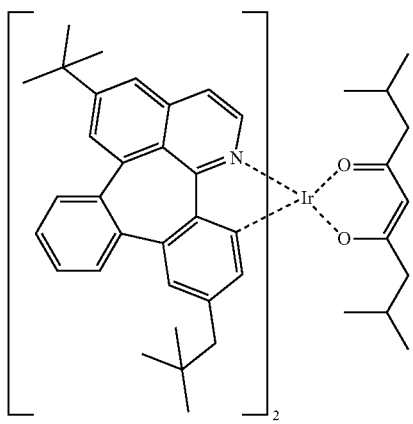
C-63
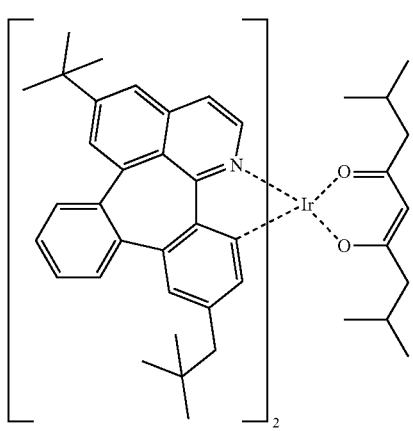
C-64
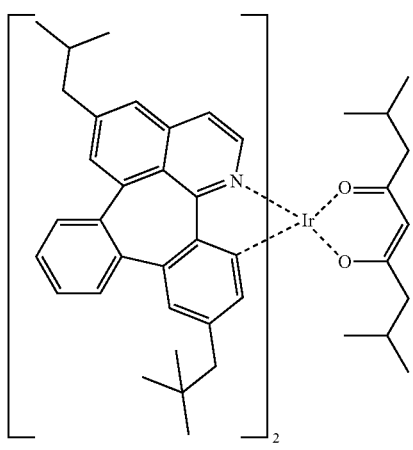
-continued
C-65
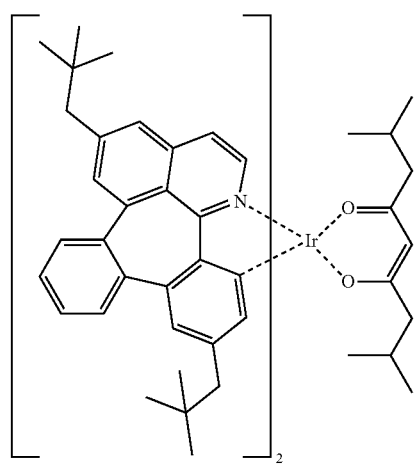
C-66
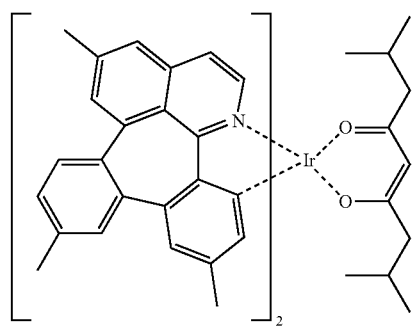
C-67
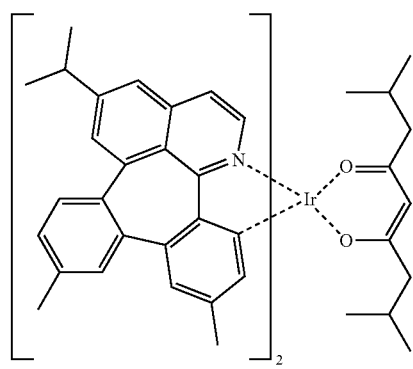
C-68
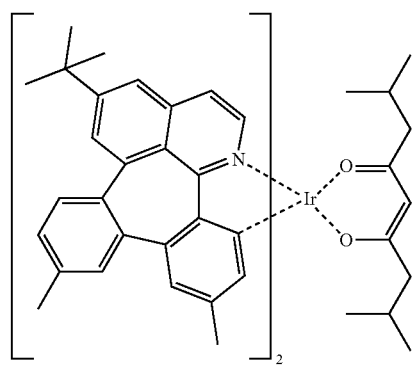

-continued
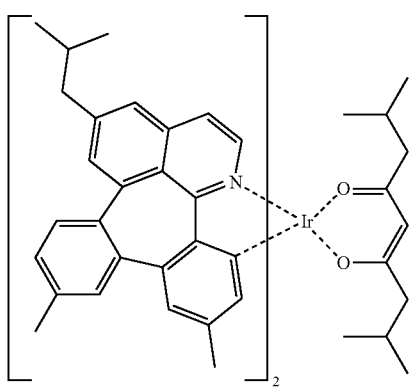
C-69
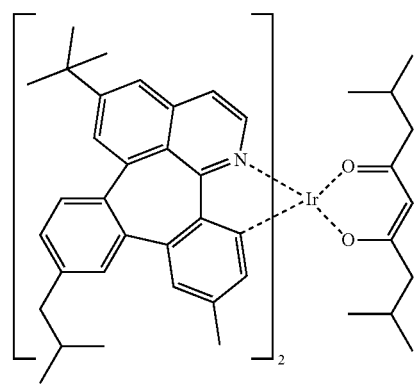
C-73
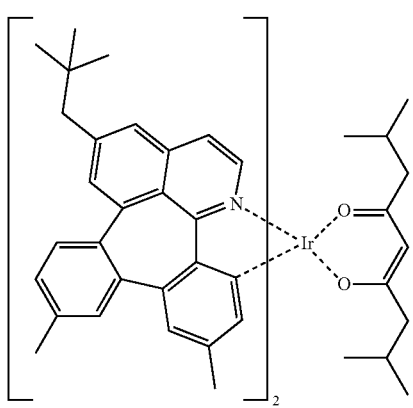
C-70
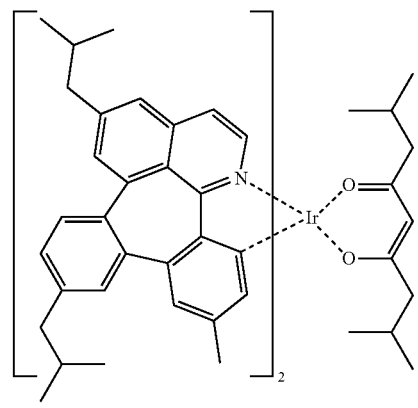
C-74
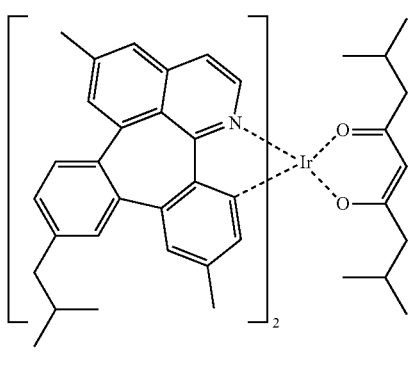
C-71
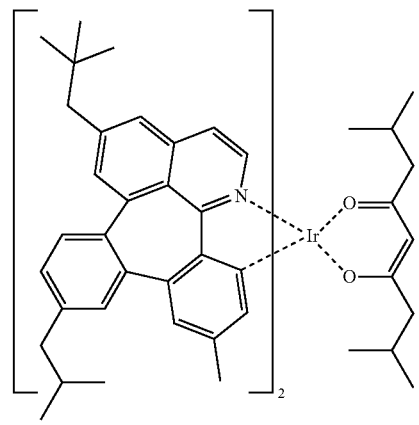
C-75
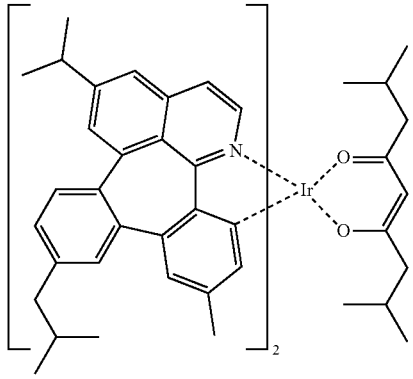
C-72
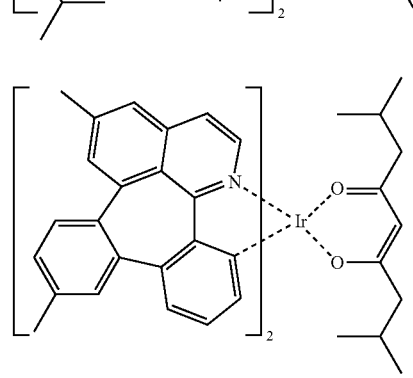
C-76

C-77
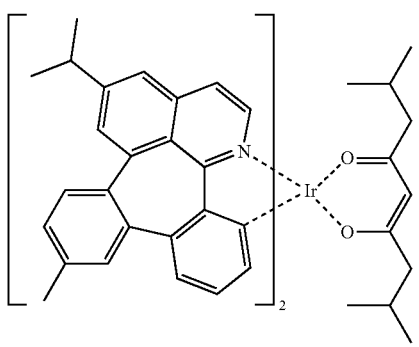
C-81
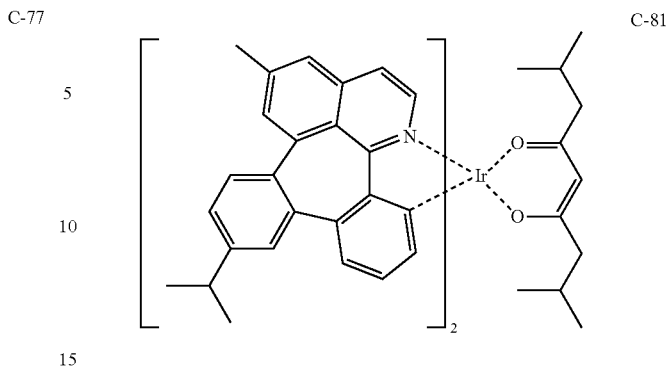
C-78
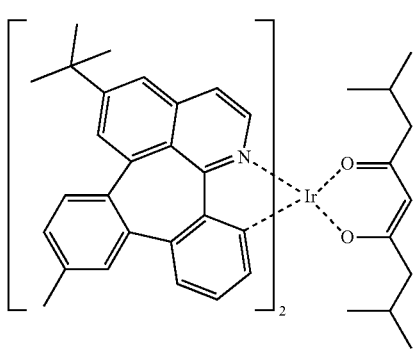
C-82
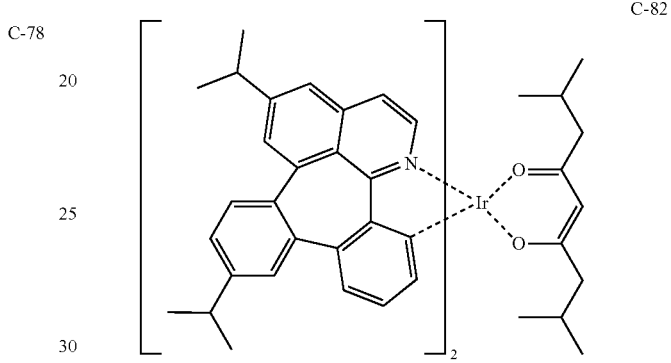
C-79
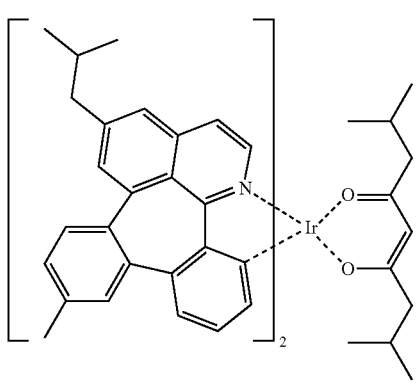
C-83
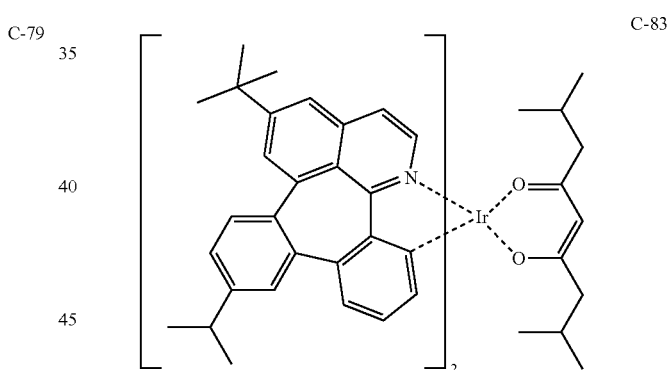
C-80
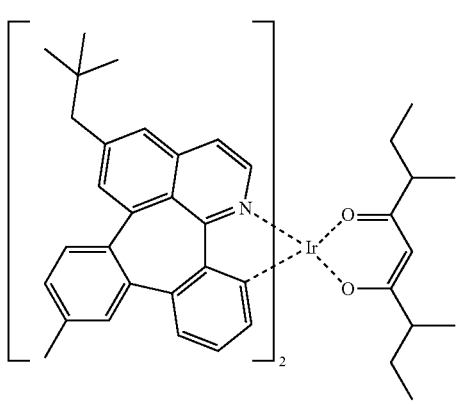
C-84
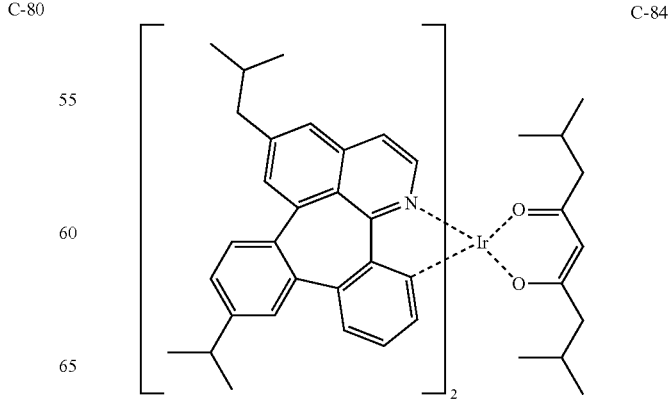

-continued
C-85
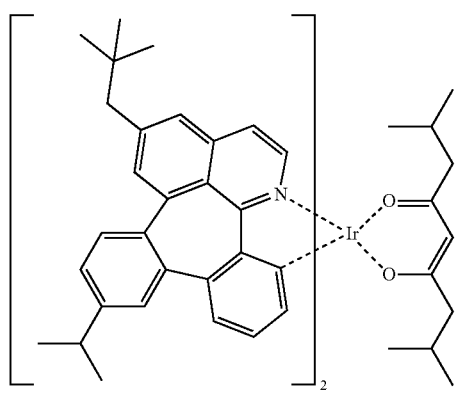
C-86
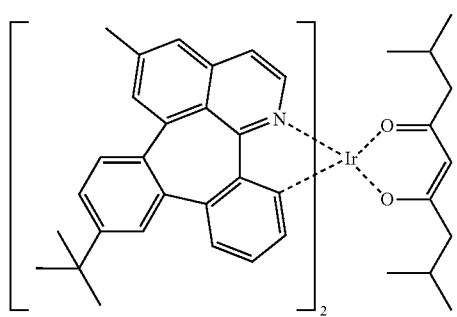
C-87
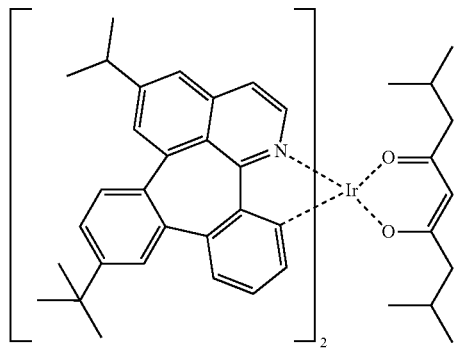
C-88
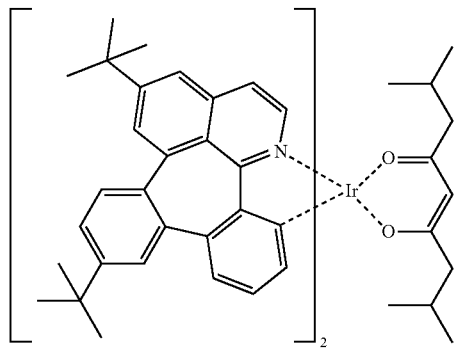
-continued
C-89
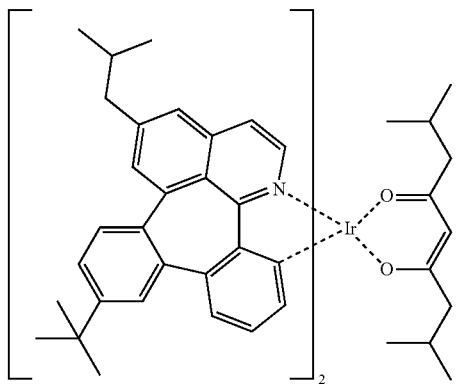
C-90
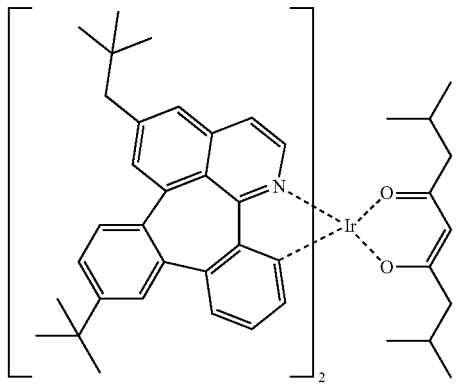
C-91
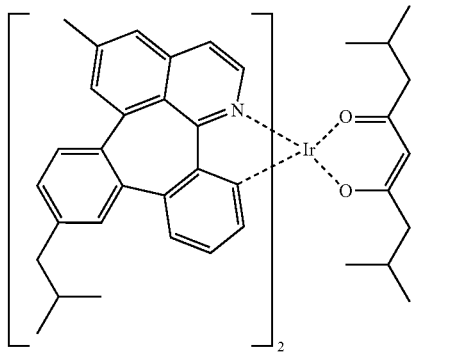
C-92
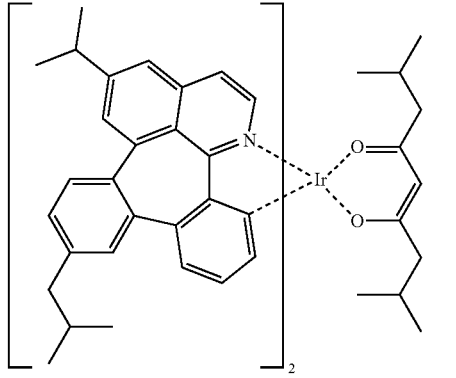

-continued
C-93
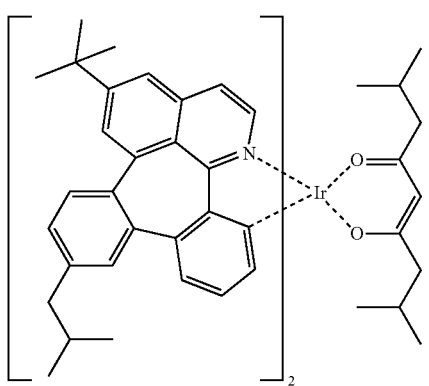
C-94
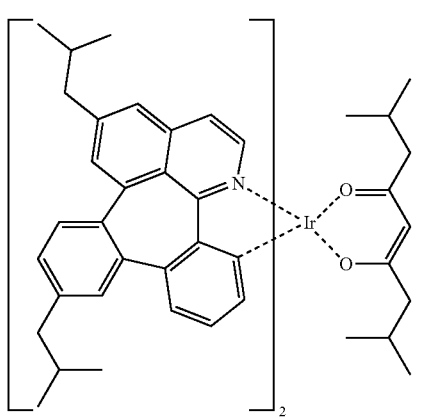
C-95
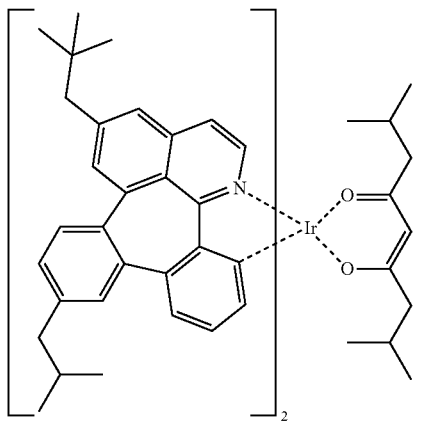
C-96
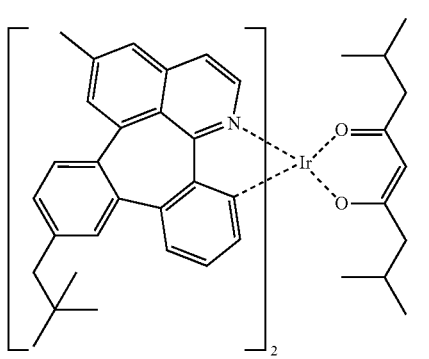
-continued
C-97
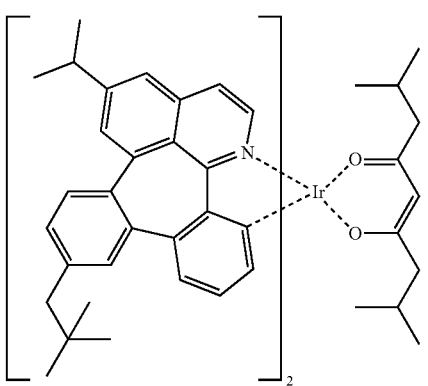
C-98
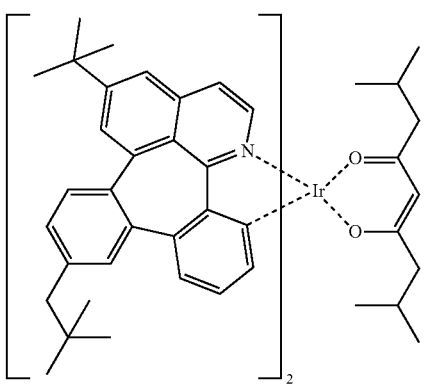
C-99
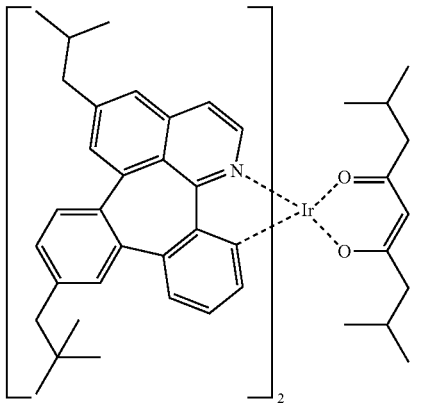
C-100
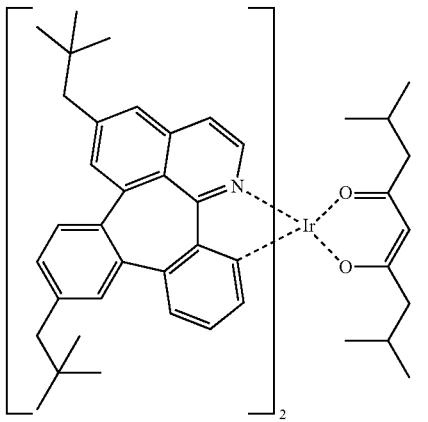

-continued
C-101
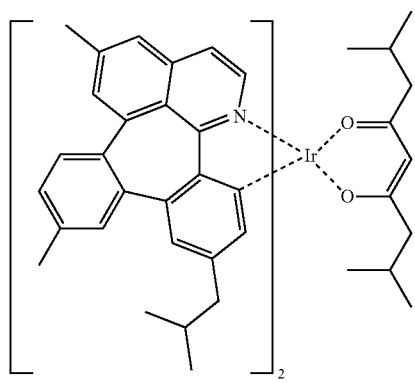
C-102
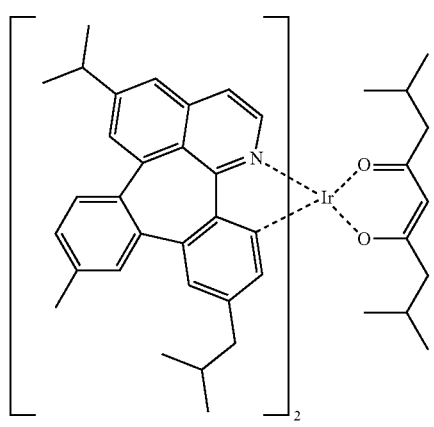
C-103
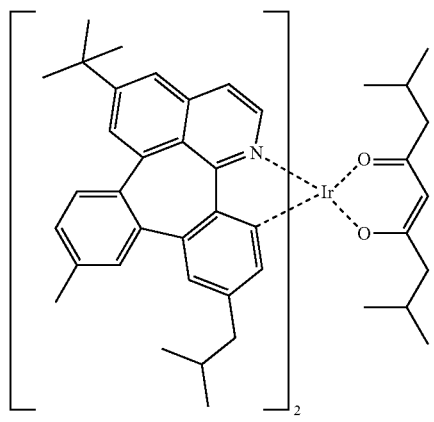
C-104
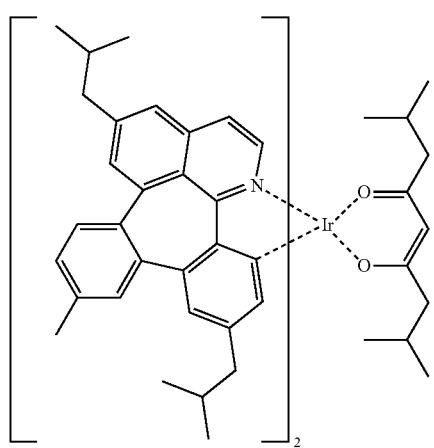
-continued
C-105
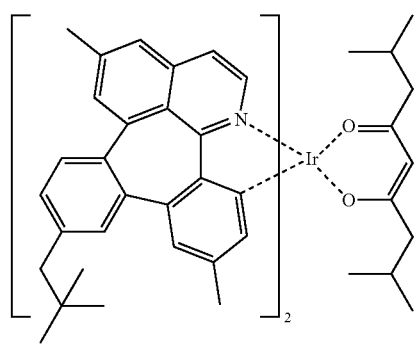
C-106
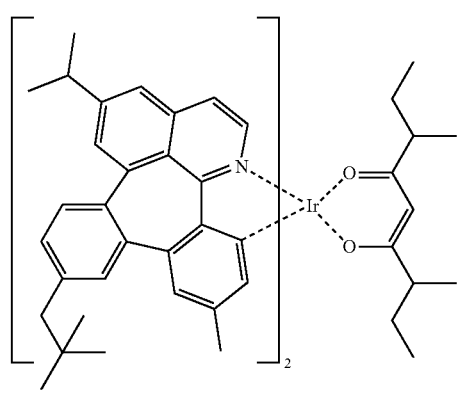
C-107
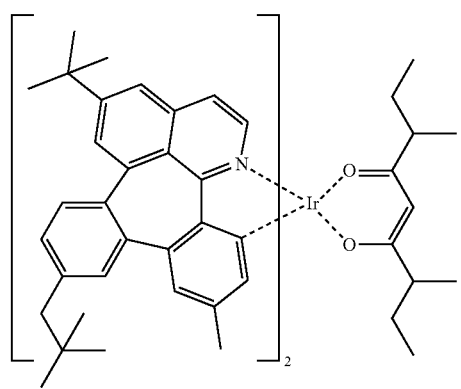
C-108
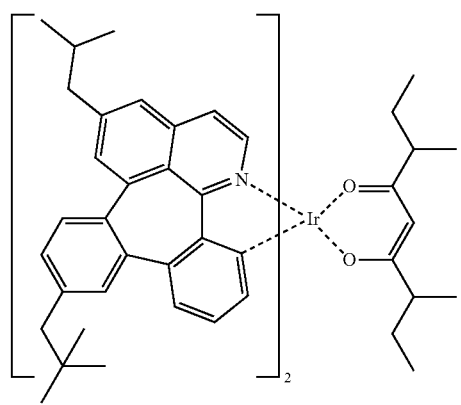

C-109

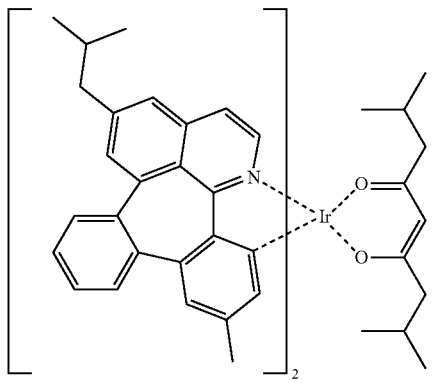

C-110

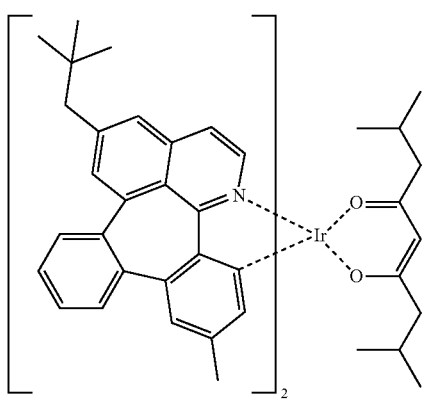

C-111

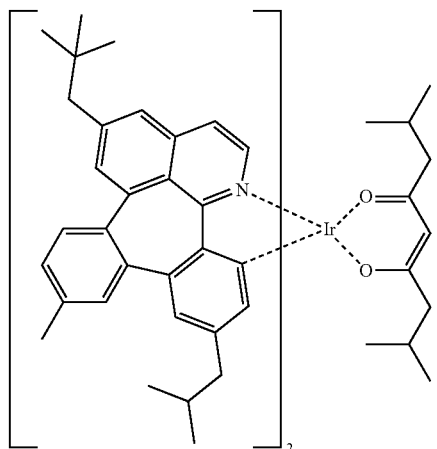

and

C-112

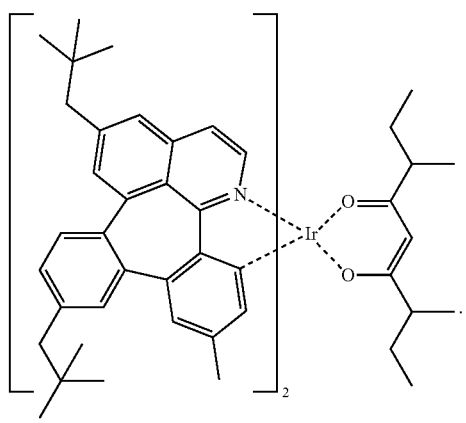

.

9. An organic electroluminescent material comprising the organic electroluminescent compound according to claim 1.

10. An organic electroluminescent device comprising an anode, a cathode, and a light-emitting layer between the anode and the cathode, wherein the light-emitting layer comprises the organic electroluminescent compound according to claim 1.

* * * * *